United States Patent
Mihota et al.

(10) Patent No.: US 8,630,209 B2
(45) Date of Patent: Jan. 14, 2014

(54) WIRELESS TRANSMISSION SYSTEM AND WIRELESS TRANSMISSION METHOD

(75) Inventors: Norihito Mihota, Saitama (JP); Hirofumi Kawamura, Chiba (JP); Yasuhiro Okada, Tokyo (JP)

(73) Assignee: Sony Corporation, Tokyo (JP)

( * ) Notice: Subject to any disclaimer, the term of this patent is extended or adjusted under 35 U.S.C. 154(b) by 306 days.

(21) Appl. No.: 12/850,214

(22) Filed: Aug. 4, 2010

(65) Prior Publication Data

US 2011/0038282 A1 Feb. 17, 2011

(30) Foreign Application Priority Data

Aug. 13, 2009 (JP) ................................ 2009-187711

(51) Int. Cl.
*H04L 5/14* (2006.01)
*H04N 5/225* (2006.01)

(52) U.S. Cl.
USPC ...................................... 370/278; 348/207.99

(58) Field of Classification Search
USPC ............................ 370/276, 310–350, 464–465
See application file for complete search history.

(56) References Cited

U.S. PATENT DOCUMENTS

| 6,587,699 | B2 * | 7/2003 | Olsen et al. ................. 455/562.1 |
| 8,005,439 | B2 * | 8/2011 | Gardenfors et al. ............ 455/86 |
| 8,204,464 | B2 * | 6/2012 | Ando ......................... 455/226.2 |
| 8,300,890 | B1 * | 10/2012 | Gaikwad et al. .............. 382/103 |
| 2002/0060983 | A1 * | 5/2002 | Kim et al. ..................... 370/208 |
| 2005/0179782 | A1 | 8/2005 | Endo |
| 2006/0033817 | A1 | 2/2006 | Ishikawa et al. |
| 2006/0056829 | A1 * | 3/2006 | Hirota et al. ..................... 396/54 |
| 2007/0133493 | A1 * | 6/2007 | Maruhashi et al. ........... 370/342 |
| 2007/0182827 | A1 | 8/2007 | Sassa |
| 2007/0263743 | A1 * | 11/2007 | Lee et al. ....................... 375/267 |
| 2008/0037507 | A1 * | 2/2008 | Fukumoto et al. ............. 370/347 |
| 2008/0136550 | A1 * | 6/2008 | Saitoh .............................. 333/26 |
| 2008/0153416 | A1 * | 6/2008 | Washiro ........................ 455/41.1 |
| 2008/0158054 | A1 * | 7/2008 | Yong et al. ..................... 342/374 |
| 2009/0008753 | A1 * | 1/2009 | Rofougaran ................... 257/660 |
| 2009/0036067 | A1 * | 2/2009 | Rofougaran .................... 455/91 |
| 2009/0037628 | A1 | 2/2009 | Rofougaran |
| 2009/0196313 | A1 * | 8/2009 | Ridel et al. .................... 370/536 |
| 2009/0218407 | A1 * | 9/2009 | Rofougaran .................. 235/492 |
| 2009/0268675 | A1 * | 10/2009 | Choi ............................. 370/329 |
| 2010/0079618 | A1 * | 4/2010 | Sato et al. .................. 348/229.1 |
| 2010/0097967 | A1 * | 4/2010 | Kwon et al. ................... 370/310 |
| 2010/0185917 | A1 * | 7/2010 | Ashkenazi et al. ............ 714/752 |
| 2011/0003078 | A1 * | 1/2011 | Sugita et al. .................. 427/301 |

FOREIGN PATENT DOCUMENTS

| JP | 2003-110919 | 4/2003 |
| JP | 2005-204221 | 7/2005 |
| JP | 2005-223411 | 8/2005 |
| JP | 2006-352418 | 12/2006 |

* cited by examiner

*Primary Examiner* — Warner Wong
(74) *Attorney, Agent, or Firm* — Dentons US LLP

(57) ABSTRACT

Disclosed herein is a wireless transmission system, including: a plurality of systems of millimeter wave signal transmission lines capable of individually transmitting information in a millimeter waveband independently of each other; a sending section disposed on one end side of each of the plural systems of millimeter wave signal transmission lines; and a reception section disposed on the other end side of each of the plural systems of millimeter wave signal transmission lines. The sending section is adapted to convert a signal of an object of transmission into a millimeter wave signal and supply the millimeter wave signal to the millimeter signal transmission line. The reception section is adapted to receive the millimeter wave signal transmitted thereto through the millimeter wave signal transmission line and convert the received millimeter wave signal into the signal of the object of transmission.

17 Claims, 20 Drawing Sheets

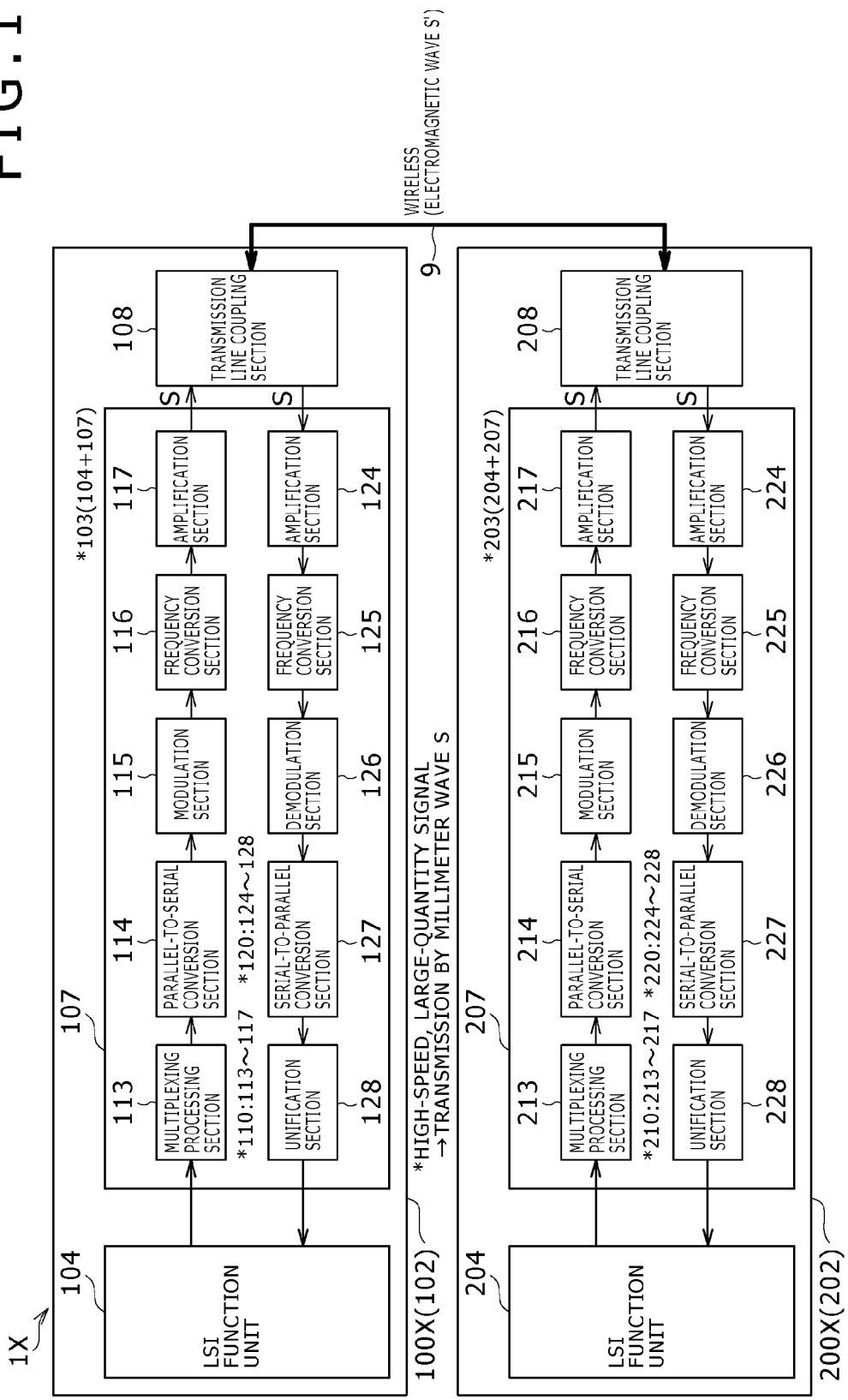

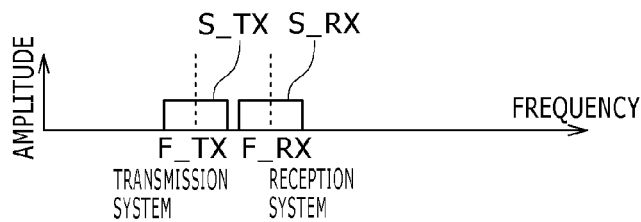
FIG.2A
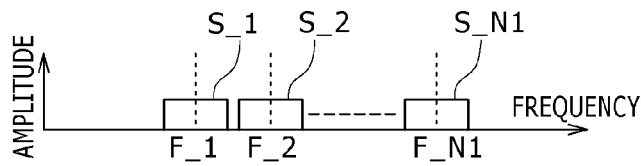
FIG.2B
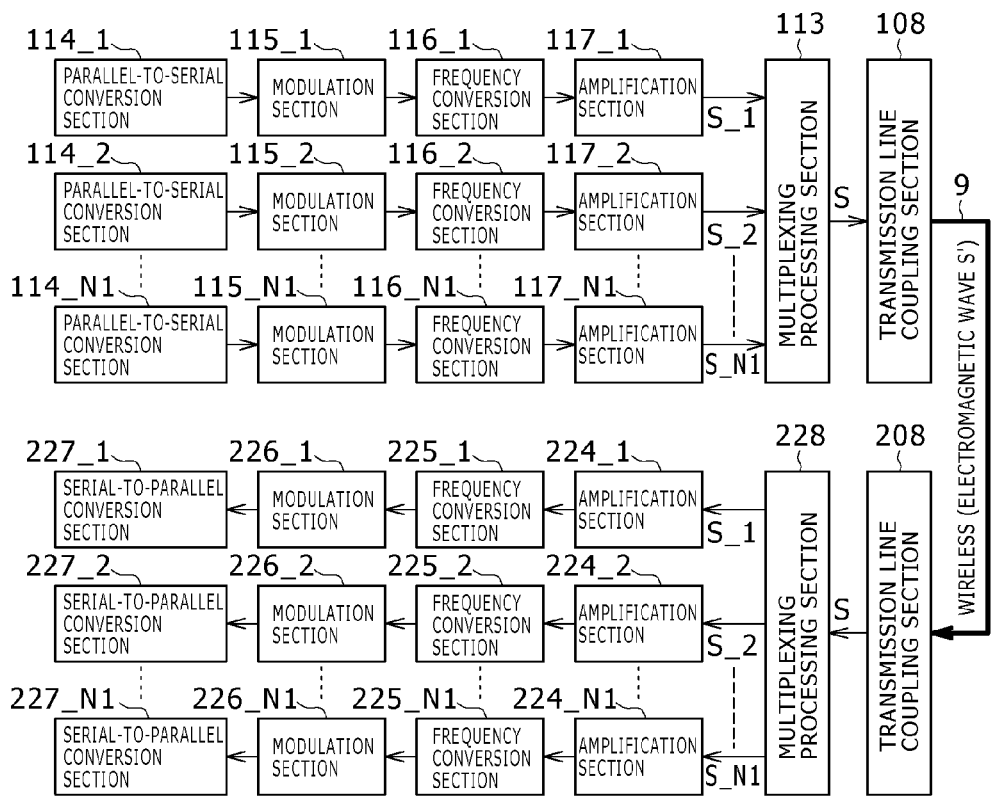

FIG.5A
$L[dB] = 10\log_{10}((4\pi d/\lambda)^2) \cdots (A)$
L: PROPAGATION LOSS
d: DISTANCE BETWEEN TWO PARTIES
 (TRANSMISSION AND RECEPTION)
$\lambda$: WAVELENGTH
$d_2/d_1 = 10^{(DU/20)} \cdots (B)$
FIG.5B
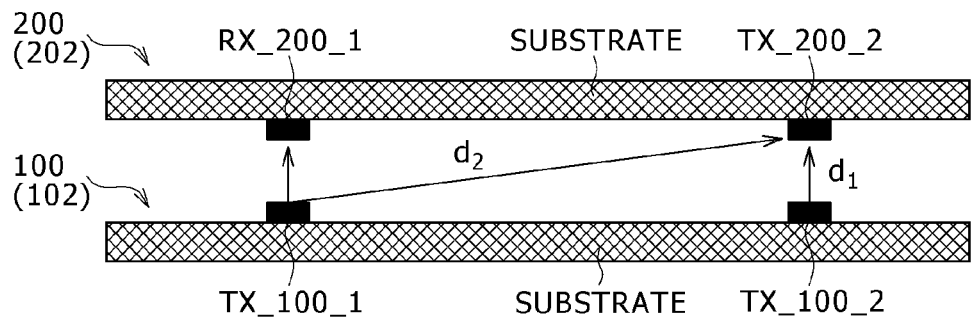
FIG.5C
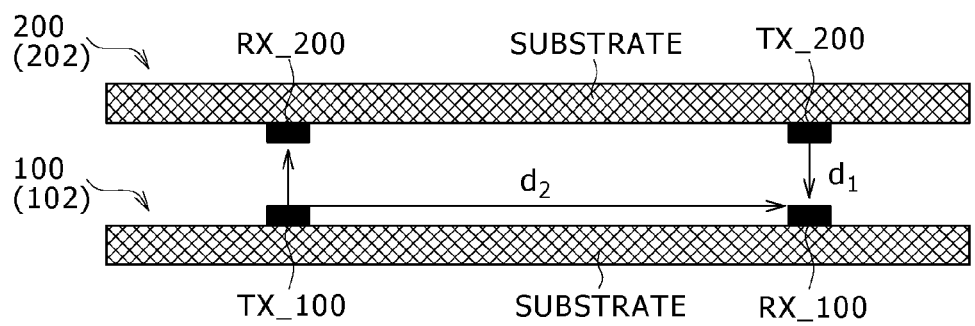

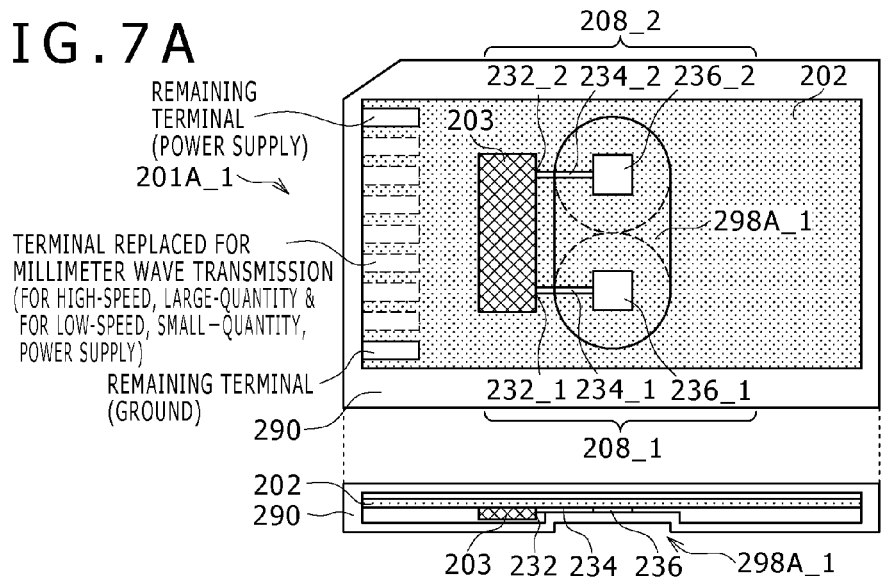
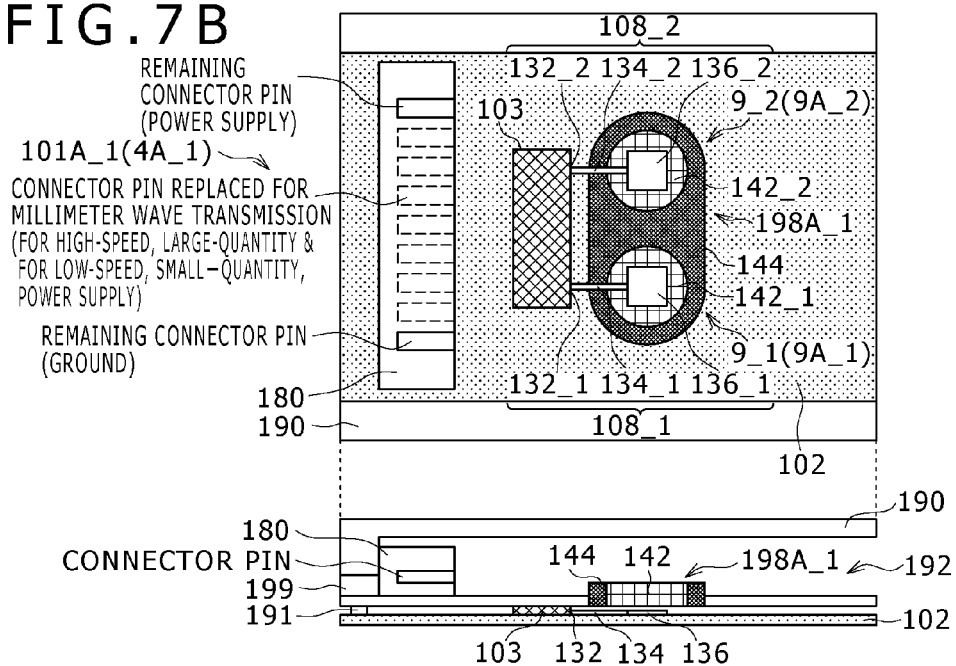
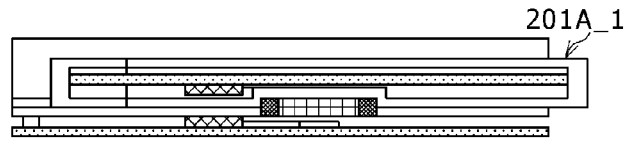

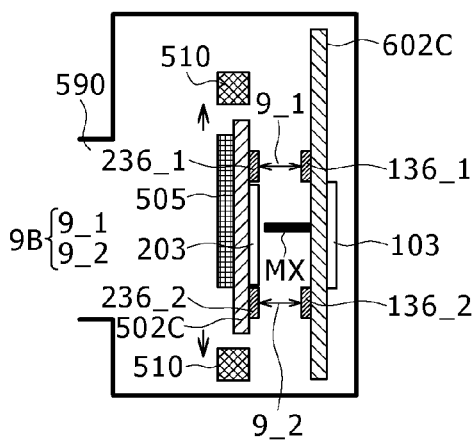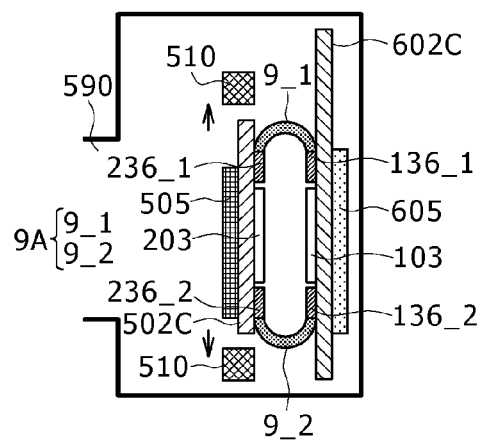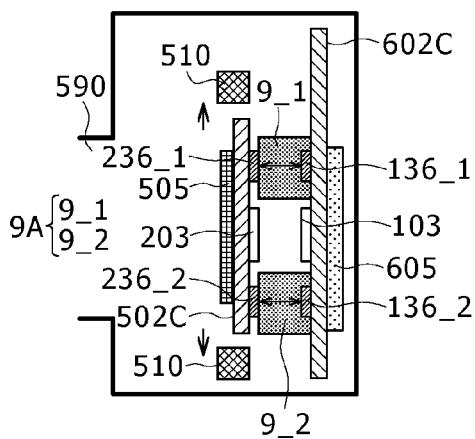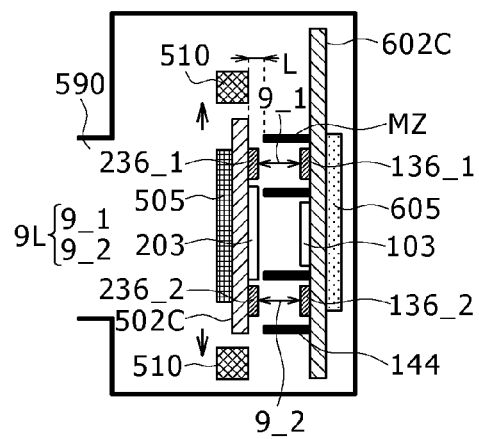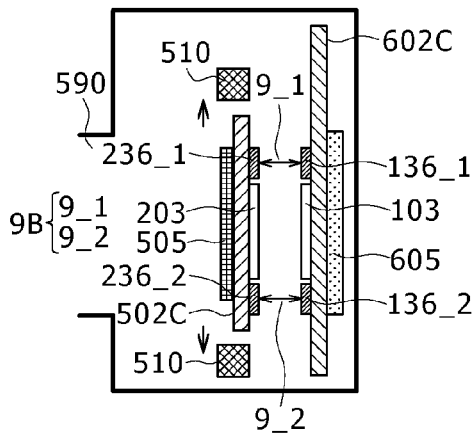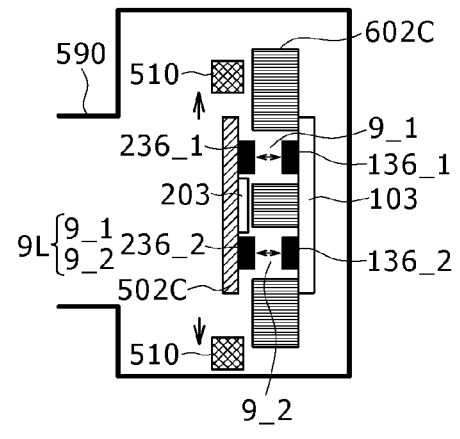

WIRELESS TRANSMISSION SYSTEM AND WIRELESS TRANSMISSION METHOD

BACKGROUND OF THE INVENTION

1. Field of the Invention

This invention relates to a wireless transmission system or apparatus and a wireless transmission method.

2. Description of the Related Art

For example, LVDS (Low Voltage Differential Signaling) is known as a method of implementing high-speed signal transmission between electronic apparatus disposed in a spaced relationship by a comparatively short distance from each other (for example, in a few centimeters to ten and several centimeters) or within an electronic apparatus. However, together with further increase in quantity of transmission data and speed of transmission in recent years, increase of the power consumption, increase of the influence of signal distortion by reflection and so forth, increase of unnecessary radiation and so forth have become subjects. For example, the LVDS exhibits its limit to a case wherein an image signal (including a picked up image signal), a signal of a computer image or a like signal is transmitted at a high speed (on the real time basis) within an apparatus.

In order to cope with the problems by increase of the transmission speed of transmission data, it seems a promising idea to increase the number of wires to transmit signals in parallel while the transmission speed is dropped per one signal line. However, this countermeasure gives rise to increase of input and output terminals. This may require complication of a printed board and cable wires and increase of the semiconductor chip size. Further, since a large amount of high-speed data is transmitted by wires, electromagnetic field interference becomes a problem.

Problems in the LVDS or a technique of increasing the number of wires all arise from transmission of a signal by means of electric wires. Therefore, as a technique for solving problems arising from transmission of a signal by means of electric wires, a technique has been proposed wherein a signal is transmitted eliminating electric wires as disclosed, for example, in Japanese Patent Laid-Open No. 2005-204221 (hereinafter referred to as Patent Document 1) and Japanese Patent Laid-Open No. 2005-223411 (hereinafter referred to as Patent Document 2).

Patent Documents 1 and 2 describe utilization of such standards as IEEE 802.11a/b/g wherein the 2.4 GHz band or the 5 GHz band is used.

Here, since the number of signals connected by electric wires is not limited to one, if it is tried to modify the electric wires so that all signals are transmitted wirelessly using the same frequency, then a problem of interference occurs. In order to eliminate the problem of interference, it seems a promising idea to apply, for example, time division multiplexing or frequency division multiplexing.

However, the time division multiplexing provides a problem that transmission and reception of signals cannot be carried out in parallel while the frequency division multiplexing provides another problem that the bandwidth has to be increased.

In this manner, where it is intended to transmit signals wirelessly in signal transmission between apparatus spaced by a comparatively short distance from each other or within an apparatus, there still remain faults.

SUMMARY OF THE INVENTION

Therefore, it is desirable to provide a novel radio transmission system and method by which, in signal transmission between apparatus spaced by a comparatively short distance from each other or within an apparatus (referred to as short distance signal transmission), a plurality of signals of an object of transmission can be transmitted at a high speed by a great quantity without depending upon electric wires preferably using the same frequency at the same time.

According to an embodiment of the present invention, a plurality of systems of millimeter wave signal transmission lines capable of individually transmitting information in a millimeter waveband independently of each other are provided. A sending section and a reception section are disposed on one end side and the other end side of each of the plural systems of millimeter wave signal transmission lines.

The sending section converts a signal of an object of transmission into a millimeter wave signal and supplies the millimeter wave signal to the millimeter signal transmission line. The reception section corresponding to the sending section receives the millimeter wave signal transmitted thereto through the millimeter wave signal transmission line and converts the received millimeter wave signal back into the signal of the object of transmission.

In particular, between the sending section and the reception section disposed within a range determined in advance (for example, disposed at a comparatively short distance), a signal of a transmission object is transmitted through the millimeter wave signal transmission line after it is converted into a millimeter wave signal. The term "wireless transmission" in the present invention signifies that a signal of a transmission object is transmitted not by an electric wire but using a millimeter wave. Here, by providing a plurality of systems of millimeter wave signal transmission lines, bidirectional simultaneous communication (that is, full-duplex communication) is carried out, or simultaneous (parallel) transmission of signals of a plurality of systems is carried out irrespective of the transmission direction.

The range of the term "within a range determined in advance" is any range which can restrict the range of transmission of a millimeter wave and typically is a range of a shorter distance than the distance between communication apparatus which are used in broadcasting or in general wireless communication. For example, the transmission within the range is millimeter wave signal transmission between substrates in an electronic apparatus or between semiconductor chips. Further, the transmission within the range is transmission where the sending sections and the reception sections are disposed on the same circuit board. Also, the transmission within the range is transmission in a state where the sending sections or the reception sections are respectively formed of semiconductor chips and they are accommodated in all-in-one package. Or, the transmission within the range is millimeter wave transmission in a state wherein, where a communication apparatus having the sending sections or the reception sections is an electronic apparatus having a mounting structure and another communication apparatus having the reception sections or the sending sections is another information processing apparatus for being mounted on the mounting structure such as, for example, an information processing apparatus of the card type (hereinafter referred to as card type apparatus), the information processing apparatus is mounted on the mounting structure of the electronic apparatus (such as, for example, a slot structure or a receiving table).

In the communication apparatus disposed with the millimeter wave signal transmission lines sandwiched therebetween, the sending sections and the reception sections are disposed in paired combinations. Although signal transmission between the two communication apparatus may be onedirectional (one-way communication) or bidirectional, preferably it is bidirectional communication.

Each of the sending sections includes, for example, a sender side signal production section for processing the signal of the transmission object to produce a millimeter wave signal (a signal conversion section for converting the electric signal of the transmission object into a signal of a millimeter wave) and a sender side signal coupling section for coupling the signal of the millimeter wave produced by the sender side signal production section to the corresponding transmission line for transmitting the signal of the millimeter wave (the millimeter wave signal transmission line). Preferably, the sender side signal production section is provided integrally with a function section for producing the signal of the transmission object.

For example, the sender side signal production section has a modulation circuit, which modulates an input signal. The sender side signal production section frequency-coverts the input signal after modulated by the modulation circuit to produce a millimeter wave signal. The sender side signal coupling section supplies the millimeter wave signal produced by the sender side signal production section to the millimeter wave signal transmission line. From a principle, the signal of the transmission object may be converted directly into a signal of a millimeter wave.

On the other hand, each of the reception sections includes, for example, a receiver side signal coupling section for receiving a millimeter wave signal transmitted thereto through the corresponding millimeter wave signal transmission line, and a receiver side signal production section for processing the millimeter wave signal (the input signal) received by the receiver side signal coupling section to produce a general electric signal (which is the signal of the transmission object) (that is, a signal conversion section for converting the millimeter wave signal into an electric signal of the transmission object). Preferably, the receiver side signal production section is provided integrally with a function section for receiving a signal of a transmission object. For example, the receiver side signal production section includes a demodulation section and frequency-converts a signal of a millimeter wave to produce an output signal. Then, the demodulation circuit demodulates the output signal to produce a signal of the transmission object. From a principle, the signal of the millimeter wave may be converted directly into a signal of the transmission object.

In other words, upon signal interfacing between different apparatus such as an electronic apparatus, an information processing apparatus and a semiconductor apparatus, the signal of the transmission object is not transmitted using a millimeter wave signal in a contact-less or cable-less fashion (without using transmission by an electric wire).

Preferably, for at least signal transmission (particularly for signal transmission demanded to be high speed transmission), a millimeter wave signal is used. In particular, according to an embodiment of the present invention, signal transmission which has been carried out through an electric wire in the past is replaced by transmission by a millimeter wave signal. The signal transmission in the millimeter waveband makes it possible to implement high speed transmission on the Gbps order and can easily restrict the range of a millimeter wave signal (the reason is hereinafter described) and can achieve effects arising from this nature.

Also a signal for which high speed transmission is not required may be transmitted in a contact-less or cable-less fashion by a communication interface by a millimeter wave signal. Preferably, as regard power supply, power may be transmitted wirelessly adopting one of a radio wave reception system, an electromagnetic induction system and a resonance system. For example, it seems a promising idea to apply the radio wave reception system to carry out wireless power transmission using a millimeter wave. However, from the point of view of the power transmission efficiency and so forth, the electromagnetic induction system or the resonance system should be adopted (it is considered particularly effective to adopt the resonance system).

Here, each of the signal coupling sections may allow a signal of a millimeter wave to be transmitted between the sending section and the reception section through the millimeter wave signal transmission line. For example, the signal coupling section may include an antenna structure (an antenna coupling section) or may be of the type which establishes coupling of a millimeter wave without using an antenna structure.

Although the "millimeter wave signal transmission line for transmitting a signal of a millimeter wave" may be the air (that is, a free space), preferably it has a structure for transmitting a millimeter wave signal while confining the millimeter wave signal in the transmission line. By positively utilizing this nature, laying of the millimeter wave signal transmission lines can be finally determined arbitrarily like laying of electric wires. For example, the millimeter wave signal transmission line may be formed from a dielectric material which can transmit a millimeter wave signal (referred to as a dielectric transmission line or millimeter wave in-dielectric transmission line) or a hollow waveguide which is provided with a blocking member which forms a transmission line or lines and is hollow in the inside of the blocking member for suppressing external radiation of a millimeter wave signal.

Incidentally, in the case of the air (in the case of a free space), each signal coupling section is formed with an antenna structure such that a signal is transmitted at a short distance in the air through the antenna structures. On the other hand, where the millimeter wave signal transmission line is formed from a dielectric material, although this can assume an antenna structure, this is not essential.

Where a plurality of systems of millimeter wave signal transmission lines capable of individually transmitting information in the millimeter waveband independently of each other are provided in a free space, it is effective means to connect an antenna, which has strong directivity in the transmission direction but has weak directivity in any other direction than the transmission direction, to each of the sending section and the reception of each system such that a millimeter wave signal transmission line is configured between the antenna in order to decrease the channel distance.

In this manner, according to an embodiment of the present invention, the wireless transmission system is characterized in that a plurality of systems of millimeter wave signal transmission lines capable of transmitting information in the millimeter waveband independently of each other are provided. The term "independently" signifies that the transmission lines are separated from each other to such a degree that, for example, even if the plural systems carry out transmission with the frequency at the same time, interference does not occur or can be ignored. However, in this significance, the millimeter wave signal transmission lines are not limited to transmission lines which are physically separate from each other. In short, a plurality of systems of millimeter wave signal transmission lines independent of each other are constructed by spatially separating them from each other to such a degree that no mutual influence is had thereamong thereby to make multiple transmission with the same frequency at the same time possible. The separation method of the transmission lines includes a method which separates the space with the distance or a structure or another method which uses a plurality of dielectric transmission lines or hollow waveguides.

With the wireless transmission system of the embodiment of the present invention, transmission of a plurality of systems of signals (that is, multiplex transmission of signals), can be implemented with a transmission speed and a transmission quantity, which cannot be implemented by electric wires, without being influenced by interference. Since the millimeter waveband is used, signal transmission can be carried out without depending upon an electric wire and no disturbance is applied to other neighboring electric wires.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a block diagram showing a functional configuration of a signal interface of a wireless transmission system as a reference configuration;

FIGS. 2A to 2D are diagrammatic views illustrating multiplexing of signals by the wireless transmission system of FIG. 1;

FIGS. 5A to 5C are schematic views illustrating an appropriate condition for the space division multiplexing;

FIGS. 7A to 7C are schematic views of first example of a space division millimeter wave transmission structure of the signal interface of FIG. 6;

FIGS. 10A to 10F are schematic views showing the third example of the space division millimeter wave transmission structure of the signal interface of FIG. 6;

DETAILED DESCRIPTION OF THE PREFERRED EMBODIMENT

Figure 2C:
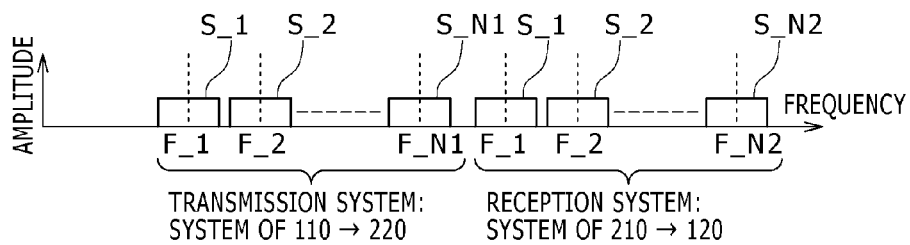

In the following, an embodiment of the present invention is described in detail with reference to the accompanying drawings. It is to be noted that, where each function element is distinguished among different embodiments, an alphabetic reference character of a capital letter like A, B, C, . . . is added as a suffix to a reference character. Further, a reference character "_@" is sometimes added as a suffix in order to subdivisionally distinguish each function element. Where no such distinction is required, such reference characters as mentioned above are omitted. This similarly applies also to the drawings.

The description is given in the following order.
1. Wireless Transmission System: reference configuration
2. Wireless Transmission System: embodiment
3. Space Division Millimeter Wave Transmission Structure: first example (application to memory card/same board face)
4. Space Division Millimeter Wave Transmission Structure: second example (application to memory card/different board faces)
5. Space Division Millimeter Wave Transmission Structure: third example (application to image pickup apparatus)
6. Space Division Millimeter Wave Transmission Structure: forth example (application to transmission in board)
7. Space Division Millimeter Wave Transmission Structure: fifth example (application to transmission in semiconductor package)
8. Space Division Millimeter Wave Transmission Structure: sixth example (application to transmission between semiconductor packages)
9. Space Division Millimeter Wave Transmission Structure: seventh example (application to transmission between boards)
10. Space Division Millimeter Wave Transmission Structure: eighth example (fourth example+seventh example)

It is to be noted that, in order to facilitate understandings of the mechanism of the present embodiment, a basic mechanism (reference configuration) of wireless transmission adopted in the present embodiment is described first, and then a particular mechanism of the present invention is described.

<Wireless Transmission System: Reference Configuration>

Figure 2D:
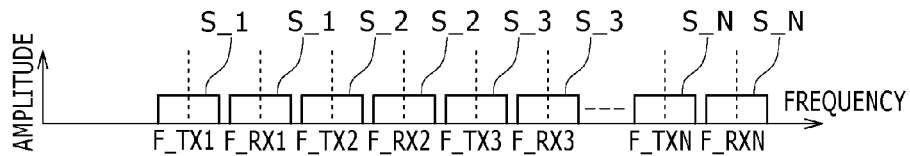
Figure 3:
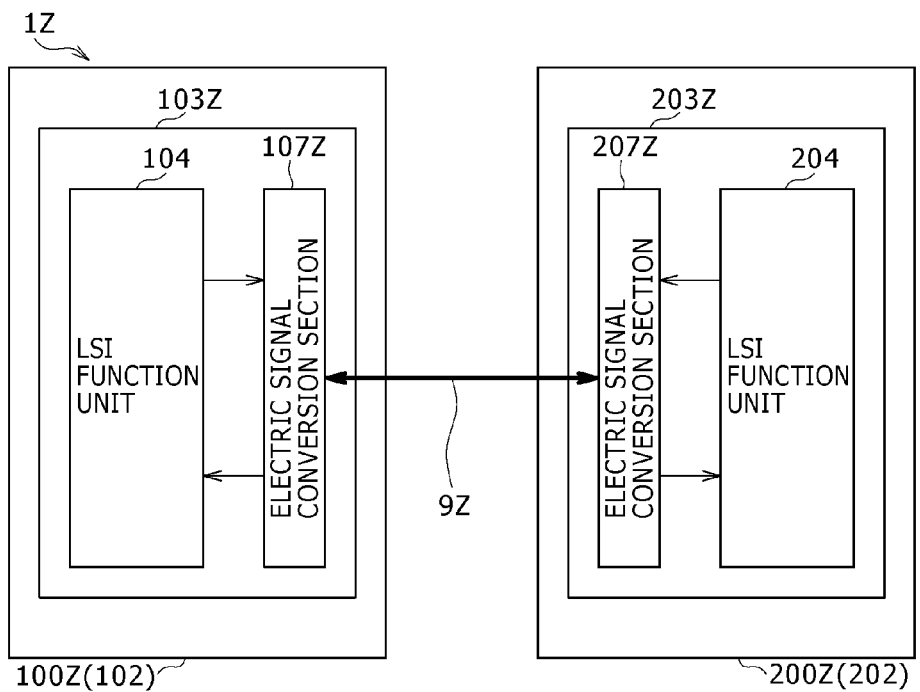
FIG. 3 is a block diagram showing a functional configuration of a signal interface of a wireless transmission system as a comparative example.

FIGS. 1 to 3 show a reference configuration of a wireless transmission system to the embodiment of the present invention. In particular, FIG. 1 shows a functional configuration of a signal interface of a wireless transmission system 1X of the reference configuration, and FIGS. 2A to 2D illustrate multiplexing of signals by the wireless transmission system 1X. FIG. 3 shows a functional configuration of a signal interface of a signal transmission system 1Z of a comparative example.
[Functional Configuration: Basis]

Referring first to FIG. 1, the wireless transmission system 1X of the present reference configuration is configured such that a first communication apparatus 100X which is an example of a first wireless apparatus and a second communication apparatus 200X which is an example of a second wireless apparatus are coupled to each other through a millimeter wave signal transmission line 9 and signal transmission is carried out with a millimeter waveband. A signal of an object of transmission is frequency converted into a signal of the millimeter waveband suitable for wideband transmission, and then the resulting signal of the converted frequency is transmitted.

A semiconductor chip 103 capable of carrying out millimeter waveband communication is provided in the first communication apparatus 100X, and a semiconductor chip 203 capable of carrying out millimeter waveband communication is provided also in the second communication apparatus 200X.

In the present reference configuration, only a signal for which high-speed large-quantity transmission is required is determined as a signal of an object of communication in the millimeter waveband. Meanwhile, any other signal for which low-speed small-quantity transmission may be used and a signal which can be considered as direct current such as power supply are not determined as an object of conversion into a millimeter wave signal. Similarly as in the related art, as regards those signals which are not determined as an object of conversion into a millimeter wave signal (including power supply), electric wires are laid so as to extend from LSI function units 104 and 204 to terminals (connectors) such that electrical connection is established by mechanical contact through terminals of both of the first communication apparatus 100X and the second communication apparatus 200X. It is to be noted that an original electric signal which is an object of transmission before conversion into a millimeter wave is hereinafter referred to as baseband signal.

For example, a command signal, a bus state signal (in the case of serial interface specifications), an address signal, various controlling signals (in the case of parallel interface specifications) and so forth are signals for which low-speed small-quantity transmission may be used. Further, in an example of application to signal transmission between an image pickup board and a main board in an image pickup apparatus, a controlling signal from a camera controlling section, a synchronizing signal from a synchronizing signal generation section and so forth are signals for which low-speed small-quantity transmission may be used.

For example, a data signal of a movie screen image, a computer image or the like is data which is an object of conversion into a millimeter wave signal and for which high-speed large-quantity transmission is required. A millimeter wave transmission system is constructed by converting such data as just described into a signal of a millimeter waveband whose propagation frequency is 30 GHz to 300 GHz and transmitting the signal at a high speed.

As a combination of communication apparatus 100 and 200, for example, such combinations as described below are applicable. Where the communication apparatus 200 is a battery-driven equipment such as a portable telephone set, a digital camera, a video camera, a game machine, a remote controller, a shaver or the like, the first communication apparatus 100X is a battery charger or an apparatus which is called base station for carrying out image processing and so forth.

Where the second communication apparatus 200X has an appearance like a comparatively thin IC card, a card reading and writing apparatus is the first communication apparatus 100X. The card reading and writing apparatus is further used in combination with an electronic apparatus main body such as, for example, a digital recording and reproduction apparatus, a ground wave television receiver, a portable telephone set, a game machine, a computer or the like. Further, where application to an image pickup apparatus is carried out, for example, the first communication apparatus 100X is disposed on the main board side and the second communication apparatus 200X is disposed on the image pickup board side, and transmission in the apparatus is carried out. Naturally, the combination described above is a mere example.
[First Communication Apparatus]

In the first communication apparatus 100X, a semiconductor chip 103 capable of implementing millimeter waveband communication and a transmission line coupling section 108 are mounted on a board 102. The semiconductor chip 103 is a system LSI (Large Scale Integrated Circuit) on which an LSI function unit 104 and a signal production unit 107 (a millimeter wave signal production section) are integrated. Though not shown, a configuration may be applied wherein the LSI function unit 104 and the signal production unit 107 are formed separately from each other without being integrated. Where the configuration just described is applied, since a problem arising from transmission of a signal by an electric wire is worried about regarding signal transmission between the units 104 and 107, it is preferable to integrate the units 104 and 107. Where the configuration described above is applied, it is preferable to dispose two chips (the LSI function unit 104 and the signal production unit 107) closely to each other and make the wire bonding length as short as possible so that a bad influence may be reduced. Preferably, a configuration having a bidirectional characteristic of data is applied to the signal production unit 107 and the transmission line coupling section 108. Therefore, a signal production unit on the sender side and another signal production unit on the receiver side are provided on the signal production unit 107. While the transmission line coupling section 108 may be provided on both of the sender side and the receiver side, the transmission coupling section 108 here is used for both of transmission and reception.

It is to be noted that the term "bidirectional communication" in the present reference configuration is one-core bidirectional transmission wherein a millimeter wave signal transmission line 9 which is a transmission channel of a millimeter wave of one system (one core) is used. In order to implement the one-core bidirectional transmission, a half-duplex method to which time division multiplexing (TDD: Time Division Duplex) is applied, frequency division multiplexing (FDD: Frequency Division Duplex: FIGS. 2A to 2D) and so forth are applied.

Since, in the case of time division multiplexing, separation between transmission and reception is carried out by time division, "simultaneity of bidirectional communication (one-core simultaneity bidirectional transmission)" wherein signal transmission from the first communication apparatus 100X to the second communication apparatus 200X and signal transmission from the second communication apparatus 200X to the first communication apparatus 100X are carried out at the same time is not implemented. However, the one-core simultaneity bidirectional transmission is implemented by frequency division multiplexing. However, since frequencies different upon transmission and reception are used in the frequency division multiplexing as seen in FIG. 2A, the transmission bandwidth of the millimeter wave signal transmission line 9 has to be great.

Not the semiconductor chip 103 is mounted directly on the board 102 but a semiconductor package wherein the semiconductor chip 103 is mounted on an interposer board and the semiconductor chip 103 is molded by resin (for example, epoxy resin) may be mounted on the board 102. In particular, the interposer board configures a board for chip mounting and the semiconductor chip 103 is provided on the interposer board. A sheet member having dielectric constant within a fixed range (approximately 2 to 10) and formed by combining, for example, thermally reinforced resin and copper foil may be used for the interposer board.

The semiconductor chip 103 is connected to a transmission line coupling section 108. To the transmission line coupling section 108, an antenna structure including, for example, an antenna coupling section, an antenna terminal, a microstrip line, an antenna and so forth is applied. It is to be noted that, by applying a technique wherein an antenna is formed directly on a chip, also the transmission line coupling section 108 can be incorporated in the semiconductor chip 103.

Since the LSI function unit 104 handles main application control of the first communication apparatus 100X and includes a circuit for processing an image, voice data and so forth to be transmitted to the opposite party of communication, and a circuit for processing an image, voice data and so forth received from the opposite party. It is to be noted that, where the second communication apparatus 200X is formed as a memory card, not only an application function section but also a memory card controlling section are provided on the LSI function unit 104. The memory card controlling section carries out logical control for a memory card 200A such as, for example, reading and writing control of data or the like in accordance with a request from the application function section.

The signal production unit 107 (electric signal conversion section) converts a signal from the LSI function unit 104 into a millimeter wave signal and carries out signal transmission control through the millimeter wave signal transmission line 9.

In particular, the signal production unit 107 includes a sender side signal production section 110 and a receiver side signal production section 120. A sending section is configured from the sender side signal production section 110 and the transmission line coupling section 108, and a reception section is configured from the receiver side signal production section 120 and the transmission line coupling section 108.

The sender side signal production section 110 includes a multiplexing processing section 113, a parallel-to-serial conversion section 114, a modulation section 115, a frequency conversion section 116 and an amplification section 117 in order to process an input signal to produce a signal of a millimeter wave. It is to be noted that a direct conversion system wherein the modulation section 115 and the frequency conversion section 116 are integrally provided may be applied. The sending section is configured from the sender side signal production section 110 and the transmission line coupling section 118.

The receiver side signal production section 120 includes an amplification section 124, a frequency conversion section 125, a demodulation section 126, a serial-to-parallel conversion section 127 and a unification processing section 128 in order to process an electric signal of a millimeter wave received by the transmission line coupling section 108 to produce an output signal (baseband signal). It is to be noted that a direct conversion system wherein the frequency conversion section 125 and the demodulation section 126 are integrally provided may be applied.

The parallel-to-serial conversion section 114 and the serial-to-parallel conversion section 127 are provided in the case of parallel interface specifications for using a plurality of data signals for parallel transmission but do not have to be provided in the case of serial interface specifications.

The multiplexing processing section 113 carries out, where the signal from the LSI function unit 104 includes a plurality of kinds of signals (that is, N signals) which make an object of communication in a millimeter waveband, a multiplexing process such as time division multiplexing, frequency division multiplexing, code division multiplexing or the like to collect the plural signals into a signal of one system. In the case of the present reference configuration, plural different signals for which high-speed large-quantity transmission is required are collected as an object of transmission in a millimeter wave into a signal of one system. The plural kinds of signals for which high-speed large-quantity transmission is required include a data signal and a clock signal.

It is to be noted that, in the case of time division multiplexing or code division multiplexing, the multiplexing processing section 113 is provided at the preceding stage to the parallel-to-serial conversion section 114, and the plural different signals may be collected to a signal of one system and then supplied to the parallel and serial conversion section 114. On the other hand, in the case of time division multiplexing, a changeover switch for finely dividing time of the plural signals $\_@$ ($@$ is 1 to N) and supplying the signals to the parallel-to-serial conversion section 114 may be provided.

On the other hand, in the case of frequency division multiplexing, frequencies of the plural different signals have to be converted into frequencies within a range of frequency bands $F\_@$ different from each other to produce a signal of millimeter wave as shown in FIG. 2A. To this end, for example, the parallel-to-serial conversion section 114, modulation section 115, frequency conversion section 116 and amplification section 117 may be provided for each of the plural different signals $\_@$ and an addition processing section may be provided as the multiplexing processing section 113 at the following stage to the respective amplification sections 117. Further, electric signals of a millimeter wave of the frequency band $F\_1+ \ldots +F\_N$ after the frequency multiplexing process may be supplied to the transmission line coupling section 108.

As can be recognized from FIG. 2B, the transmission bandwidth has to be great in the frequency division multiplexing wherein signals of plural systems are collected into a signal of one system. As shown in FIG. 2C, where both of a method wherein plural systems of signals are collected into one system by frequency division multiplexing and a full duplex system wherein frequencies different from each other are used upon transmission and reception are used, the transmission bandwidth has to be made still greater.

The parallel and serial conversion section 114 converts parallel signals into a serial signal and supplies the resulting signal to the modulation section 115. The modulation section 115 modulates a transmission object signal and supplies the modulated signal to the frequency conversion section 116. As the modulation section 115, an element for modulating at least one of the amplitude, frequency and phase with a transmission object signal may be used, and also a method of arbitrary combination of the amplitude, frequency and phase can be adopted. For example, for an analog modulation method, for example, amplitude modulation (AM: Amplitude Modulation) and vector modulation are applicable. For vector modulation, frequency modulation (FM: Frequency Modulation) and phase modulation (PM: Phase Modulation) are applicable. For a digital modulation method, for example, amplitude transition modulation (ASK: Amplitude Shift Keying), frequency transition modulation (FSK: Frequency Shift Keying), phase transition modulation (PSK: Phase Shift Keying), amplitude phase modulation (APSK: Amplitude Phase Shift Keying) for modulating the amplitude and the phase are applicable. As the amplitude phase modulation, quadrature amplitude modulation (QAM: Quadrature Amplitude Modulation) is representative.

The frequency conversion section 116 carries out frequency conversion for a transmission object signal after the modulation by the modulation section 115 to produce an electric signal of a millimeter wave and supplies the produced signal to the amplification section 117. The electric signal of a millimeter wave generally signifies an electric signal of a frequency within a range of 30 GHz to 300 GHz. The reason why the term "generally" is used is that a frequency may be used with which an effect by millimeter wave communication of the present embodiment (including the reference configuration) is obtained, and the lower limit is not limited to 30 GHz and the upper limit is not limited to 300 GHz.

While various circuit configurations can be applied as the frequency conversion section 116, for example, a configuration may be applied wherein a mixture circuit (mixer circuit) and a local oscillator are provided. The local oscillator generates a carrier (a carrier signal or a reference carrier) to be used for modulation. The mixture circuit multiplies (modulates) a carrier of the millimeter waveband generated by the local oscillator with a signal from the parallel-to-serial conversion section 114 to generate a modulation signal of the millimeter waveband and supplies the generated signal to the amplification section 117.

The amplification section 117 amplifies the electric signal of a millimeter wave after the frequency conversion and supplies the amplified signal to the transmission line coupling section 108. The bidirectional transmission line coupling section 108 is connected to the amplification section 117 through an antenna terminal not shown.

The transmission coupling section 108 transmits the signal of a millimeter wave produced by the sender side signal production section 110 to the millimeter wave signal transmission line 9. Further, the transmission coupling section 108 receives a signal of a millimeter wave from the millimeter wave signal transmission line 9 and then outputs the received signal to the receiver side signal production section 120.

The transmission line coupling section 108 is configured from an antenna coupling section. The antenna coupling section configures an example or part of the transmission line coupling section 108 (signal coupling section). The antenna coupling section signifies a portion for coupling an electric circuit in a semiconductor chip to an antenna disposed in the inside or on the outside of a chip in a narrow sense, but in a wide sense signifies a portion for signal coupling between a semiconductor chip and a dielectric transmission line.

For example, the antenna coupling section includes at least an antenna structure. Further, where transmission and reception are carried out by time division multiplexing, an antenna changeover section (antenna sharing section) is provided on the transmission line coupling section 108.

The antenna structure signifies a structure at a coupling section to the millimeter wave signal transmission line 9 and may be any structure if it couples an electric signal of the millimeter waveband to the millimeter wave signal transmission line 9, but does not signify only an antenna itself. For example, the antenna structure is configured including an antenna terminal, a microstrip line and an antenna. Where the antenna changeover section is formed in the same chip, the antenna terminal and the microstrip line other than the antenna changeover section configure the transmission line coupling section 108.

The antenna is configured from an antenna member having a length (for example, approximately 600 μm), based on the wavelength λ of the signal of a millimeter wave and is coupled to the millimeter wave signal transmission line 9. As the antenna, not only a patch antenna but also a probe antenna (such as the dipole), a loop antenna, a small-sized aperture coupling element (such as a slot antenna) or the like are used.

Where the antenna on the first communication apparatus 100X side and the antenna on the second communication apparatus 200X side are disposed in an opposing relationship to each other, a non-directional antenna may be applied. On the other hand, where the antennas are disposed in a displaced relationship from each other on a plane, an antenna having directivity may be applied. Or else, a technical idea that the advancing direction of a signal is varied from a thicknesswise direction of the board to a planar direction utilizing a reflection member, another technical idea that a dielectric transmission line for advancing a signal in a planar direction is provided may be applied.

The antenna on the sender side radiates an electromagnetic wave based on a signal of a millimeter wave to the millimeter wave signal transmission line 9. On the other hand, the antenna on the receiver side receives the electromagnetic wave based on the signal of the millimeter wave from the millimeter wave signal transmission line 9. The microstrip line interconnects the antenna terminal and the antenna such that a signal of a millimeter wave on the sender side is transmitted from the antenna terminal to the antenna and a signal of a millimeter wave on the receiver side is transmitted from the antenna to the antenna terminal.

The antenna changeover section is used where the antenna is used for both of transmission and reception. For example, when a signal of a millimeter wave is to be transmitted to the second communication apparatus 200X which is the opposite party of communication, the antenna changeover section connects the antenna to the sender side signal production section 110. On the other hand, when a signal of a millimeter wave from the second communication apparatus 200X which is the opposite party is to be received, the antenna changeover section connects the antenna to the receiver side signal production section 120. While the antenna changeover section is provided on the board 102 separately from the semiconductor chip 103, the configuration of the present invention is not limited to this, and the antenna changeover section may be provided in the semiconductor chip 103. Where the antenna for transmission and the antenna for reception are provided separately from each other, the antenna changeover section can be omitted.

The millimeter wave signal transmission line 9 which is a propagation path of a millimeter wave may be configured from a free space transmission line. However, preferably the millimeter wave signal transmission line 9 is configured from a waveguide structure for confining and transmitting a millimeter wave such as a waveguide pipe, a transmission line path, a dielectric line path, a dielectric or the like such that it has a characteristic for transmitting an electromagnetic wave of the millimeter waveband efficiently. For example, the millimeter wave signal transmission line 9 may be a dielectric transmission line configured including a dielectric material having a dielectric constant within a fixed range and a dielectric loss tangent within a fixed range.

The "fixed range" may be any range within which an effect of the present embodiment can be achieved by the dielectric constant or the dielectric loss tangent of the dielectric material, and a value fixed in advance may be applied to the fixed range. In particular, as the dielectric material, a material which can transmit a millimeter wave and has a characteristic with which the effect of the present embodiment is achieved may be applied. While the fixed range is not necessarily be determined definitely because it cannot be determined from only the dielectric material itself and relates also the transmission line length and the frequency of a millimeter wave, the fixed range is determined in the following manner as an example.

In order to transmit a signal of a millimeter wave at a high speed to a dielectric transmission line, it is desired to set the dielectric constant of the dielectric material to approximately 2 to 10 (preferably 3 to 6), and set the dielectric loss tangent of the dielectric material to approximately 0.00001 to 0.01 (preferably 0.00001 to 0.001). As a dielectric material which satisfies such conditions as just described, for example, a material configured from acrylic resin-based, urethane resin-based, epoxy resin-based, silicone-based, polyimide-based or cyanoacrylate resin-based material can be used. Such ranges of the dielectric constant of the dielectric material and the dielectric loss tangent given above are similar in the present embodiment unless otherwise specified. It is to be noted that, as the millimeter wave signal transmission line 9 having a configuration wherein a millimeter wave signal is confined in the transmission line, not only the dielectric transmission line but also a hollow waveguide wherein the periphery of the transmission line is surrounded by a shielding material and the inside of the transmission line is hollow may be applied.

The receiver side signal production section 120 is connected to the transmission line coupling section 108. The amplification section 124 of the receiver side signal production section 120 is connected to the transmission line coupling section 108 and amplifies an electric signal of a millimeter wave after received by the antenna and then supplies the amplified signal to the frequency conversion section 125. The frequency conversion section 125 carries out frequency conversion for the electric signal of a millimeter wave after the amplification and then supplies the signal after the frequency conversion to the demodulation section 126. The demodulation section 126 demodulates the signal after the frequency conversion to acquire a signal of a baseband and then supplies the baseband signal to the serial-to-parallel conversion section 127.

While various circuit configurations can be adopted for the frequency conversion section 125 and the demodulation section 126, for example, a square detection circuit for obtaining a detection output which increases in proportion to the square of an amplitude of (an envelope of) the received millimeter wave signal can be applied.

The serial and parallel conversion section 127 converts the serial reception data into parallel output data and then supplies the converted data to the unification processing section 128.

The unification processing section 128 corresponds to the multiplexing processing section 113 and separates the signal collected to one system into plural kinds of signals _@ (@ is 1 to N). In the case of the present reference configuration, for example, a plurality of data signals collected to the signal of one system are separated into plural systems of signals and the separated signals are supplied to the LSI function unit 104.

It is to be noted that, where the signals are collected to one system by frequency division multiplexing, an electric signal of a millimeter wave in a frequency band F_1+ . . . +F_N after the frequency multiplexing process has to be received and processed for each of the frequency bands F_@. To this end, as shown in FIG. 2B, the amplification section 224, frequency conversion section 225, demodulation section 226 and serial and parallel conversion section 227 may be provided for each of the plural kinds of signals _@ and a frequency separation section may be provided as the unification processing section 228 at the preceding stage to each of the amplification sections 224. Then, the electric signal of a millimeter wave in the frequency band F_@ after the separation may be supplied to a system of the corresponding frequency band F_@.

If the semiconductor chip 103 is configured in such a manner as described above, then the parallel-to-serial conversion is carried out for the input signal and then the converted signal is transmitted to the semiconductor chip 203 side. Further, the semiconductor chip 203 carries out parallel-to-serial conversion of a reception signal from the semiconductor chip 203 side. Consequently, the number of signals which are a millimeter wave conversion object is decreased.

It is to be noted that, where the original signal transmission form between the first communication apparatus 100X and the second communication apparatus 200X is a serial form, the parallel-to-serial conversion section 114 and the serial-to-parallel conversion section 127 may not be provided.

[Second Communication Apparatus]

The second communication apparatus 200X generally has a functional configuration similar to that of the first communication apparatus 100X. Reference characters in the 200 level are applied to function sections, and reference characters in the 10 and 1 levels same as those of the first communication apparatus 100X are applied to function sections similar and resembling to those of the first communication apparatus 100X. A sending section is configured from a sender side signal production section 210 and a transmission line coupling section 208 and a reception section is configured from a receiver side signal production section 220 and a transmission line coupling section 208.

It is to be noted that, where the second communication apparatus 200X is applied in the form of a memory card, a memory function section and a memory controlling section are provided in an LSI function unit 204. The memory function section is a nonvolatile storage medium provided, for example, as a flash memory or a hard disk. The memory controlling section carries out reading and writing control of data for the memory function section in response to data from the first communication apparatus 100X side. The signal production unit 207 (electric signal conversion section and a baseband signal production section) converts a millimeter wave signal which indicates data from the memory card controlling section side and is received through the millimeter wave signal transmission line 9 into original data (baseband signal) and then supplies the converted data to the memory controlling section.

Here, a technique of frequency converting and transmitting an input signal is used commonly to broadcasting and wireless communication. To the applications just described, comparatively complicated transmitter and receiver and so forth are used which can cope with such problems as α) in what range communication can be carried out (problem of the S/N ratio with regard to thermal noise), β) how to cope with reflection and multipath interference, γ) how to suppress disturbance and interference with a different channel. On the other hand, the signal production units 107 and 207 used in the present embodiment are used with the millimeter waveband which is a frequency band higher than a frequency used by complicated transmitter and receiver and so forth commonly used in broadcasting and wireless communication. Since the wavelength λ is short, a signal production unit is used wherein the frequency is re-utilized easily and which is suitable for communication among a great number of devices located in the proximity of each other.

[Injection Locking]

Here, where a wireless transmission system is configured from a modulation function section 8300X and a demodulation function section 8400X, it has the following faults.

First, the wireless transmission system has the following fault regarding an oscillation circuit. For example, in outdoor (open-air) communication, it is necessary to take multi-channeling into consideration. In this instance, since an influence of frequency variation components of a carrier is had on the communication, a request for specifications for the stability of a carrier on the sender side is severe. If it is intended to use such an ordinary method as used in outdoor wireless communication when data is to be transmitted with a millimeter wave in in-housing signal transmission or inter-apparatus signal transmission, then an oscillation circuit of a millimeter wave having high stability in which the stability is required for the carrier and the degree of frequency stability is on the approximately ppm (parts per million) order is required.

In order to implement a carrier signal having high frequency stability, for example, it is a possible idea to implement an oscillation circuit of a millimeter wave having a high stability on a silicon integrated circuit (CMOS: Complementary Metal-oxide Semiconductor). However, since the insulation performance of a silicon substrate used for an ordinary CMOS device is low, a tank circuit having a high Q value (Quality Factor) cannot be easily formed and the silicon substrate just described is not easily implemented. For example, as described in the reference document A, where an inductance element is formed on a CMOS chip, the Q value of the inductance is approximately 30 to 40.

Reference Document A: A. Niknejad, "mm-Wave Silicon Technology 60 GHz and Beyond" (particularly, 3. 1. 2 Inductors pp 70 to 71), ISBN 978-0-387-76558-7

Therefore, in order to implement an oscillation circuit having high stability, for example, it is a possible idea to adopt a method wherein a tank circuit having a high Q value is configured from a crystal oscillator or the like on the outside of a CMOS device on which a main body portion of the oscillation circuit is configured and the tank circuit is oscillated with a low frequency and besides an oscillation output of the tank circuit is multiplied to increase the output to the millimeter waveband. However, where a function for replacing signal transmission by a wiring line such as LVDS (Low Voltage Differential Signaling) or the like with signal transmission by a millimeter wave is implemented, it is not preferable to provide such an outside tank as described above on all chips.

If a method for modulating the amplitude such as OOK (On-Off-Keying) is used, then since envelop detection may be carried out on the receiver side, the oscillation circuit does not have to be provided and the number of tank circuits can be reduced. However, the reception amplitude is reduced as the transmission distance of a signal increases, and, in a system wherein a square detection circuit is used as an example of envelop detection, since the influence of reduction of the reception amplitude becomes remarkable and signal distortion has an influence, the method described above becomes disadvantageous. In other words, the square detection circuit is disadvantageous in sensitivity.

While it is a possible idea to use, as a different method for implementing a carrier signal having a high degree of frequency stability, a frequency multiplication circuit or a PLL circuit having high stability, this increases the circuit scale. For example, while, in the reference document B specified below, a push-push (Push-push) oscillation circuit is used to eliminate a 60 GHz oscillation circuit thereby to reduce the circuit scale, an oscillation circuit of 30 GHz, a frequency divider, a phase frequency detection circuit (Phase Frequency Detector: PFD), an external reference circuit (in this example, of 117 MHz) and so forth are required. Therefore, apparently the circuit scale becomes great.

Reference Document B: "A 90 nm CMOS Low-Power 60 GHz Transceiver with Integrated Baseband Circuitry," ISSCC 2009/SESSION 18/RANGING AND Gb/s COMMUNICATION/18. 5, 2009 IEEE International Solid-State Circuits Conference, pp. 314 to 316

Since the square detection circuit can extract an amplitude component from a reception signal, the modulation method which can be used is limited to a method (for example, ASK such as OOK), for modulating the amplitude, and adoption of a method for modulating the phase or the frequency is difficult. The difficulty in adoption of the phase modulation method is connected to a state wherein it may be impossible to orthogonalize a modulation signal to raise the data transmission rate.

Further, where multi-channeling is implemented by the frequency division multiplexing method, a method wherein the square detection circuit is used has a fault described below. While a band-pass filter for frequency selection on the receiver side has to be disposed at the preceding stage to the square detection circuit, implementation of a precipitous and small band-pass filter is not easy. Further, where a precipitous band-pass filter is used, requested specifications become severe regarding the stability of the carrier frequency on the sender side.

As a coping method for such problems as described above, the frequency conversion section 125 and the demodulation section 126 should adopt an injection locking method. Where the injection locking method is adopted, also a reference carrier signal used as a reference to injection locking on the receiver side corresponding to a carrier signal used for modulation is signaled together with a signal modulated to the millimeter waveband from the sender side. While the reference carrier signal typically is a carrier signal itself used for modulation, it is not limited to this, and, for example, a signal, for example, a high-frequency signal, having a different frequency synchronized with the carrier signal used for modulation may be used.

A local oscillator is provided on the receiver side, and the transmitted reference carrier component is injection locked with the local oscillator and the transmitted millimeter wave modulation signal is demodulated using an output signal to restore a transmission object signal. For example, a reception signal is inputted to the local oscillator and synchronized with the reference carrier. The reference carrier and the reception signal are inputted to a mixing circuit to produce a multiplication signal. A high-frequency component of the multiplication signal is removed by a low-pass filter to obtain a baseband signal.

By utilizing the injection locking in such a manner as described above, while detailed description or logical description is omitted herein, an oscillator having a low Q value can be applied as the local oscillator on the receiver side and requested specifications can be moderated also regarding the stability of the reference carrier on the sender side. On the receiver side, by reproducing the signal synchronized with the carrier signal used for modulation on the sender side and carrying out frequency conversion by synchronization detection, even if a frequency variation $\Delta$ of the carrier signal appears, a transmission signal can be restored without an influence of the frequency variation $\Delta$. In an extreme case, a band-pass filter as a frequency selection filter does not have to be provided at the preceding stage to the frequency conversion circuit which is a down converter. Since the Q value can be set low, a tank circuit can be formed from a silicon semiconductor and the entire oscillation circuit including the tank circuit can be integrated to one chip. Further, by using the millimeter waveband, the tank circuit (particularly an inductance component) can be reduced in size. As a result, a reception function can be implemented easily and simply also with a higher carrier frequency. Together with application of a millimeter wave, the overall circuit can be reduced in sizes and the time required for synchronization can be reduced. Consequently, the circuit becomes suitable for high-speed transmission.

[Connection and Operation: Reference Configuration]

With the reference configuration, different from a signal interface which utilizes electric wiring in the past, signal transmission is carried out in the millimeter waveband as described hereinabove so as to flexibly cope with high-speed and large-quantity transmission. For example, in the reference configuration, only those signals for which high-speed large-quantity transmission is required are made an object of communication in the millimeter waveband, and the communication apparatus 100 and 200 include, at part thereof, an interface (connection by terminals and connectors) by electric wires in the past for signals for low-speed and small-quantity transmission and for power supply.

The signal production unit 107 processes an input signal inputted thereto from the LSI function unit 104 to produce a signal of a millimeter wave. The signal production unit 107 is connected to the transmission line coupling section 108 by a transmission line such as, for example, a microstrip line, a strip line, a coplanar line or a slot line such that the generated signal of the millimeter wave is supplied to the millimeter wave signal transmission line 9 through the transmission line coupling section 108.

The transmission line coupling section 108 has an antenna structure and has a function of converting a signal of a millimeter wave transmitted thereto into an electromagnetic wave and signaling the electromagnetic wave. The transmission line coupling section 108 is coupled to the millimeter wave signal transmission line 9, and the electromagnetic wave obtained by the conversion by the transmission line coupling section 108 is supplied to one end of the millimeter wave signal transmission line 9. The transmission line coupling section 208 of the second communication apparatus 200X side is connected to the other end of the millimeter wave signal transmission line 9. Since the millimeter wave signal transmission line 9 is provided between the transmission line coupling section 108 of the first communication apparatus 100X side and the transmission line coupling section 208 of the second communication apparatus 200X side, the electromagnetic wave of the millimeter band is propagated along the millimeter wave signal transmission line 9.

The transmission line coupling section 208 of the second communication apparatus 200X side is coupled to the millimeter wave signal transmission line 9. The transmission line coupling section 208 receives an electromagnetic wave transmitted to the other end of the millimeter wave signal transmission line 9, converts the electromagnetic wave into a signal of a millimeter wave and supplies the signal of the millimeter wave to the signal production unit 207. The signal production unit 207 processes the signal of the millimeter wave obtained by the conversion by the transmission line coupling section 208 to produce an output signal and supplies the output signal to the LSI function unit 204.

While the foregoing description is directed to signal transmission from the first communication apparatus 100X to the second communication apparatus 200X, also where data read out from the LSI function unit 204 of the second communication apparatus 200X is transmitted to the first communication apparatus 100X, similar operations can be carried out. Consequently, a signal of a millimeter wave can be transmitted bidirectionally.

[Functional Configuration: Comparative Example]

Referring to FIG. 3, a signal transmission system 1Z of the comparative example is configured such that a first apparatus 100Z and a second apparatus 200Z are coupled to each other by an electric interface 9Z to carry out signal transmission. The first apparatus 100Z includes a semiconductor chip 103Z which can transmit a signal through an electric wire, and also the second apparatus 200Z includes a semiconductor chip 203Z which can transmit a signal through an electric wire. In the signal transmission system 1Z, the millimeter wave signal transmission line 9 in the reference configuration is replaced by the electric interface 9Z.

In order to achieve signal transmission through an electric wire, the first apparatus 100Z includes an electric signal conversion unit 107Z in place of the signal production unit 107 and the transmission line coupling section 108, and the second apparatus 200Z includes an electric signal conversion unit 207Z in place of the signal production unit 207 and the transmission line coupling section 208.

In the first apparatus 100Z, the LSI function unit 104 carries out electric signal transmission control of the electric signal conversion unit 107Z through the electric interface 9Z. Meanwhile, in the second apparatus 200Z, the electric signal conversion unit 207Z is accessed through the electric interface 9Z and acquires data transmitted thereto from the LSI function unit 104 side.

Here, the signal transmission system 1Z of the comparative example which adopts the electric interface 9Z has the following problems.

i) Although high speed transmission of a large quantity of transmission data is demanded, an electric wire has a limitation in the transmission speed and the transmission quantity.

ii) It seems a promising idea to increase, in order to cope with the problem of the high speed transmission of transmission data, the number of electric wires thereby to decrease the transmission speed per one signal line by parallel transmission of a signal. However, this countermeasure gives rise to increase of the number of input and output terminals. This requires complication of a printed board and a cable wiring scheme and increase of the physical size of the connector section and the electric interface 9Z. This gives rise to a problem that the connector sections and the electric interface 9Z are complicated in shape, resulting in deterioration of the reliability of the components and also in increase of the cost.

iii) As the bandwidth of a baseband signal increases together with drastic increase of the information amount of movie images and computer images, the problem of electromagnetic compatibility (EMC) becomes more tangible. For example, where an electric wire is used, the line acts as an antenna, and a signal corresponding to a tuning frequency of the antenna suffers from interference. Also reflection or resonance caused by mismatching of the impedance of a line makes a cause of unnecessary radiation. If resonance or reflection exists, then it is likely to give rise to radiation, and also the problem of electromagnetic interference (EMI) becomes serious. Since countermeasures are taken against such problems as described above, electromagnetic apparatus become complicated in configuration.

iv) In addition to EMC and EMI, if reflection occurs, then also a transmission error by interference between symbols and a transmission error by jumping in of disturbance on the receiver side become problems.

v) Where a terminal is exposed, this gives rise to a problem of static electricity breakdown.

In order to cope with the problems described, the wireless transmission system 1X of the reference configuration is configured such that the electric signal conversion units 107Z and 207Z of the comparative example are replaced by the signal production units 107 and 207 and the transmission line coupling sections 108 and 208 such that signal transmission is carried out not by an electric wire but using a millimeter wave. Data to be transmitted from the LSI function unit 104 to the LSI function unit 204 are converted into a millimeter wave signal, and the millimeter wave signal is transmitted through the millimeter wave signal transmission line 9 between the transmission line coupling sections 108 and 208.

Since wireless transmission is adopted, there is no necessity to pay attention to the shape of a line and the position of a connector, and therefore, restrictions to the layout do not occur very much. Since wires and terminals can be omitted for a signal whose transmission is replaced by signal transmission by a millimeter wave, and therefore, the problem of EMC or EMI is eliminated and also the problem of electrostatic breakdown is eliminated. Generally since any other function section which uses a frequency in the millimeter waveband does not exist in the communication apparatus 100 and 200, the countermeasure against EMC and EMI can be implemented readily.

Further, since the signal transmission by a millimeter wave is wireless transmission in a state wherein the first communication apparatus 100 and the second communication apparatus 200 are positioned in the neighborhood of each other or mounted mutually and wireless transmission between fixed positions or in a known positional relationship, the following advantages can be achieved.

1) It is easy to appropriately design the propagation channel (the waveguide structure) between the sender side and the receiver side.

2) Where a dielectric structure of transmission line coupling portions for sealing the sender side and the receiver side and the propagation channel (the waveguide structure of the millimeter wave signal transmission line 9) are designed together, good transmission of higher reliability than that of free space transmission can be anticipated.

3) Since also control of a controller for managing wireless transmission (in the example described, of the LSI function unit 104) does not have to be carried out frequently, dynamically and actively as in the case of general wireless communication, the overhead by control can be reduced in comparison with general wireless communication. As a result, reduction in size, reduction in power consumption and increase in speed can be anticipated.

4) If, upon fabrication or design, a wireless transmission environment is calibrated to grasp a dispersion and so forth of individual products, then communication of high quality can be anticipated if the data are referred to for the transmission.

5) Even if reflection exists, since this is fixed reflection, the influence of the reflection can be removed readily on the receiver side using a small equalizer. Also setting of the equalizer can be carried out by presetting or static control and can be implemented readily.

Further, use of millimeter wave communication can achieve the following advantages.

a) Since a wide communication bandwidth can be used in millimeter wave communication, a higher data rate can be used readily.

b) It is possible to separate a frequency to be used for transmission from frequencies for other baseband signal processing, and interference in frequency between a millimeter wave signal and baseband signals is less likely to occur and it is easy to implement space division multiplexing hereinafter described.

c) Since the millimeter waveband includes a short wavelength, an antenna or a waveguide structure which depend upon the wavelength can be formed in a reduced size. In addition, since the millimeter wave transmission exhibits great range attenuation and small diffraction, electromagnetic shielding can be carried out readily.

d) In ordinary wireless communication, severe restrictions are applied to the stability of a carrier in order to prevent interference. In order to implement a carrier having high stability, an external frequency reference part, a multiplication circuit, a phase-locked loop circuit (PLL) and so forth which have high stability are used, resulting in a large circuit scale. However, a millimeter wave can be masked and can be prevented from leaking to the outside readily (particularly where it is used together with signal transmission between fixed positions or in a known positional relationship), and a carrier having low stability can be used for transmission and increase in circuit scale can be suppressed. In order to use a small circuit on the receiver side to demodulate a signal transmitted with a carrier whose stability is moderated, an injection locking method is adopted preferably.

However, in order to transmit a plurality of systems of signals with a millimeter wave, the mechanism of the reference configuration applies one of time division multiplexing and frequency division multiplexing. The time division multiplexing has a drawback that simultaneous communication for transmission and reception cannot be carried out while the frequency division multiplexing has another drawback that the transmission bandwidth has to be increased as described hereinabove. Therefore, in the embodiment of the present invention described below, a novel mechanism which eliminates the problems of the time division multiplexing and the frequency division multiplexing and can transmit a plurality of systems of signals using a millimeter wave. Hereinafter, detailed description is provided.

<Wireless Transmission System: Embodiment>

Figure 6:
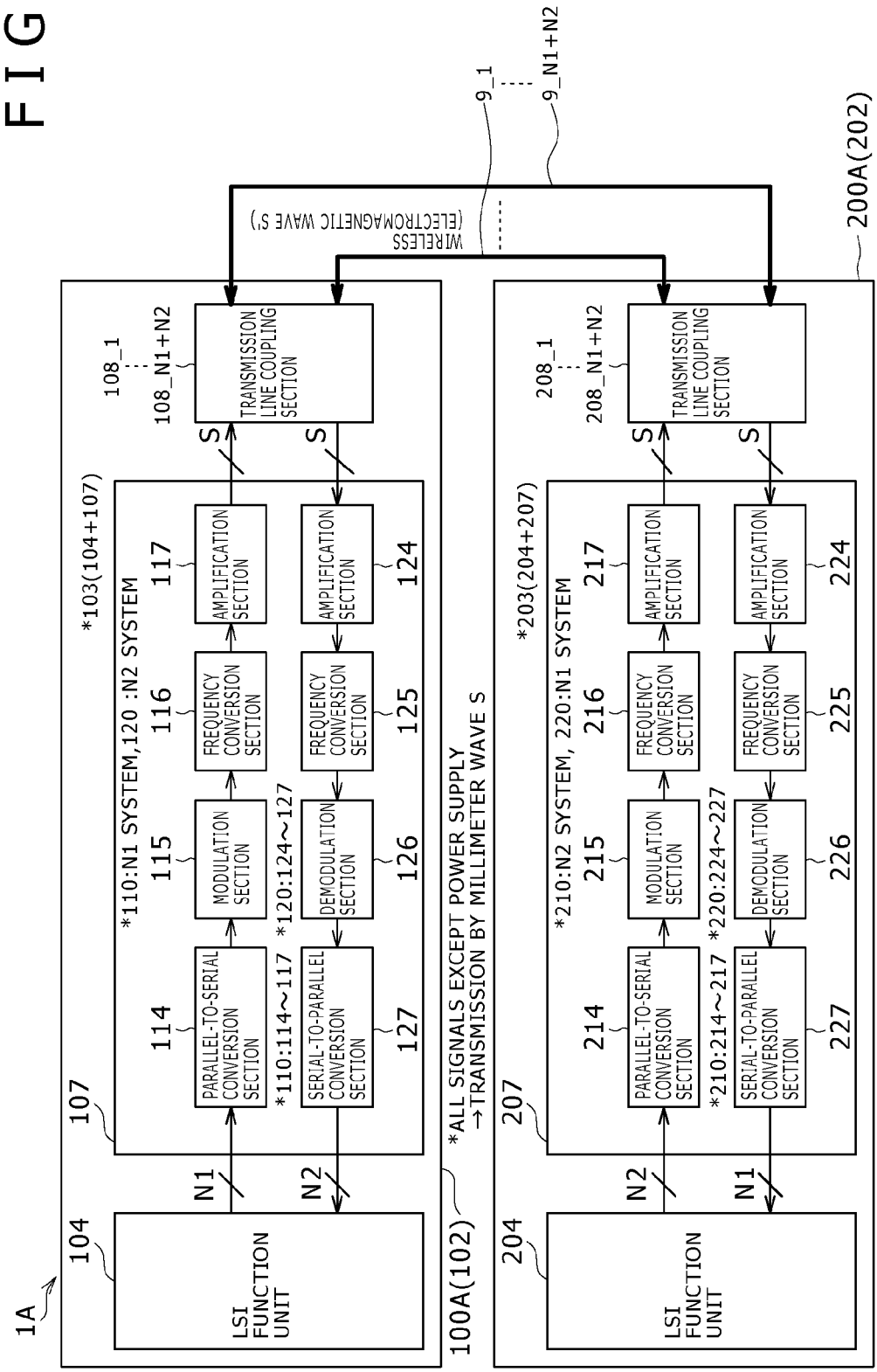
FIG. 6 is a block diagram showing a functional configuration of a signal interface of a wireless transmission system to which the present invention is applied.

FIGS. 4A to 6 show a signal interface in a radio transmission system of the present embodiment. In particular, FIGS. 4A to 4F illustrate outlines (image figures) of the "space division multiplexing" adopted in the present embodiment. FIGS. 5A to 5C illustrate an appropriate condition (application condition) of the "space division multiplexing." FIG. 6 shows a functional configuration of a signal interface of the wireless transmission system of the present embodiment.

Referring to FIGS. 4A to 6, the wireless transmission system 1A of the present embodiment is characterized in that a plurality of pairs of transmission line coupling sections 108 and 208 independent of each other are used and hence a plurality of systems of millimeter wave signal transmission lines 9 are provided. The millimeter wave signal transmission lines 9 are disposed so as not to spatially interfere with each other (so as to be free from an influence of interference) and can carry out communication using the same frequency at the same time in signal transmission of the plural systems. That a plurality of systems of signals do "not spatially interfere" signifies that a plurality of systems of signals can be transmitted independently of each other.

In the following description of the embodiment, such a mechanism as just described is referred to as "space division multiplexing." When it is intended to use multiple channels for transmission, where the space division multiplexing is not applied, it seems a promising idea to apply, for example, frequency division multiplexing to use different carrier frequency for each channel. However, where the space division multiplexing is applied, even if the same carrier frequency is used, signal transmission can be carried out without being influenced by interference.

Figure 4A:
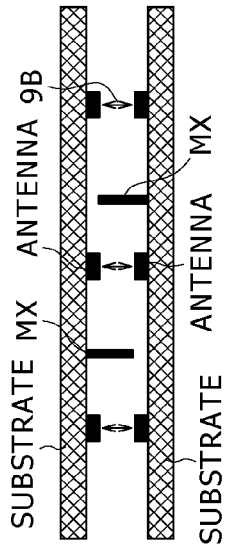
FIGS. 4A to 4F are schematic views illustrating an outline of "space division multiplexing"

In short, the "space division multiplexing" may be division multiplexing where a plurality of systems of millimeter wave signal transmission lines 9 independent of each other are formed in a three-dimensional space in which a millimeter wave signal (electromagnetic wave) can be transmitted, but is not limited to the configuration wherein a plurality of system of free space transmission lines 9B are formed in a free space while keeping a distance therebetween over which interference does not occur (refer to FIG. 4A).

Figure 4B:
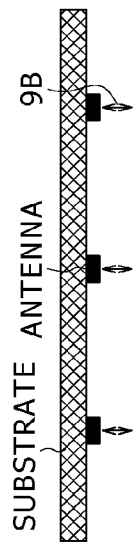

For example, where a plurality of systems of free space transmission lines 9B are provided in a free space as shown in FIG. 4B, in order to suppress interference between transmission channels, a structure for disturbing radio wave propagation (millimeter wave blocking member MX) may be disposed between the transmission channels. It does not matter whether the millimeter wave blocking member MX is a dielectric.

Figure 4C:
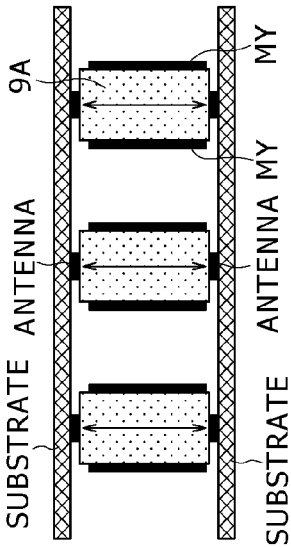
Figure 4D:
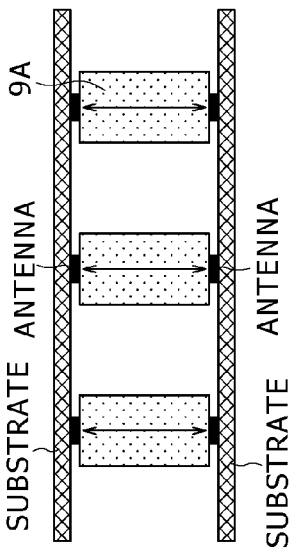

Each of the plural systems of millimeter wave signal transmission lines 9 is not limited to a free space but may have a form of a millimeter wave confinement structure. For the millimeter wave confinement structure, for example, a dielectric transmission line 9A configured including a dielectric material as shown in FIG. 4C can be adopted. Where the dielectric transmission lines 9A are formed in a millimeter wave confinement structure, blocking member (millimeter wave blocking member MY) of a conductor such as a metal member for suppressing external radiation of a millimeter wave signal may be provided on an outer periphery of each dielectric transmission line 9A as shown in FIG. 4D so that external radiation of a millimeter wave is suppressed. The millimeter wave blocking member MY is preferably set to a fixed potential on the board (for example, the ground potential).

Figure 4E:
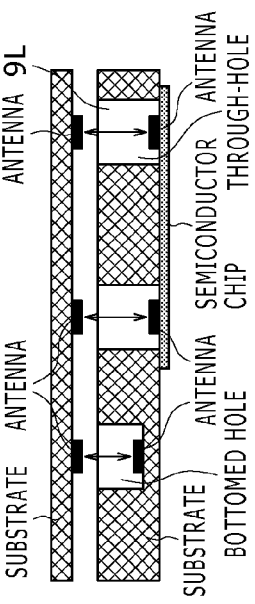
Figure 4F:
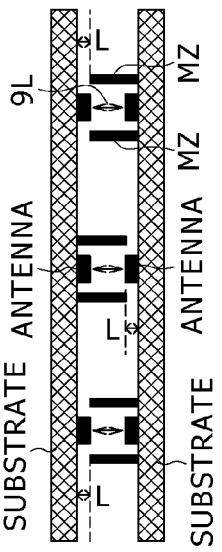

As another example of the millimeter wave confinement structure, a hollow waveguide 9L which is surrounded at a circumference thereof by a blocking member and is hollow in the inside thereof may be used. For example, as shown in FIG. 4E, the hollow waveguide 9L is structured such that it is surrounded at a circumference thereof by a conductor MZ which is an example of a blocking member and it is hollow in the inside thereof. The envelope of the conductor MZ may be provided on any one of two boards disposed in an opposing relationship to each other. The distance L between the envelope by the conductor MZ and the opposing board (the length of a gap from an end of the conductor MZ to the opposing board) is set to a sufficiently low value in comparison with the wavelength of the millimeter wave. According to contrast between FIGS. 4B and 4E, although the hollow waveguide 9L has a structure similar to a structure where the millimeter wave blocking member MX is disposed in the free space transmission line 9B, it is different in that the conductor MZ which is an example of the millimeter wave blocking member is provided in such a manner as to surround an antenna. Since the conductor MZ is hollow, there is no necessity to use a dielectric material, and consequently, the millimeter wave signal transmission lines 9 can be configured readily and easily at a low cost. The conductor MZ is preferably set to a fixed potential on the board (for example, to the ground potential).

The hollow waveguide 9L may be formed not by formation of an envelope by the conductor MZ on the board but by formation of a hole, (which may be a through-hole or a bottomed hole), formed on a rather thick board so as to utilize the wall face of the hole as an envelope. The hole may have an arbitrary cross sectional shape such as a circular shape, a triangular shape or a quadrangular shape. In this instance, the board functions as a blocking member. The hole may be provided on either one or on both ones of two boards disposed in an opposing relationship to each other. The side wall of the hole may be covered or may not be covered with a conductor. Where the hole is formed as a through-hole, an antenna should be disposed on (attached to) the rear face of a semiconductor chip. Where the hole is not formed as a through-hole but stopped in the way (formed as a blind hole), an antenna should be provided on the bottom of the hole.

Since a millimeter wave is confined in the dielectric transmission line 9A or the hollow waveguide 9L by the envelope, the dielectric transmission line 9A and the hollow waveguide 9L achieve such advantages that the transmission loss of the millimeter wave is little and efficient transmission can be achieved, that external radiation of the millimeter wave is suppressed and that an EMC countermeasure is facilitated.

As a further example of the millimeter wave confinement structure, where the three-dimensional space which can transmit a millimeter wave signal (in the form of an electromagnetic wave) is formed from a dielectric material (tangible entity), a plurality of systems of millimeter wave signal transmission lines 9 (particularly dielectric transmission lines 9A: in this paragraph, this is used hereinafter) independent of each other may be formed in the dielectric material. For example, a printed board itself on which electronic circuit parts are mounted is formed from a dielectric material and is utilized as a dielectric transmission line 9A. In this instance, a plurality of dielectric transmission lines 9A independent of each other may be formed in the board.

FIGS. 5A to 5C illustrate a way of thinking of an appropriate condition of the "space division multiplexing." As seen in FIG. 5A, the propagation loss L of a free space can be represented, where the distance is represented by d and the wavelength by $\lambda$, as "L [dB]=$10 \log_{10}((4\pi d/\lambda)^2)$ . . . (A)."

Two kinds of communication of space division multiplexing are assumed as seen in FIGS. 5A to 5C. In FIGS. 5A to 5C, a transmitter is represented by "TX" and a receiver is represented by "RX." A reference character "_100" indicates the first communication apparatus 100 side and another reference character "_200" indicates the second communication apparatus 200 side. In FIG. 5B, the first communication apparatus 100 includes two systems of transmitters TX_100_1 and TX_100_2, and the second communication apparatus 200 includes two systems of receivers RX_200_1 and RX_200_2. In particular, signal transmission from the first communication apparatus 100 side to the second communication apparatus 200 side is carried out between the transmitter TX_100_1 and the receiver RX_200_1 and between the transmitter TX_100_2 and the receiver RX_200_2. In short, signal transmission from the first communication apparatus 100 side to the second communication apparatus 200 side is carried out in two systems.

On the other hand, in FIG. 5C, the first communication apparatus 100 includes a transmitter TX_100 and a receiver RX_100 while the second communication apparatus 200 includes a transmitter TX_200 and a receiver RX_200. In particular, signal transmission from the first communication apparatus 100 side to the second communication apparatus 200 side is carried out between the transmitter TX_100 and the receiver RX_200, and signal transmission from the second communication apparatus 200 side to the first communication apparatus 100 side is carried out between the transmitter TX_200 and the receiver RX_100. In short, different communication channels are used for transmission and for reception, and in other words, full duplex communication (Full Duplex) wherein transmission (TX) and reception (RX) of data can be carried out simultaneously from the opposite parties is achieved.

Here, the relationship between an antenna distance $d_1$ and a spatial channel distance $d_2$ (particularly a distance between the free space transmission lines 9B), necessary to obtain a necessary ratio DU [dB] (a ratio between a desired wave and unnecessary wave) is given, from the expression (A), as "$d_2/d_1 = 10^{(DU/20)}$ . . . (B)."

For example, where DU=20 dB, $d_2/d_1=10$, and the required spatial channel distance $d_2$ is equal to ten times the antenna distance $d_1$. Since an antenna usually has some directivity, even with the free space transmission lines 9B, the spatial channel distance $d_2$ can be set shorter. In other words, in application of space division multiplexing, use of an antenna which exhibits high directivity in a transmission direction but exhibits low directivity in the other directions (typically in a perpendicular direction) is effective means to reduce the channel distance. In this figure, attention is paid to two-dimensional directivity. However, application of the space division multiplexing is not limited to a two-dimensional space, but it can be applied also to a three-dimensional space. In the latter case, the channel distance relies upon the three-dimensional directivity.

For example, if the distance of the antennas to the antennas of the opposite party of communication is short, then the transmission power of the antennas can be suppressed low. If the transmission power is sufficiently low and the antenna pairs can be disposed at positions spaced sufficiently from each other, then even if the millimeter wave blocking member MX is not provided between the channels, the interference between the antenna pairs can be suppressed sufficiently low. Particularly in millimeter wave communication, since the millimeter wave has a short wavelength, even if the distance attenuation is great and the diffraction is little, space division multiplexing can be implemented readily. For example, even in the free space transmission lines 9B, the spatial channel distance (a space distance between the free space transmission lines 9B) $d_2$ can be set smaller than ten times the antenna distance $d_1$ without the millimeter wave blocking member MX.

In the case of a dielectric transmission line or a hollow waveguide having a millimeter wave confinement structure, since a millimeter wave can be contained in the inside of and transmitted along the transmission line, the spatial channel distance (a distance between the free space transmission lines) $d_2$ can be set smaller than 10 times the antenna distance $d_1$. Particularly in contrast with the free space transmission lines 9B, the channel distance can be reduced further.

As shown in FIG. 6, the wireless transmission system 1A of the present embodiment to which the "space division multiplexing" is applied includes "N1+N2" systems of transmission line coupling sections 108 and 208 each of which includes millimeter wave transmission terminals, millimeter wave transmission wires, antenna and so forth, and "N1+N2" systems of millimeter wave signal transmission lines 9. Each of the elements mentioned has a reference character "_@" added thereto (where @ ranges from 1 to N1+N2). By the configuration just described, a full duplex transmission system wherein millimeter wave transmission for transmission and reception is carried out independently while individual channels use the same frequency.

In FIG. 6, the first communication apparatus 100A is shown with the multiplexing processing section 113 and the unification processing section 128 removed and the second communication apparatus 200A is shown with the multiplexing processing section 213 and the unification processing section 228 removed. In the example shown, all signals are determined as an object of transmission by a millimeter wave except the power supply. It is to be noted that, although the circuit configuration shown in FIG. 6 resembles that for frequency division multiplexing described hereinabove with reference to FIG. 2B, it is different in that a number of such sender side signal production sections 110 and receiver side signal production sections 220 as described above corresponding to the N1 systems are provided and a number of such sender side signal production sections 210 and receiver side signal production section 120 as described above corresponding to the N2 systems are provided.

While a basic configuration is described herein, this is a mere example, and the form of accommodation of the sender side signal production sections 110, receiver side signal production sections 120 and the sender side signal production sections 210 and receiver side signal production sections 220 in the semiconductor chips 103 and 203, respectively, is not limited to that shown in the figure. For example, the system may be configured using a semiconductor chip 103 which includes only one system of the signal production unit 107 which includes the sender side signal production section 110 and the receiver side signal production section 120 and another semiconductor chip 203 which includes only one system of the signal production unit 207 which includes one system of the sender side signal production section 210 and the receiver side signal production section 220. Or, the sender side signal production section 110 and receiver side signal production section 120 and the sender side signal production section 210 and receiver side signal production section 220 are accommodated in the different semiconductor chips 103 and 203 to configure the system. Depending upon a modification to them, the system may be configured wherein N1=N2=N.

Further, as regard in what manner the function sections to be accommodated in the semiconductor chips 103 and 203 are configured, they do not have to be provided in pair between the first communication apparatus 100A side and the second communication apparatus 200A side, but an arbitrary combination may be used. For example, the first communication apparatus 100A side may have a form wherein the components of the N1 systems on the sender side and the components of the N2 systems on the receiver side are accommodated in one chip while the second communication apparatus 200A side has another form wherein the sender side signal production sections 210 and the receiver side signal production sections 220 are accommodated in separate semiconductor chips 203.

Basically, the carrier frequency in the different systems may be same or may be different. For example, in the case of the dielectric transmission lines 9A or hollow waveguides, since a millimeter wave is confined in the inside, millimeter wave interference can be prevented, and therefore, there is no problem even if the same frequency is used. In the case of the free space transmission lines 9B, if the free space transmission lines are spaced by a certain distance from each other, then the same frequency can be used without any problem. However, where the free space transmission lines are disposed at a short distance, it is better to use different frequencies. However, it is considered that, where the same frequency is not used, not the space division multiplexing but the frequency division multiplexing is applied.

In the space division multiplexing, the same frequency band can be used at the same time for signal transmission of a plurality of systems. Therefore, a form wherein a plurality of channels are used at the same time to increase the communication speed can be taken, and also simultaneity of bidirectional communication wherein signal transmission for N1 channels from the first communication apparatus 100A to the second communication apparatus 200A and signal transmission for N2 channels from the second communication apparatus 200A to the first communication apparatus 100A are carried out simultaneously can be achieved. Particularly, a millimeter wave is short in wavelength, and an attenuation effect depending upon the distance can be anticipated. Thus, interference is less likely to occur even with a small offset (even if the spatial distance between the transmission channels is small), and it is easy to implement a transmission channel which differs depending upon the place.

For example, in order to implement bidirectional communication, a system which uses time division multiplexing, frequency division multiplexing and so forth can be applied as described hereinabove in connection with the reference configuration in addition to the space division multiplexing.

In the reference configuration, as a method which implements data transmission and reception using one system of the millimeter wave signal transmission line 9, a half-duplex method wherein changeover between transmission and reception is carried out by time division multiplexing and a full duplex method wherein transmission and reception are carried out simultaneously by frequency division multiplexing.

It is to be noted, however, that the time division multiplexing has the problem that transmission and reception cannot be carried out in parallel. Meanwhile, the frequency division multiplexing has the problem that the bandwidth of the millimeter wave signal transmission lines 9 has to be increased as described hereinabove with reference to FIGS. 2A to 2C.

In contrast, in the wireless transmission system 1A of the present embodiment, the same carrier frequency can be set to a plurality of signal transmission systems (a plurality of channels), and re-utilization of a carrier frequency (use of the same frequencies by a plurality of channels) is facilitated. Even if the bandwidth of the millimeter wave signal transmission lines 9 is not increased, simultaneous transmission and reception of signals can be implemented. Further, if a plurality of transmission channels are used for the same direction and the same frequency band is used at the same time, then increase of the communication speed can be achieved.

Where N millimeter wave signal transmission lines 9 are used for N (N=N1=N2) baseband signals, in order to carry out bidirectional transmission and reception, time division multiplexing or frequency division multiplexing may be applied with regard to transmission and reception. Further, if 2N systems of millimeter wave signal transmission lines 9 are used, then it is possible to carry out also transmission wherein different systems of millimeter wave signal transmission lines 9 are used for bidirectional transmission and reception (all independent transmission wires are used). In particular, where N signals are available as an object of communication in the millimeter waveband, even if such a multiplexing process as time division multiplexing, frequency division multiplexing or code division multiplexing is not carried out, it is possible to transmit the N signals using different ones of the 2N systems of millimeter wave signal transmission lines 9.

In the following, particular examples of a structure to which the "space division multiplexing" is applied are described.

<Space Division Millimeter Wave Transmission Structure: First Example>

FIGS. 7A to 7C show a first example of the space division millimeter wave transmission structure of the second communication apparatus 200A and the first communication apparatus 100A (hereinafter referred to as "in the present embodiment"). The first example is an application example of the space division millimeter wave transmission structure which implements the functional configuration of the wireless transmission system 1A in the first embodiment. Particularly, the first example is an application example to a system configuration wherein the second communication apparatus 200A is a memory card 201A_1 and the first communication apparatus 100A is an electronic apparatus 101A_1 having a reading function for the memory card 201A_1.

A slot structure 4A_1 which is a loading structure is provided to carry out loading and unloading of the memory card 201A_1 into and from the electronic apparatus 101A_1, and has functions of a connection section for the millimeter wave signal transmission lines 9 and a fixation section for the electronic apparatus 101A_1 and the memory card 201A_1. The slot structure 4A_1 and the memory card 201A_1 have a structure of a concave and convex shape as a position defining section for defining a loaded state of the memory card 201A_1 by a fitting structure.

In the wireless transmission system 1A of the first embodiment, since a plurality of pairs of transmission line coupling sections 108 and 208 are used to provide a plurality of systems of millimeter wave signal transmission lines 9, also the space division millimeter wave transmission structure has a countermeasure ready for the plural systems of millimeter wave signal transmission lines 9. Here, as an example, the number of systems is two.

The slot structure 4A_1 and the memory card 201A_1 have a plurality of systems each including a millimeter wave signal transmission line 9 (dielectric transmission line 9A), a millimeter wave transmission/reception terminal 132 or 232, a millimeter wave transmission line 134 or 234 and an antenna 136 or 236. In the slot structure 4A_1 and the memory card 201A_1, antennas 136 and 236 are disposed on the same board face and juxtaposed horizontally. By the configuration, a full-duplex transmission system wherein millimeter wave transmission in transmission and reception is carried out independently is implemented.

For example, an example of the structure of the electronic apparatus 101A_1 is shown as a horizontal through-view and a cross sectional through-view in FIG. 7B. On the semiconductor chip 103, millimeter wave transmission/reception terminals 132_1 and 132_2 for coupling to millimeter wave signal transmission lines 9_1 and 9_2 (dielectric transmission lines 9A_1 and 9A_2) are provided at positions spaced from each other. On one of the faces of a board 102, millimeter wave transmission lines 134_1 and 134_2 and antennas 136_1 and 136_2 connected to the millimeter wave transmission/reception terminals 132_1 and 132_2, respectively, are formed. The millimeter wave transmission/reception terminal 132_1, millimeter wave transmission line 134_1 and antenna 136_1 configure a transmission line coupling section 108_1, and the millimeter wave transmission/reception terminal 132_2, millimeter wave transmission line 134_2 and antenna 136_2 configure a transmission line coupling section 108_2.

Further, on a housing 190, two systems of cylindrical dielectric waveguide pipes 142_1 and 142_2 as a convex shape configuration 198A_1 are disposed in parallel to each other corresponding to the arrangement of the antennas 136_1 and 136_2. The two systems of the dielectric waveguide pipes 142_1 and 142_2 are formed cylindrically in a unitary conductor 144 and configure the dielectric transmission lines 9A_1 and 9A_2, respectively. The conductor 144 prevents millimeter wave interference between the two systems of the dielectric transmission lines 9A_1 and 9A_2. The conductor 144 has a function also as a millimeter wave blocking member for suppressing external radiation of a millimeter wave transmitted in the dielectric waveguide pipes 142.

A receiving side connector 180 is provided at a contacting position of the slot structure 4A_1 with a terminal of the memory card 201A_1. Signals whose transmission is changed to millimeter wave transmission do not require connector terminals (connector pins).

In the present example which implements the functional configuration of the wireless transmission system 1A of the first embodiment, only connector terminals for the power supply (and a corresponding reference potential: the ground potential) have to be prepared.

It is to be noted that, on the electronic apparatus 101A_1 side (the slot structure 4A_1), connector terminals also for signals whose transmission is changed to millimeter wave transmission may be provided. In this instance, where the memory card 201A_1 inserted in the slot structure 4A_1 is of a related-art type to which the millimeter wave transmission structure of the first example is not applied, signal transmission can be carried out through electric wires as in the related art.

An example of the structure of the memory card 201A_1 (as a plan through-view and a cross sectional through-view) is shown in FIG. 7A. On a semiconductor chip 203 on a board 202, millimeter wave transmission/reception terminals 232_1 and 232_2 for coupling to a plurality of (two in FIG. 7A) systems of the millimeter wave signal transmission lines 9_1 and 9_2 (dielectric transmission lines 9A_1 and 9A_2) are provided at positions spaced from each other. On one of faces of the board 202, millimeter wave transmission lines 234_1 and 234_2 and antennas 236_1 and 236_2 connected to the millimeter wave transmission/reception terminals 232_1 and 232_2, respectively, are formed. The millimeter wave transmission/reception terminal 232_1, millimeter wave transmission line 234_1 and antenna 236_1 configure a transmission line coupling section 208_1, and the millimeter wave transmission/reception terminal 232_2, millimeter wave transmission line 234_2 and antenna 236_2 configure another transmission line coupling section 208_2.

In the memory card 201A_1, a concave shape configuration 298A_1 corresponding to a sectional shape of the convex shape configuration 198A_1 (conductor 144) on the electronic apparatus 101A_1 side is formed on a housing 290. The concave shape configuration 298A_1 is used to fix the memory card 201A_1 to the slot structure 4A_1 and position the memory card 201A_1 with respect to the dielectric transmission lines 9A_1 and 9A_2 provided on the slot structure 4A_1 for coupling for millimeter wavelength transmission.

While both of the millimeter wave signal transmission lines 9_1 and 9_2 here are formed as the dielectric transmission line 9A, for example, one of the millimeter wave signal transmission lines 9_1 and 9_2 may be formed as a free space transmission line or a hollow waveguide or both of them may be formed as free space transmission lines or hollow waveguides.

In the electronic apparatus 101A_1, the transmission line coupling section 108 (particularly, the antenna coupling section) is disposed at a portion of the convex shape configurations 198A_1 and 198A_2, and in the memory card 201A_1, the transmission line coupling section 208, particularly the antenna coupling section, is disposed at a portion of the concave shape configurations 298A_1 and 298A_2. In particular, the memory card 201A_1 is disposed on the electronic apparatus 101A_1 such that, when the concave and convex portions are fitted with each other, the transmission line coupling sections 108 and 208 exhibit a high millimeter wave transmission characteristic.

By such a configuration as described above, when the memory card 201A_1 is loaded into the slot structure 4A_1, fixation and positioning of the memory card 201A_1 for millimeter wave signal transmission can be carried out simultaneously. While, in the memory card 201A_1, the housing 290 is sandwiched between the dielectric transmission lines 9A_1 and 9A_2 and the antennas 236_1 and 236_2, since the material of the concave shape configurations 298A_1 and 298A_2 is a dielectric, no significant influence is had on transmission of a millimeter wave.

In this manner, the millimeter wave transmission structure of the first example adopts a configuration wherein the dielectric transmission line 9A including the dielectric waveguide pipes 142 is interposed between the transmission line coupling sections 108 and 208 (particularly between the antennas 136 and 236). By confining a millimeter wave signal in the dielectric transmission line 9A, improvement in efficiency of high speed signal transmission can be anticipated.

As a way of thinking, also it is possible to form the millimeter wave signal transmission line 9 (dielectric transmission line 9A) such that the antenna 136 and the antenna 236 are opposed to each other at a location other than the location of the fitting structure of the slot structure 4A_1 for card loading (between the convex shape configuration 198 and the concave shape structure 298). However, in this instance, an influence of the positional displacement is had. Against this, an influence of positional displacement can be eliminated with certainty by providing the millimeter wave signal transmission line 9 in the fitting structure of the slot structure 4A_1 for card loading.

Further, with the millimeter wave transmission structure of the first example, since the wireless transmission system 1A of the first embodiment can be implemented, the same frequency band can be used at the same time by space division multiplexing. Therefore, the communication speed can be increased and the simultaneity of bidirectional communication wherein signal transmission is carried out simultaneously can be assured. By configuring a plurality of systems of millimeter wave signal transmission lines 9_1 and 9_2 (dielectric transmission lines 9A_1 and 9A_2), full-duplex transmission can be achieved and improvement in efficiency in data transmission and reception can be anticipated.

Further, while, in the example described above, a plurality of systems are used for signal transmission, also it is possible, as a modification, to use one system from among the plural systems of millimeter wave signal transmission lines 9 for power transmission and use the remaining systems for signal transmission such as high-speed large-quantity signal transmission and low-speed small-quantity signal transmission. In this instance, since the same frequency band can be used at the same time, power transmission and signal transmission can be carried out in parallel in the same frequency band. The simultaneity of the power transmission and the signal transmission can be assured without giving rise to a drop of the communication quantity or the speed of signal transmission.

Further, three or more systems may be provided such that one of them is used for power transmission while the remaining plural systems are used for signal transmission. (Where four or more systems are used, plural ones of them may be used for power transmission.) In this instance, since the same frequency band can be used at the same time for signal transmission, the communication speed can be raised, and the simultaneity of bidirectional communication wherein signal transmission is carried out at the same time can be assured. Further, full-duplex transmission becomes possible and improvement in efficiency of data transmission and reception can be anticipated. Further, if three or more systems are used such that one of them is used for signal transmission while the remaining plural systems are used for power transmission, then also it is possible to cope with a case wherein the power consumption on the memory card 201A_1 is high.

<Space Division Millimeter Wave Transmission Structure: Second Example>

Figure 8A:
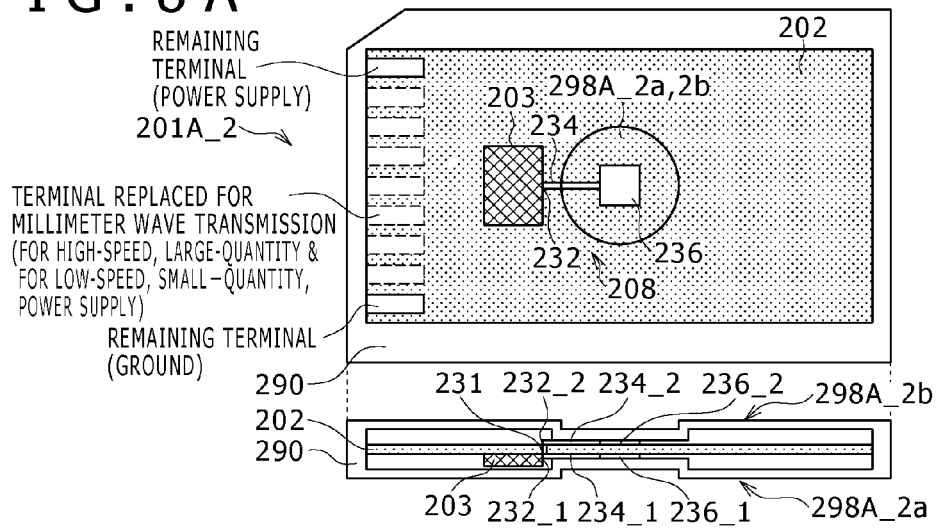
FIGS. 8A to 8C are schematic views of second example of a space division millimeter wave transmission structure of the signal interface of FIG. 6, respectively.
Figure 8B:
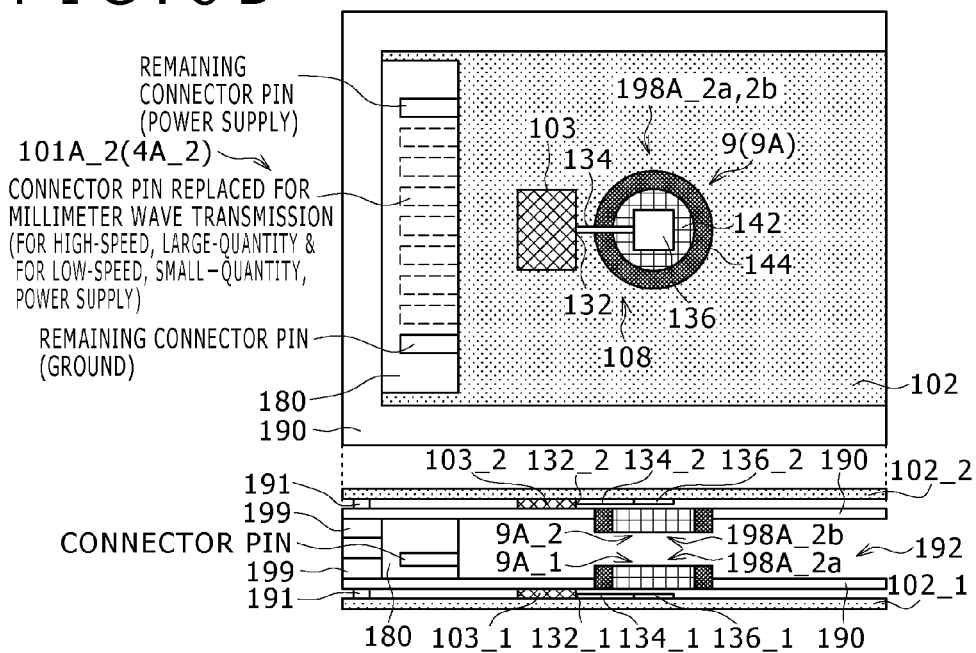
Figure 8C:
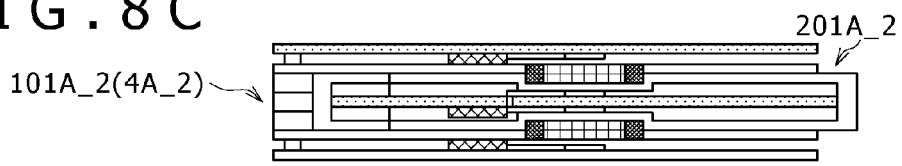

FIGS. 8A to 8C show a second example of the space division millimeter wave transmission structure of the present embodiment. The second example is an application of the millimeter wave transmission structure which implements the functional configuration of the wireless transmission system 1A of the embodiment similarly to the first example.

The second example is different from the first example in that an antenna 236 of a memory card 201A_2 is disposed in an opposing relationship to each of faces of the board 202 and, corresponding to this, a slot structure 4A_2 is configured such that an antenna 136 is disposed on each of substrates 102 provided on the inner faces on the opposite sides of an opening 192. Also the second example implements a full-duplex transmission system wherein millimeter wave transmission for transmission and reception is carried out independently.

For example, an example of the structure of the memory card 201A_1 (as a horizontal through-view and a cross sectional through-view) is shown in FIG. 8A. On the semiconductor chip 203, millimeter wave transmission/reception terminals 232_1 and 232_2 for coupling to the millimeter wave signal transmission lines 9_1 and 9_2 (the dielectric transmission lines 9A_1 and 9A_2) are provided in a substantially opposing relationship on the opposite faces of the board 202. Although it is difficult to recognize through the plan through-view, the semiconductor chip 203 and the millimeter wave transmission/reception terminal 232_2 are connected to each other by a through-hole pattern 231 in the form of a contact hole (via hole) as can be recognized from the sectional through-view.

On one of the faces of the board 202 (on which the semiconductor chips 203 are disposed), a millimeter wave transmission line 234_1 and an antenna 236_1 connected to the millimeter wave transmission/reception terminal 232_1 are formed. On the other face of the board 202, the millimeter wave transmission line 234_2 and the antenna 236_2 connected to the millimeter wave transmission/reception terminal 232_2 are formed. Although it is difficult to recognize through the plan through-view, as can be recognized from the sectional through-view, also the millimeter wave transmission lines 234_1 and 234_2 and the antennas 236_1 and 236_2 are disposed at positions on the front and rear faces of the board 202 which substantially oppose to each other.

Where the board 202 is made of, for example, glass or epoxy resin, also it is imagined that the board is a dielectric and has a property that it transmits a millimeter wave therethrough and therefore interference occurs between millimeter waves on the front and rear faces. In such an instance, such a countermeasure as, for example, to dispose a grounding layer on the inner layers corresponding to the millimeter wave transmission lines 234_1 and 234_2 and the antennas 236_1 and 263_2 of the board 202 should be taken to prevent millimeter wave interference on the front and rear faces. In short, the fitting structure is provided with a structure for strengthening isolation between the antenna elements.

The millimeter wave transmission/reception terminal 232_1, millimeter wave transmission line 234_1 and antenna 236_1 configure a transmission line coupling section 208_1, and the millimeter wave transmission/reception terminal 232_2, millimeter wave transmission line 234_2 and antenna 236_2 configure a transmission line coupling section 208_2.

A concave shape configuration 298A_2a is formed at a position on the face of the housing 290 corresponding to the antenna 136_1, and a concave shape configuration 298A_2b is formed at a position on the face of the housing 290 corresponding to the antenna 136_2. In short, the concave shape configurations 298A_2a and 298A_2b are formed at positions on the front and rear faces of the housing 290 which correspond to the antennas 236_1 and 236_2, respectively.

An example of the structure of an electronic apparatus 101A_2 (as a plan through-view and a cross sectional through-view) is shown in FIG. 8B. In the second example, boards 102_1 and 102_2 are attached to the opposite side faces of the housing 190 on the opposite side (outside) to the opening 192 by support members 191 such that millimeter waves emitted separately from the front and rear faces of the memory card 201A_2 can be received by the boards 102_1 and 102_2.

The board 102_1 has a semiconductor chip 103_1 on one of the opposite faces thereof (adjacent the opening 192). The millimeter wave transmission/reception terminal 132_1 for coupling to the dielectric transmission line 9A_1 is provided on the semiconductor chip 103_1. The millimeter wave transmission line 134_1 and The antenna 136_1 connected to the millimeter wave transmission/reception terminal 132_1 are formed on one of the faces of the board 102_1. The millimeter wave transmission/reception terminal 132_1, millimeter wave transmission line 134_1 and antenna 136_1 configure the transmission line coupling section 108_1.

The board 102_2 has a semiconductor chip 103_2 on one of the opposite faces thereof (adjacent the opening 192). The millimeter wave transmission/reception terminal 132_2 for coupling to the dielectric transmission line 9A_2 is provided on the semiconductor chip 103_2. The millimeter wave transmission line 134_2 and the antenna 136_2 connected to the millimeter wave transmission/reception terminal 132_2 are formed on one of the faces of the board 102_2. The millimeter wave transmission/reception terminal 132_2, millimeter wave transmission line 134_2 and antenna 136_2 configure the transmission line coupling section 108_2.

Further, a convex shape configuration 198A_2a is formed at a portion of the housing 190 corresponding to the arrangement position of the antenna 136_1 such that it configures the dielectric transmission line 9A_1, and a convex shape configuration 198A_2b is formed at a portion of the housing 190 corresponding to the arrangement position of the antenna 136_2 such that it configures the dielectric transmission line 9A_2. The convex shape configurations 198A_2a and 198A_2b (the dielectric transmission lines 9A_1 and 9A_2) are configured by forming the dielectric waveguide pipes 142_1 and 142_2 in tubular conductors 144_1 and 144_2, respectively, and are disposed fixedly such that the centers of the dielectric waveguide pipes 142_1 and 142_2 coincide with those of the antennas 136_1 and 136_2 of the transmission line coupling portions 108_1 and 108_2.

The concave shape configuration 298A_2a of the memory card 201A_2 is configured in a complementary shape with a cross sectional shape of the convex shape configuration 198A_2a (the conductor 144_1) of the electronic apparatus 101A_2 side. The concave shape configuration 298A_2a positions the dielectric transmission line 9A_1 of the slot structure 4A_2 for coupling for millimeter wave transmission when the memory card 201A_2 is to be fixed to the slot structure 4A_2.

The concave shape configuration 298A_2b of the memory card 201A_2 is configured in a complementary shape with a cross sectional shape of the convex shape configuration 198A_2b (the conductor 1442) of the electronic apparatus 101A_2 side. The concave shape configuration 298A_2b positions the dielectric transmission line 9A_2 of the slot structure 4A_2 for coupling for millimeter wave transmission when the memory card 201A_2 is to be fixed to the slot structure 4A_2.

Although both of the millimeter wave signal transmission lines 9_1 and 9_2 here are formed as the dielectric transmission lines 9A, one of the millimeter wave signal transmission lines 9_1 and 9_2 may be formed as a free space transmission line or a hollow waveguide or both of them may be formed as free space transmission lines or hollow waveguides.

Since, also in the millimeter wave transmission structure of the second example, the wireless transmission system 1A of the first embodiment can be implemented, the same frequency band can be used at the same time by space division multiplexing, and consequently, the communication speed can be increased and the simultaneity of bidirectional communication wherein signal transmission is carried out at the same time can be assured. Full-duplex bidirectional transmission and so forth become possible and improvement in efficiency of the data transmission and reception can be achieved by configuring a plurality of systems of dielectric transmission lines 9A. The second example is effective where a space for disposing a plurality of antennas cannot be assured on the same face of a board from restrictions to the layout.

<Space Division Millimeter Wave Transmission Structure: Third Example>

Figure 9A:
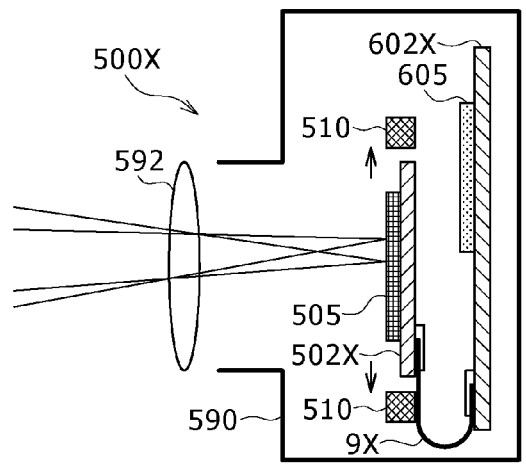
FIGS. 9A to 9C are schematic views showing a comparative example with a third example of the space division millimeter wave transmission structure of the signal interface of FIG. 6.

FIGS. 9A to 12D show a third example of the space division millimeter wave transmission structure of the present embodiment. In particular, FIGS. 9A to 9C show a comparative example with the third example and FIGS. 10A to 12D show the space division millimeter wave transmission structure of the third example.

The third example is, similarly to the first and second examples, an application example wherein the space division millimeter wave transmission structure implements a functional structure of the wireless transmission system 1A of the first embodiment. Particularly, the third example is an application to an image pickup apparatus wherein a fixed image pickup device or image pickup element is moved to carry out camera shake correction. In particular, the third example is an application to a system configuration wherein the second communication apparatus 200A is an image pickup board 502C on which a solid-state image pickup device is mounted and the first communication apparatus 100A is a main board 602C on which a control circuit, an image processing circuit and so forth are mounted.

In an image pickup apparatus (for example, a digital camera), disorder appears in a picked up image by a camera shake by an operator, by vibration of the image pickup apparatus integral with an operator, and so forth. For example, in a digital camera of the single lens reflex type, an image passing through a lens at an image pickup preparation stage is reflected by a main mirror and focused on a focal plate provided in a pentaprism section at an upper portion of the camera so that the user confirms from the image on the focal plate whether or not the image is in an in-focus state. Then, if an image pickup stage is entered, then the main mirror is retracted from the light path, and the image passing through the lens is focused on and recorded by the solid-state image pickup device. In particular, the user cannot directly confirm at the image pickup stage whether or not the image is focused just on the solid-state image pickup device, and if the position of the solid-state image pickup device in the direction of the optical axis should be unstable, then the image is picked up in an out-of-focus state.

Therefore, a mechanism in an image pickup apparatus wherein, for example, the solid-state image pickup device is moved to carry out correction against a camera shake is known as a camera shake correction mechanism (generally referred to as a hand-shake correction mechanism) for suppressing such disorder of a picked up image as described above. This method is adopted also in the third example and the comparative example with the third example.

In the camera shake correction mechanism wherein the solid-state image pickup device is moved to carry out camera shake correction, the solid-state image pickup device itself is shifted in a plane perpendicular to the optical axis without driving the lens in the lens barrel. For example, in a camera wherein the camera shake correction mechanism is provided in a main body, if a shake of the camera body is detected, then the solid-state image pickup device is moved in the body in response to the movement of the camera body so that an image to be formed on the solid-state image pickup device may be fixed or immovable on the solid-state image pickup device. Since this method moves the solid-state image pickup device in parallel to carry out camera shake correction, an optical system for exclusive use is not required, and the solid-state image pickup device is light in weight and the method is suitable particularly for an image pickup apparatus which involves replacement of the lens.

Comparative Example

For example, FIG. 9A shows a cross section of the image pickup apparatus 500X (in the form of a camera) as viewed from sidewardly (from above or below). If a housing 590 (an apparatus body) shakes, then the focal position of a light flux incident through a lens 592 is displaced. The image pickup apparatus 500X detects the shake and drives a shake correction driving section 510 (including a motor or an actuator) to adaptively move a solid-state image pickup device 505 (particularly an image pickup board 502X on which the solid-state image pickup device 505 is mounted) to carry out camera shake correction so that displacement of the focal position does not occur. Since a mechanism for such camera shake correction as just described is known, detailed description of the same is omitted herein.

Figure 9B:
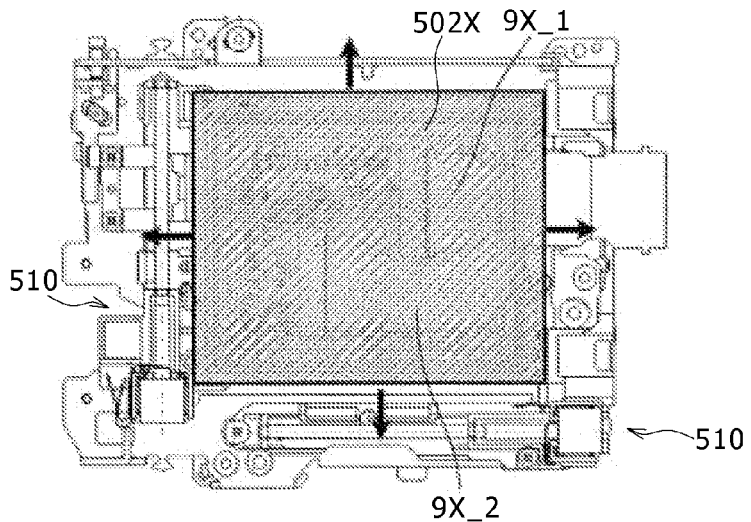

FIG. 9B shows a plan view of the image pickup board 502X. Referring to FIG. 9B, the image pickup board 502X is structured such that the solid-state image pickup device 505 is moved by several mm upwardly, downwardly, leftwardly and rightwardly integrally with the image pickup board 502X indicated by hatches within a body by the shake correction driving section 510 disposed on a periphery thereof. The image pickup board 502X on which the solid-state image pickup device 505 is mounted is connected to a main board 602X, on which an image processing engine 605 which is a semiconductor device (incorporating a control circuit, an image processing circuit and so forth) are mounted, generally by a flexible wire (an electric interface 9Z), such as a flexible printed wire.

In the example of FIG. 9B, two flexible printed wires 9X_1 and 9X_2 are used as an example of the electric interface 9Z. The flexible printed wires 9X_1 and 9X_2 are connected at the other end thereof to a main board 602X on which the image processing engine 605 shown in FIG. 9A is mounted.

An image signal outputted from the solid-state image pickup device 505 is transmitted to the image processing engine 605 through the flexible printed wires 9X_1 and 9X_2.

Figure 9C:
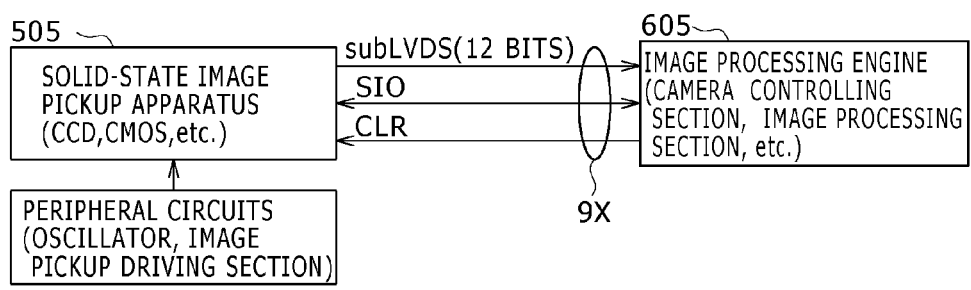

FIG. 9C shows a functional configuration of a signal interface between the image pickup board 502X and the main board 602X. Referring to FIG. 9C, in the example shown, an image signal outputted from the solid-state image pickup device 505 is transmitted as a sub LVDS (Sub-Low Voltage Differential Signaling) signal of 12 bits to the image processing engine 605.

Also other low-speed signals such as a control signal and a synchronizing signal from the image processing engine 605 (including, for example, a serial input/output controlling signal SIO and a clear signal CLR), power supplied from a power supply section and so forth are transmitted by the flexible printed wires 9X.

However, where the solid-state image pickup device 505 is moved to carry out camera shake correction, the following problems are encountered.

i) In addition to miniaturization of a camera shake correction mechanism itself, the electric interface 9Z (an electric wire or a cable) for connecting an image pickup board on which the solid-state image pickup device is mounted and another board (a main board) on which the other circuits are mounted, to each other requires a margin which allows such movement of the solid-state image pickup device 505. Therefore, a space for accommodating the electric interface 9Z in a deformed state is required, and it becomes an obstacle to achievement in miniaturization to assure such a surplus space. For example, restrictions to the shape and length of the flexible printed wire 9X give rise to a restriction to the layout, and also the shape and the pin arrangement of a connector for the flexible printed wire 9X similarly give rise to a restriction to the layout.

ii) The electric interface 9Z (including the flexible printed wire 9X) is connected at an end thereof to the image pickup board 502X on which the movable solid-state image pickup device 505 is mounted. Therefore, the electric interface 9Z may possibly be deteriorated by an influence of mechanical stress.

iii) Since a high-speed signal is transmitted by wire, an EMC countermeasure is required.

iv) Although the transmission rate of an image signal is increased more and more by further refinement of the solid-state image pickup device 505 and increase of the frame rate, there is a restriction to the data rate per one wire, and only one wire may not become able to deal with the image signal. Therefore, if it is intended to further raise the data rate, then it is a possible countermeasure to increase the number of wires and lower the transmission rate per one signal wire by parallel transmission of signals. However, this countermeasure gives rise to such problems as complication of a printed board and a cable wiring scheme, increase in physical size of the connector section and the electric interface 9Z and so forth.

Third Example

Therefore, as the third example, a new mechanism for a signal interface between the image pickup board 502C and the main board 602C is proposed which transmits signals (preferably all signals including power supply), using a millimeter wave. Particulars of the new mechanism are described below.

The new mechanism is applied, for example, to a case wherein the solid-state image pickup device 505 is a CCD (Charge Coupled Device) unit and is mounted on the image pickup board 502C together with driving sections (including a horizontal driver and a vertical driver) or wherein the solid-state image pickup device 505 is a CMOS (Complementary Metal-Oxide Semiconductor) sensor.

FIGS. 10A to 12D show the mechanism of the third example. FIGS. 10A to 12D are schematic sectional views of the image pickup apparatus 500C and illustrates mounting between boards similarly to FIG. 9A. In FIGS. 10A to 12D, attention is paid to millimeter wave transmission of signals, and those parts which have no relation to millimeter wave transmission are omitted suitably. In the following description, for those parts which are not shown in FIGS. 10A to 12D, the comparative example shown in FIGS. 9A to 9C should be referred to.

In the housing 590 of the image pickup apparatus 500C, the image pickup board 502C and the main board 602C are disposed. The first communication apparatus 100 (the semiconductor chip 103) is carried on the main board 602C which carries out signal transmission to and from the image pickup board 502C on which the solid-state image pickup device 505 is mounted, and the second communication apparatus 200 (the semiconductor chip 203) is mounted on the image pickup board 502C. As described hereinabove, the signal production units 107 and 207 and the transmission line coupling sections 108 and 208 are provided on the semiconductor chips 103 and 203, respectively.

The solid-state image pickup device 505 and image pickup driving sections are mounted on the image pickup board 502C. Shake correction driving sections 510 are disposed around the image pickup board 502C. Though not shown, the image processing engine 605 is mounted on the main board 602C. An operation section and various sensors not shown are connected to the main board 602C. The main board 602C can be connected to a peripheral apparatus such as a personal computer or a printer by an external interface not shown. The operation section includes, for example, a power supply switch, a setting dial, a jog dial, a determination switch, a zoom switch, a release switch and so forth.

The solid-state image pickup device 505 and the image pickup driving sections correspond to application function sections of the LSI function unit 204 of the wireless transmission system 1A. The signal production unit 207 and the transmission line coupling section 208 may be accommodated in the semiconductor chip 203 separate from the solid-state image pickup device 505 or may be fabricated integrally with the solid-state image pickup device 505, image pickup driving sections and so forth. Where the signal production unit 207 and the transmission line coupling section 208 are formed as separate members from the solid-state image pickup device 505 and image pickup driving sections, signal transmission between them (for example, between different semiconductor chips) may possibly suffer from a problem arising from transmission of a signal by an electric wire. Therefore, the signal production unit 207 and the transmission line coupling section 208 are preferably formed integrally with the solid-state image pickup device 505, image pickup driving sections and so forth. Here, it is assumed that the signal production unit 207 and the transmission line coupling section 208 are formed as the semiconductor chip 203 separate from the solid-state image pickup device 505, image pickup driving sections and so forth. The antenna 236 may be disposed as a patch antenna outside the chips and may be formed, for example, in an inverted F shape in a chip.

The image processing engine 605 corresponds to an application function section of the LSI function unit 104 in the wireless transmission system 1A and accommodates the image processing section for processing a picked up image signal obtained by the solid-state image pickup device 505.

The signal production unit 107 and the transmission line coupling section 108 may be accommodated in the semiconductor chip 103 separate from that of the image processing engine 605 or may be fabricated integrally with the image processing engine 605. Where the signal production unit 107 and the transmission line coupling section 108 are produced separately from the image processing engine 605, signal transmission between them (for example, between the different semiconductor chips) may possibly suffer from a problem arising from transmission of a signal by an electric wire. Therefore, the signal production unit 107 and the transmission line coupling section 108 are preferably provided integrally with the image processing engine 605. Here, it is assumed that the signal production unit 107 and the transmission line coupling section 108 are provided in the semiconductor chip 103 separate from the image processing engine 605. The antenna 136 may be disposed as a patch antenna outside the chips or may be formed, for example, in an inverted F shape in a chip.

The image processing engine 605 accommodates a camera controlling section including a CPU (Central Processing Unit), a storage section (such as a working memory and a program ROM) and so forth, and an image processing section. The camera controlling section reads out a program stored in the program ROM into the working memory and controls the components of the image pickup apparatus 500C in accordance with the program.

The camera controlling section further controls the entire image pickup apparatus 500C based on signals from the switches of the operation section and controls the power supply section to supply power to the components. Further, the camera controlling section carries out communication such as transfer of image data with a peripheral apparatus through an external interface.

Furthermore, the camera controlling section carries out sequence control regarding image pickup. For example, the camera controlling section controls an image pickup operation of the solid-state image pickup device 505 through a synchronizing signal generation section and image pickup driving sections. The synchronizing signal generation section generates a basic synchronizing signal necessary for signal processing. The image pickup driving sections receive the synchronizing signal generated by the synchronizing signal generation section and a control signal from the camera controlling section to generate detailed timing signals for driving the solid-state image pickup device 505.

An image signal (a picked up image signal) to be sent from the solid-state image pickup device 505 to the image processing engine 605 may be any of an analog signal and a digital signal. Where a digital signal is used, if the solid-state image pickup device 505 is formed as a separate member from an AD conversion section, then the AD conversion section is mounted on an image pickup board 502A.

In order to carry out camera shake correction, the image pickup board 502C is disposed for movement in upward, downward, leftward and rightward directions (in the upward, downward, forward and backward directions) with respect to the plane of the figure, in response to a shake of the camera body under the control of the shake correction driving section 510. Meanwhile, the main board 602C is fixed to the housing 590.

Detection of a camera shake is carried out by detecting an acceleration of three components of yaw, pitch and rolling by means of a camera shake detection section not shown configured, for example, using a gyro. The shake correction driving section 510 rocks the solid-state image pickup device 505 in a plane perpendicular to the optical axis based on a result of the detection using a motor or an actuator. The camera shake detection section and the shake correction driving section 510 configure a camera shake correction section for carrying out camera shake correction.

On the image pickup board 502C, the signal production unit 207 and the transmission line coupling section 208 are mounted in addition to the solid-state image pickup device 505 in order to implement the wireless transmission system 1A of the present embodiment. Similarly, on the main board 602C, the signal production unit 107 and the transmission line coupling section 108 are mounted in order to implement the wireless transmission system 1A of the present embodiment. The transmission line coupling section 208 on the image pickup board 502C side and the transmission line coupling section 108 on the main board 602C side are coupled to each other by a millimeter wave signal transmission line 9. Consequently, signal transmission in the millimeter waveband is carried out bidirectionally between the transmission line coupling section 208 on the image pickup board 502C side and the transmission line coupling section 108 on the main board 602C side.

Where one-way communication is applicable, the sender side signal production sections 110 and 210 may be disposed on the sender side while the receiver side signal production sections 120 and 220 are disposed on the receiver side and the sender and receiver sides are connected to each other by the transmission line coupling sections 108 and 208 and the millimeter wave signal transmission line 9. For example, if only a picked up image signal acquired by the solid-state image pickup device 505 is to be transmitted, then the image pickup board 502C side may be determined as the sender side while the main board 602C side is determined as the receiver side. If only signals for controlling the solid-state image pickup device 505 (for example, a high-speed master clock signal, a control signal or a synchronizing signal) are to be transmitted, the main board 602C side may be determined as the sender side while the image pickup board 502C side is determined as a receiver side.

An image signal obtained by the solid-state image pickup device 505 through millimeter wave signal transmission carried out between the two antennas 136 and 236 is carried on a millimeter wave through the millimeter wave signal transmission line 9 between the antennas 136 and 236 and transmitted to the main board 602C. Meanwhile, various control signals for controlling the solid-state image pickup device 505 are carried on a millimeter wave through the millimeter wave signal transmission line 9 between the antennas 136 and 236 and transmitted to the image pickup board 502C.

The millimeter wave signal transmission line 9 may have a form wherein the antennas 136 and 236 are disposed in an opposing relationship to each other as seen in FIGS. 10A to 10F, another form wherein the antennas 136 and 236 are disposed in a displaced relationship in a direction of the plane of the board as shown in FIGS. 11A to 11D or a further form which is a combination of the two forms as seen in FIGS. 12A to 12D. In the form wherein the antennas 136 and 236 are disposed in an opposing relationship to each other, an antenna having directivity in a normal direction to the board, for example, a patch antenna, should be used. In the form wherein the antennas 136 and 236 are disposed in a displaced relationship in a direction of the plane of the board, an antenna having directivity in a direction of the plane of the board, for example, a dipole antenna, a Yagi-Uda antenna or an inverted F type antenna may be used.

Figure 11A:
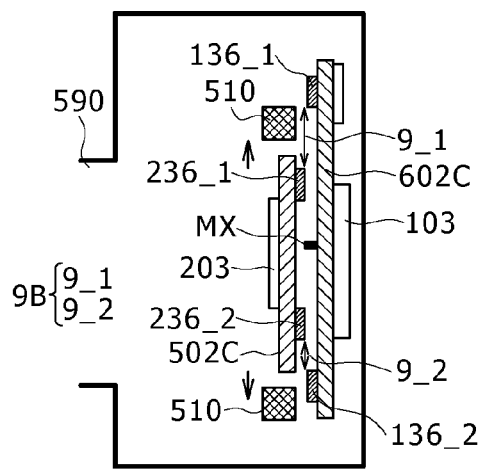
FIGS. 11A to 11D are schematic views showing the third example of the space division millimeter wave transmission structure of the signal interface of FIG. 6.

Each of the millimeter wave signal transmission lines 9 may be a free space transmission line 9B as shown in FIGS. 10A, 11A, and 12A, FIG. 10E, and FIG. 11D. Or, such a dielectric transmission line 9A as shown in FIGS. 10B, 11B, and 12B and FIGS. 10C, 11C, and 12C or such a hollow waveguide 9L as show in FIG. 12D may be used.

Where the free space transmission line 9B is used, if a plurality of systems of millimeter wave signal transmission lines 9 are provided closely to each other, then in order to suppress interference between the systems, preferably a structure for preventing radio wave propagation (a millimeter wave blocking member MX) should be disposed between the systems as shown in FIGS. 10A and 11A. The millimeter wave blocking member MX may be disposed on one of the main board 602C and the image pickup board 502C or on both of them. Whether or not the millimeter wave blocking member MX should be disposed may be determined from the spatial distance and the degree of interference between the systems. Since the degree of interference relates also to transmission power, it is determined taking the spatial distance, transmission power and degree of interference into consideration synthetically.

Figure 11B:
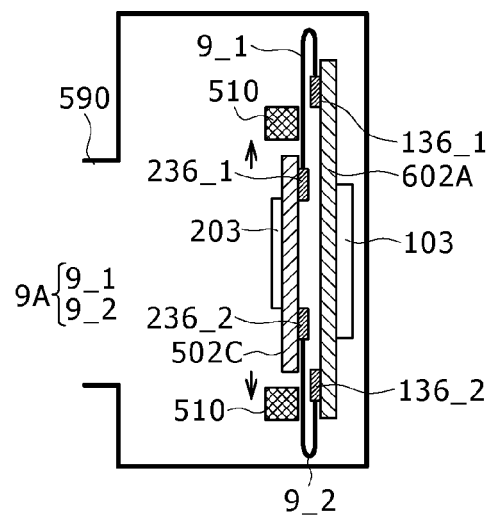
Figure 12A:
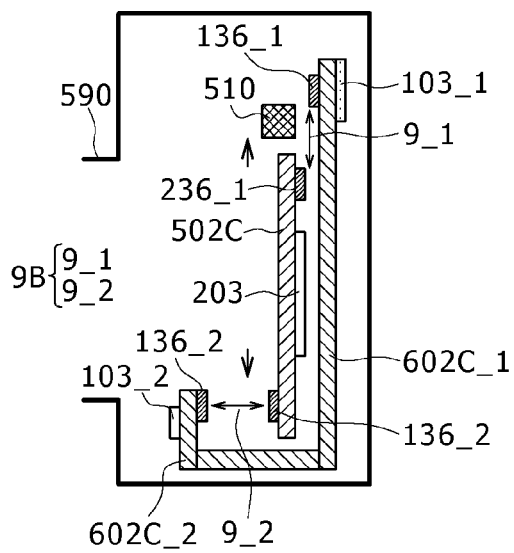
FIGS. 12A to 12D are schematic views showing the third example of the space division millimeter wave transmission structure of the signal interface of FIG. 6.
Figure 12B:
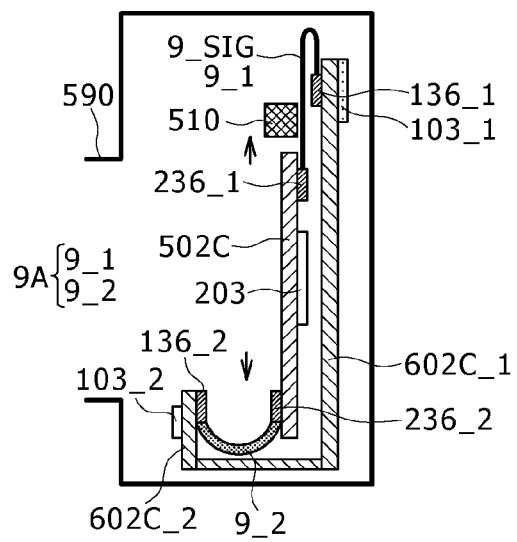

In the dielectric transmission line 9A, for example, as shown in FIGS. 10B, 11B, and 12B, the antennas 136 and 236 may be connected to each other by a soft (flexible) dielectric material like, for example, a silicone resin type material. The dielectric transmission line 9A may be surrounded by a blocking member (for example, a dielectric member). In order to make the most of the flexibility of the dielectric material, also the blocking member should be flexible. Although the blocking material is connected on the dielectric transmission line 9A, since the material thereof is soft, the dielectric transmission line 9A can be laid like an electric wire and does not provide restriction to movement of the solid-state image pickup device 505 (the image pickup board 502C).

Figure 11C:
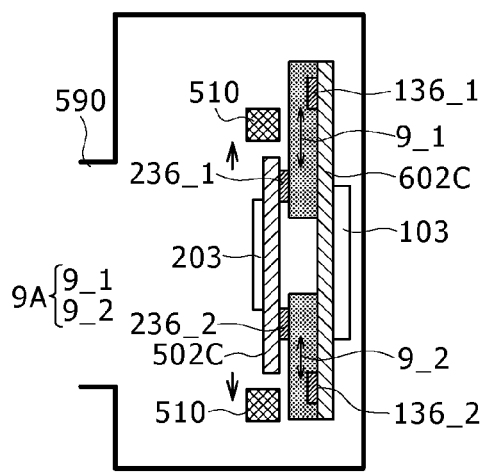
Figure 11D:
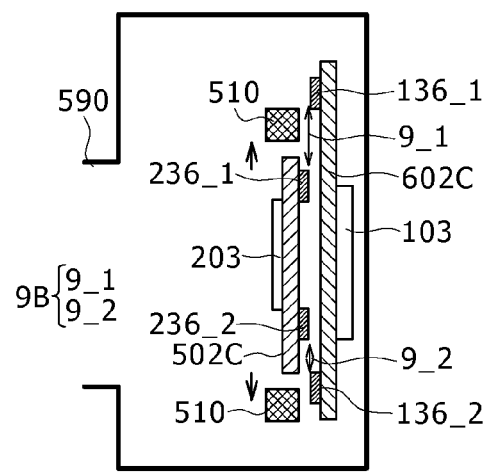
Figure 12C:
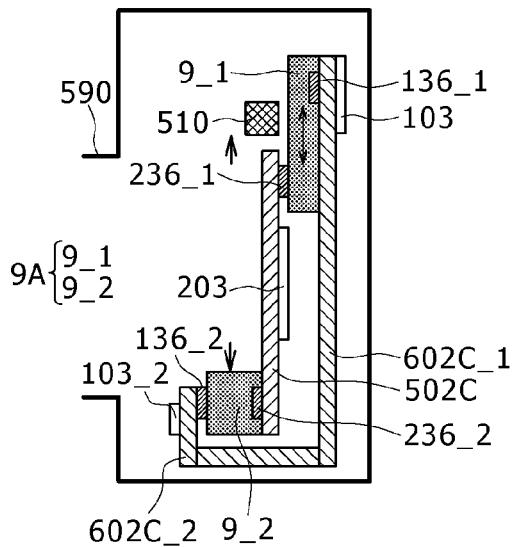

As another example of the dielectric transmission line 9A, the dielectric transmission line 9A may be fixed to the antenna 136 on the main board 602C while the antenna 236 of the image pickup board 502C moves slipping on the dielectric transmission line 9A as seen in FIGS. 10C, 11C, and 12C. Also the dielectric transmission line 9A in this instance may be surrounded on an outer circumference thereof by a blocking member (such as a conductive member). By decreasing the friction between the antenna 236 on the image pickup board 502C side and the dielectric transmission line 9A, no limitation is applied to the movement of the solid-state image pickup device 505 (the image pickup board 502C). It is to be noted that the dielectric transmission line 9A may be fixed to the image pickup board 502C side conversely. In this instance, the antenna 136 of the main board 602C is configured so as to slidably move on the dielectric transmission line 9A.

Figure 12D:
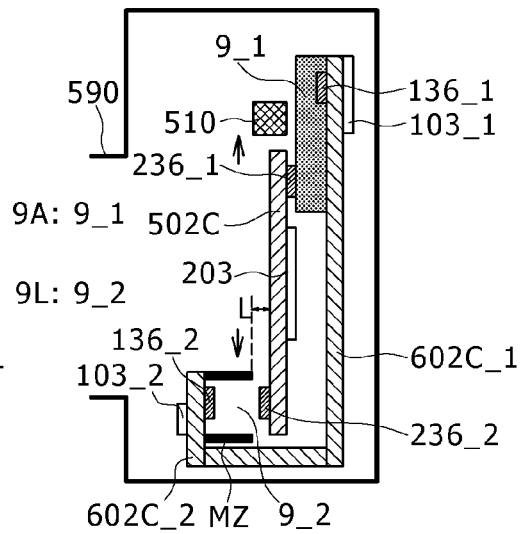

The hollow waveguide 9L has to be structured only such that it is surrounded on an outer circumference thereof by a blocking member and is hollow. For example, as shown in FIGS. 10D and 12D, the hollow waveguide 9L is structured such that it is surrounded by a conductor MZ which is an example of a blocking member and is hollow. For example, an enclosure of the conductor MZ is attached to the main board 602C in such a form that it surrounds the antenna 136. The antenna 236 on the image pickup board 502C side is disposed such that the center of movement thereof is positioned at a position opposing to the antenna 136. Since the conductor MZ is hollow, there is no necessity to use a dielectric material, and the millimeter wave signal transmission line 9 can be configured simply and readily at a low cost.

The enclosure of the conductor MZ may be provided on any of the main board 602C side and the image pickup board 502C side. In any case, the distance L between the enclosure of the conductor MZ and the image pickup board 502C or the main board 602C (the length of a gap from an end of the conductor MZ to an opposing boar) is set sufficiently small in comparison with the wavelength of the millimeter wave. However, the distance L is set so as not to disturb movement of the image pickup board 502C (the solid-state image pickup device 505).

The size and the shape of the blocking member (the enclosure: the conductor MZ) are set taking the range of movement of the image pickup board 502C into consideration. In particular, the size and the shape should be set such that, when the image pickup board 502C moves, the antenna 236 on the image pickup board 502C may not come out of the opposing range to the enclosure (conductor MZ) and the antenna 136. Within this limitation, the conductor MZ may have an arbitrary shape in plan such as a circular shape, a triangular shape or a quadrangular shape.

The hollow waveguide 9L may be configured such that, in place of forming an enclosure from the conductor MZ on the board, for example, a hole (which may be a through-hole or a bottomed hole), is formed on a rather thick board as seen in FIG. 10F such that a wall face of the hole is formed as an enclosure. In this instance, the board functions as a blocking member. The hole may be provided on one of the image pickup board 502C and the main board 602 or on both of them. The side wall of the hole may or may not be covered with a conductor. In the latter case, a millimeter wave is reflected in accordance with the ratio in relative dielectric constant between the board and the air and is distributed intensely in the hole. Where the hole is formed as a through-hole, the antennas 136 and 236 should be disposed on (attached to) the rear face of the semiconductor chips 103 and 203, respectively. Where the hole is not formed as a through-hole but stopped in the way (formed as a blind hole), the antennas 136 and 236 should be disposed on the bottom of the hole. The hole may have an arbitrary cross sectional shape such as a circular shape, a triangular shape or a quadrangular shape. Whichever shape the hole has, the size of the hole may be set similarly as in the case wherein the hollow waveguide 9L is formed from the conductor MZ.

In the third example, an image signal acquired by the solid-state image pickup device 505 is transmitted as a millimeter wave modulation signal to the main board 602C side and then transmitted to the image processing engine 605. Also control signals for operating the solid-state image pickup device 505 are transmitted as millimeter wave modulation signals to the image pickup board 502C side. Further, also power supply for operating the components of the image pickup board 502C can be supplied in the form of a millimeter wave.

Consequently, the following advantages can be achieved in comparison with an alternative case wherein the electric interface 9Z (the flexible printed wire 9X) is used.

i) A signal to be converted into and transmitted as a millimeter wave signal does not have to be transmitted between boards through a cable any more. Since a signal whose transmission is changed to millimeter wave transmission is transmitted by wireless transmission, such degradation of a wire which may be caused by mechanical stress and occurs as in the case wherein the electric interface 9Z is used does not occur. Since the number of electric wires can be reduced, the cable space can be reduced, and the load to the driving section for moving the solid-state image pickup device 505 (particularly the image pickup board 502A on which the solid-state image pickup device 505 is mounted) can be reduced. Consequently, a camera shake correction mechanism of a small size whose power consumption is low can be used in the image pickup apparatus 500C.

ii) Also it is possible to transmit all signals including power supply by wireless transmission, and the necessity to use cable connection or connector connection is eliminated. The problem of deterioration of wires by mechanical stress as in a case wherein the electric interface 9Z is used is eliminated fully.

iii) Since wireless communication is used, there is no necessity to care about the shape of wires or the position of a connector, and restrictions to the layout do not occur very much.

iv) Since a wavelength in the millimeter waveband is short, the range attenuation is great and diffraction occurs little, and therefore, it is easy to apply electromagnetic shielding.

v) Where wireless transmission or transmission in a dielectric waveguide which use a millimeter wave is applied, the necessity for a countermeasure against EMC as in the case wherein the electric interface 9Z (the flexible printed wire 9X) is used is lowered. Further, since a device which uses a frequency within the millimeter waveband does not generally exist in the inside of the camera, also where an EMC countermeasure is required, the EMC countermeasure can be implemented readily.

vi) Since millimeter wave communication allows a communication frequency band to be set wide, it is easily possible to set a high data rate. Where wireless transmission or transmission in a dielectric waveguide wherein a millimeter wave is used is carried out, since the data rate can be set considerably higher than that where the electric interface 9Z is used, also it is possible to simply cope with an increase of the speed in transmission of an image signal by refinement of the solid-state image pickup device 505 or increase of the frame rate.

<Space Division Millimeter Wave Transmission Structure: Fourth Example>

Figure 13A:
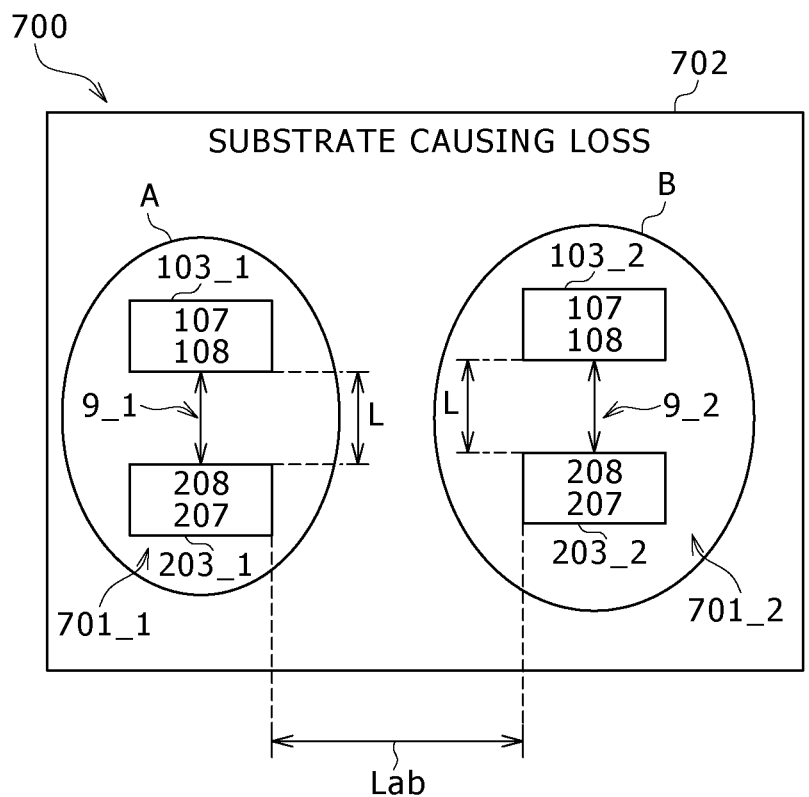
FIGS. 13A and 13B are schematic views of a fourth example of the space division millimeter wave transmission structure of the signal interface of FIG. 6.
Figure 13B:
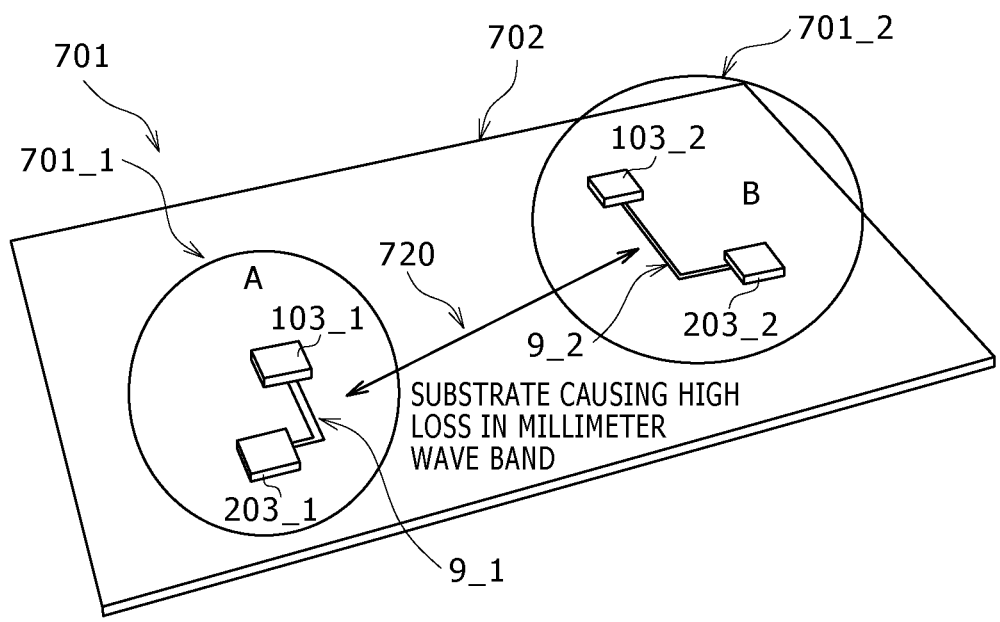
Figure 14A:
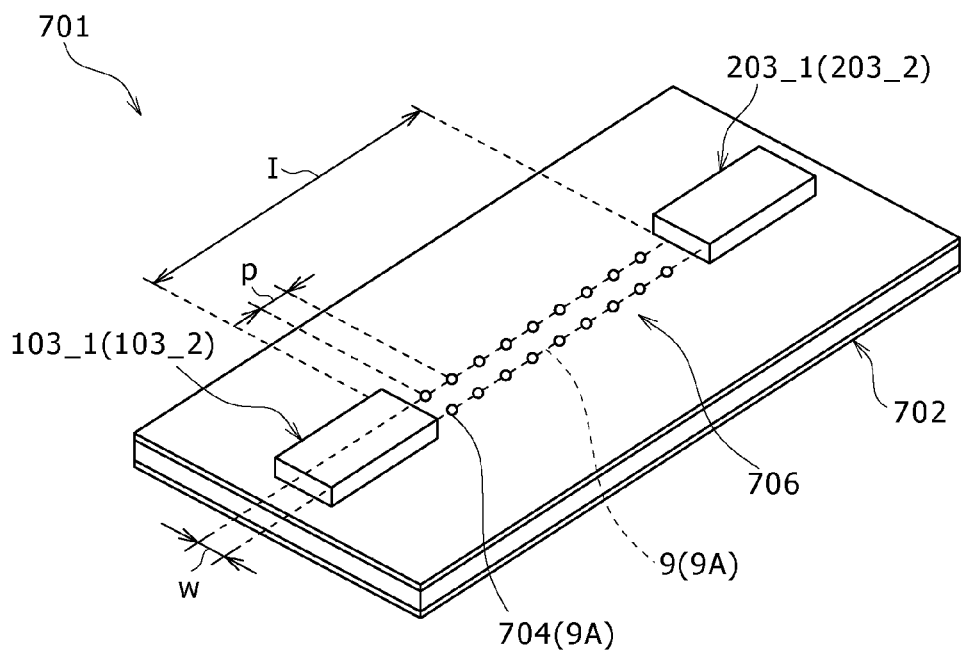
FIGS. 14A and 14B are schematic views illustrating a basic concept of millimeter wave board transmission adopted by the space division millimeter wave transmission structure shown in FIGS. 13A and 13B.
Figure 14B:
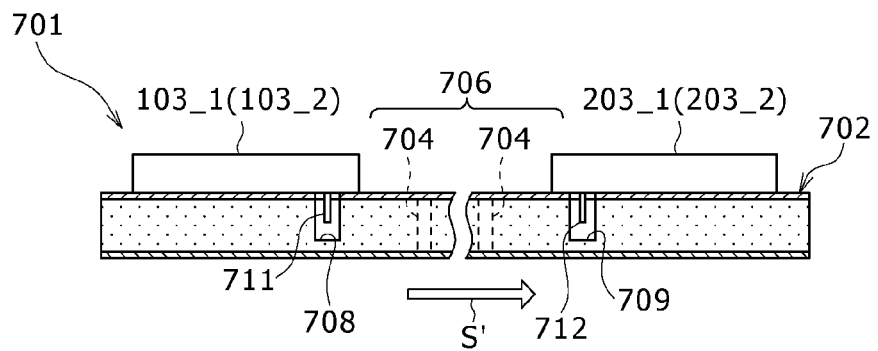

FIGS. 13A to 14B show a fourth example of the space division millimeter wave transmission structure of the present embodiment. In particular, FIGS. 13A and 13B show a general configuration of the fourth example, and FIGS. 14A and 14B illustrate a basic concept of the millimeter wave in-board transmission adopted in the fourth example.

In the fourth example, a plurality of systems of millimeter wave signal transmission lines 9 (transmission channels) are provided in a system in which a millimeter wave is transmitted in a board (millimeter wave in-board transmission system).

First, a mechanism of the millimeter wave in-board transmission system (millimeter wave in-board transmission apparatus) is described. In the millimeter wave in-board transmission system (millimeter wave in-board transmission apparatus), the semiconductor chip 103 of the first communication apparatus 100 and the semiconductor chip 203 of the second communication apparatus 200 are carried on the same board (here, on a board 702). Further, the millimeter wave in-board transmission system or millimeter wave in-board transmission apparatus is characterized in that the board 702 formed from a tangible entity (dielectric transmission line 9A), having a relative dielectric constant within a fixed range and a dielectric loss tangent tan δ within a fixed range is used as the millimeter wave signal transmission line 9.

The "fixed range" signifies a range within which an effect of the fourth example is obtained with the relative dielectric constant or the dielectric loss tangent, and the relative dielectric constant or the dielectric loss tangent may have a value determined in advance within the fixed range. The fixed range cannot be determined based only on the dielectric material itself but relates also to the length of the millimeter wave signal transmission line 9 (the transmission line length), and the frequency of the millimeter wave. In other words, the dielectric material of the board 702 may have a characteristic with which the effect of the fourth example is obtained. Although a definite decision cannot necessarily be made, as an example, the following decision method is available.

In order to form the millimeter wave signal transmission line 9 on the board 702 such that a millimeter wave is transmitted in the board 702, it is demanded that some degree of loss is caused as hereinafter described. The term "some degree of loss" signifies a degree with which, for example, the difference $\{S(2,1)-S(1,1)\}$ between the transmission characteristic $S(2,1)$ (dB) and the reflection characteristic $S(1,1)$ (dB) in the carrier frequency band is lower than 20 dB (for example, is approximately 10 dB) and a standing wave is not conspicuous in the carrier frequency band. On the other hand, the term "no loss" signifies a state wherein, for example, the difference $\{S(2,1)-S(1,1)\}$ between the transmission characteristic $S(2,1)$ (dB) and the reflection characteristic $S(1,1)$ (dB) in the carrier frequency band exceeds 20 dB (for example, is approximately 30 dB) and a standing wave is conspicuous in the carrier frequency band.

For example, the relative dielectric constant of a tangible entity which forms the board 702 is approximately 2 to 10 (preferably 3 to 6), and the dielectric loss tangent of the tangible entity is approximately 0.001 to 0.1 (preferably 0.01 to 0.5). The dielectric material which satisfies the conditions given above should include one of glass epoxy-based resins, acrylic-based resins and polyethylene-based resins. A material having a dielectric loss constant lower than 0.001 (for example, a silicone-based material) is excessively low in dielectric loss constant, (that is, in loss), and is considered not suitable as a material for the board 702 in the fourth example.

The transmission line coupling sections 108 and 208 are configured from an antenna member based on the wavelength λ of a signal S of a millimeter wave and coupled to a tangible entity of a relative dielectric constant ∈. The transmission line coupling sections 108 and 208 can in most cases be implemented readily even if a resonance structure or the like is utilized if the specific band (=signal band/operation center frequency) is approximately 10 to 20%. In this instance, one region of the board 702 having the relative dielectric constant ∈ is used as the tangible entity, and the board 702 having the relative dielectric constant ∈ configures the millimeter wave signal transmission line 9 which causes loss. An electromagnetic wave S' of a millimeter wave propagates in the millimeter wave signal transmission line 9. Since the millimeter wave signal transmission line 9 causes great loss, also reflection is attenuated.

In the fourth example, a plurality of systems of such millimeter wave signal transmission lines 9 are provided on the board 702 having the same loss to configure a millimeter wave in-board transmission system 700. For example, in the example shown in FIGS. 13A and 13B, four semiconductor chips 103_1, 103_2, 203_1 and 203_1 are disposed on the board 702 which causes loss. To a region A, the semiconductor chips 103_1 and 203_1 which configure a first millimeter wave in-board transmission apparatus 701_1 are allocated, and a millimeter wave signal transmission line 9_1 is provided for millimeter wave transmission between the semiconductor chip 103_1 and the semiconductor chip 203_1. To a region B, the semiconductor chips 103_2 and 203_2 which configure a second millimeter wave in-board transmission apparatus 701_2 are allocated for millimeter wave transmission between the semiconductor chip 103_2 and the semiconductor chip 203_2, and a millimeter wave signal transmission line 9_2 is provided for millimeter wave transmission between the semiconductor chip 103_2 and the semiconductor chip 203_2.

A technique for configuring the millimeter wave signal transmission line 9 on the board 702 having the relative dielectric constant ∈ and causing loss is illustrated in FIGS. 14A and 14B. Referring to FIGS. 14A and 14B, in the example shown, since the margin of the S/N ratio against thermal noise increases, a resin board of a glass epoxy-based resin which is not normally used in the millimeter waveband and causes great loss or the like board is used so that reflection, multipath, disturbance and interference can be reduced. For the board 702, a double-sided copper foil board formed using a glass epoxy resin as an insulation base is used. The relative dielectric constant ∈ of a glass epoxy resin is approximately 4.0 to 5.0 (1 MHZ).

The millimeter wave signal transmission line 9 is formed from a transmission region I defined on the glass epoxy resin board on which the semiconductor chip 103_1 (103_2) and the semiconductor chip 203_1 (203_2) are mounted. For the millimeter wave signal transmission line 9, the board 702 is used which has a dielectric loss tangent (tan δ) similar to that of a glass epoxy resin used in ordinary printed circuit board and which has in the past been regarded unsuitable for millimeter wave transmission because it causes high transmission loss in the millimeter waveband.

The transmission region I in the present example is defined by a plurality of hollow cylindrical perforations (through-holes 704), extending through the board 702 shown in FIG. 14A. For example, in the board 702 between the semiconductor chip 103_1 (103_2) and the semiconductor chip 203_1 (203_2), a plurality of through-holes 704 are formed linearly in two rows along a direction in which a signal S of a millimeter wave should be propagated (provide directivity). The arrangement pitch p between one through-hole 704 and an adjacent through-hole 704 is set, for example, smaller than λ/2. If the width between one through-hole 704 and an opposing through-hole 704 is the width w of the transmission region I, then the width w is set larger than λ/2. For the through-holes 704, a conductive cylindrical member may be used in addition to a hollow cylindrical member. By grounding the conductive cylindrical member or by like means, the phase of the dielectric waveguide can be adjusted.

In this manner, the transmission region I is defined by two rows of perforations (a through-hole fence section 706). Naturally, a dash-board part like a repeater may be disposed midway of the board 702 so as to control the range of transmission of the signal S of a millimeter wave. Naturally, where the signal S of a millimeter wave is received all at once by the semiconductor chip 203_1 (203_2) centered at the semiconductor chip 103_1 (103_2) and plural other semiconductor chips 203_1 (203_2), the through-hole fence section 706 may be omitted in order to set the transmission direction of the signal S of a millimeter wave so as to be non-directional.

In the millimeter wave in-board transmission apparatus 701, an electromagnetic wave S' based on a signal transmitted into the board 702 from the antenna member 711 shown in FIG. 14B which configures the transmission line coupling section 108 is received by an antenna member 712 shown in FIG. 14B which configures the transmission line coupling section 208. The antenna member 711 is connected to an amplification section 117 of the semiconductor chip 103_1 (103_2) and disposed on or in the inside of the board 702 such that it radiates the electromagnetic wave S' toward the inside of the board 702. The antenna member 711 is disposed, for example, in a hole portion 708 formed in the board 702. An antenna having a length greater than approximately ½ the wavelength λ is used for the antenna member 711. Where an antenna member greater than approximately ½ the wavelength λ can be mounted, also a waveguide structure such as a waveguide pipe or a dielectric line can be implemented readily. If a waveguide structure is used, then the subjects α to γ described hereinabove regarding a broadcast or a wireless communication apparatus can be moderated significantly.

The antenna member 712 is connected to an amplification section 124 of the semiconductor chip 203_1 (203_2) and disposed on or in the inside of the board 702 and receives an electromagnetic wave S' from within the board 702. Also the antenna member 712 is disposed in a hole portion 709 formed in the board 702. Consequently, the electromagnetic wave S' transmitted from the semiconductor chip 103_1 (103_2) can be confined in the transmission region I defined by the through-hole fence section 706. Besides, the electromagnetic wave S' confined in the transmission region I can be received by the antenna member 712 of the semiconductor chip 203_1 (203_2).

Though not shown, some board made of a resin having a dielectric loss tangent tan δ=approximately 0.001 causes, when the carrier frequency increases by 1 GHz from 1 GHz to 100 GHz, little loss and, when the pass gain in the pass characteristic dB (S(2,1)) when the carrier frequency is 60 GHz (2 Gbps) becomes approximately −5 dB. With such an example of the reflection characteristic of a board as just described, a standing wave of a wave shape appears. In this manner, with a board made of a resin having a dielectric loss tangent tan δ=0.001, a standing wave is likely to appear although the loss is low.

On the other hand, with the pass characteristic example and the reflection characteristic example of the millimeter wave signal transmission line 9 of the board 702 made of a glass epoxy resin (which has a dielectric loss tangent tan δ=approximately 0.03), though not shown, the reflected wave attenuates and a standing wave becomes less likely to appear. In short, with the board 702 made of a glass epoxy resin of a dielectric loss tangent tan δ=0.03, a standing wave is less likely to appear and the loss is great. For example, if the length of the millimeter wave signal transmission line 9 on the board 702 (the transmission line length), is approximately 10 cm, then the transmission loss thereof is approximately 31 dB. Such a board 702 made of a glass epoxy resin as just described has not been utilized for signal transmission in the millimeter waveband in the past.

However, for example, if the board 702 has a dielectric loss tangent of approximately 0.03 and exhibits great loss and the length of the millimeter wave signal transmission line 9 is L=approximately 10 cm, then if the semiconductor chip 103 having the signal production unit 107 for signal transmission of a millimeter wave and the semiconductor chip 203 having the signal production unit 207 for signal reception of a millimeter wave are mounted on the board 702, then signal intensity sufficient to execute a millimeter wave in-board communication process in comparison with thermal noise can be obtained.

Meanwhile, where the transmission band of the millimeter wave signal transmission line 9 is represented by B Hz, the Boltzmann's constant by k, the temperature by T and the noise power by thermal noise by P, the noise power P is P=kTB, and the noise power per 1 GHz is −84 dBm in RMS value. The RMS value is obtained from a thermal noise voltage of a resistance element obtained from a function of the resistance, temperature and measured frequency bandwidth and equivalent noise current. Where it is intended to use the semiconductor chips 103 and 203 to configure the amplification sections 117 and 124 for low noise, for example, in the 60

GHz band, the amplification sections 117 and 124 having a noise factor of approximately 6 dB can be implemented readily. Where the signal production unit 207 for signal reception of a millimeter wave is actually configured and the margin of 10 dB is set, the noise floor becomes −84 dBm+10 dB+6 dB=−68 dB.

Further, it is easy to design the amplification sections 117 and 124, by which an output of 0 dBm is obtained at a carrier frequency=60 GHz, so as to be configured on the semiconductor chips 103 and 203, respectively. Accordingly, even if the transmission loss of the millimeter wave signal transmission line 9 on the board 702 made of a glass epoxy resin is approximately 30 dB, the S/N ratio becomes (0 dBm−31 dB)−68 dB=37 dB, and an S/N ratio sufficient for communication at a location of the distance L of the millimeter wave signal transmission line 9=10 cm.

If this 0 dBm output is controlled to a minimum necessary S/N ratio, then it is possible to minimize the disturbance to a peripheral circuit (region). If the dielectric loss tangent tan δ is great like the board 702 made of a glass epoxy resin, then since the electromagnetic wave S' of a millimeter wave which propagates in the millimeter wave signal transmission line 9 formed on the board 702 attenuates in the board, disturbance to other electronic parts which do not relate to the signal can be reduced significantly. Also it becomes possible to suppress the power consumption of the sender side.

In the millimeter wave signal transmission line 9 which causes such great loss as described above, as the carrier frequency increases, the transmission loss increases and the reflected wave attenuates, and also the bad influence of a standing wave by the reflected wave can be reduced. By frequency converting an input signal into a signal S of a millimeter wave by means of frequency conversion sections 116 and 125, the ratio of the (signal band)/(center frequency) can be reduced. Therefore, also it becomes easy to configure the signal production unit 107 for signal transmission of a millimeter wave and the signal production unit 207 for signal reception of a millimeter wave.

Therefore, since, in the millimeter wave signal transmission line 9 which exhibits great loss, the transmission loss increases and the reflected wave attenuates as the carrier frequency increases, it becomes possible for a very high-speed signal to be transmitted through the board 702 of the relative dielectric constant $\in$ which causes great loss. Besides, it becomes possible to carry out a high-speed communication process only within a certain local range of the board 702 of the relative dielectric constant $\in$. Further, outside the local range of the board 702 having the relative dielectric constant $\in$, the attenuation increases, and disturbance to the other place of the board 702 for communication and the portion of the board 702 of the relative dielectric constant $\in$ other than the communication region can be reduced significantly. Thus, a transmission system of a high speed signal which is less likely to suffer from disturbance or reflection can be implemented.

For example, also where a plurality of systems of millimeter wave signal transmission lines 9 are provided on such a board 702 as shown in FIGS. 13A and 13B, the effect of loss contributes. In particular, in the millimeter wave in-board transmission system 700 shown in FIGS. 13A and 13B, a signal S of a millimeter wave is transmitted from the semiconductor chip 103_1 (103_2) to the semiconductor chip 203_1 (203_2) through the millimeter wave signal transmission line 9_1 (9_2). Thus, a system wherein the signal S of a millimeter wave is transmitted between the semiconductor chips 103_1 (103_2) and 203_1 (203_2) positioned at different independent places on the same board 702 is constructed.

Since the millimeter wave signal transmission lines 9_1 and 9_2 cause great loss, also reflection attenuates. Since the millimeter wave signal transmission lines 9_1 and 9_2 are formed on the same board 702, a coupling medium 720 is formed between the millimeter wave signal transmission lines 9_1 and 9_2. Here, the coupling medium 720 signifies a medium formed by leakage of a millimeter wave from the millimeter wave signal transmission line 9_1 of the millimeter wave in-board transmission apparatus 701 to the millimeter wave signal transmission line 9_2 through the coupling medium 720 and a space between chips on the board 702.

However, leakage of a millimeter wave from the millimeter wave signal transmission line 9_1 of the millimeter wave in-board transmission apparatus 701_1 to the millimeter wave signal transmission line 9_2 of the second millimeter wave in-board transmission apparatus 701_2 through the coupling medium 720 is attenuated because the loss in the inside of the board 702 is great. Further, the coupling state through a space (through the coupling medium 720) is weak. Consequently, between the millimeter wave signal transmission lines 9_1 and 9_2, the disturbance by a millimeter wave can be reduced very much.

For example, in a schematic plan view shown in FIG. 13A, the semiconductor chip 103_1 (103_2) and the semiconductor chip 203_1 (203_2) are disposed in a spaced relationship from each other by a distance L (for example, several mm to several tens cm). The distance L is substantially equal to the length of the millimeter wave signal transmission line 9. The arrangement distance Lab between the semiconductor chip 103_1 (203_1) in the region A and the semiconductor chip 103_2 (203_2) in the region B is set, for example, to approximately three times the distance L, and the semiconductor chip 103_1 (103_2) is disposed in the region A while the semiconductor chip 103_2 (203_2) is disposed in a transverse direction in the region B. The through-hole fence section 706 may be provided in order to define the region A and the region B (refer to FIG. 14A).

The coupling medium 720 is formed at a location of the arrangement distance Lab. However, if the arrangement distance Lab is set to approximately three times the distance L to space the semiconductor chip 103_1 (203_1) and the semiconductor chip 103_2 (203_2) further away from each other, then even if a signal S of a millimeter wave leaks from a location between the semiconductor chips 103_1 and 203_1 to another location between the semiconductor chips 103_2 and 203_2, it can be attenuated midway.

In such a millimeter wave in-board transmission system 700 as described above, the coupling state through the coupling medium 72 in the inside of the board 702 and the space and so forth of the board 702 which cause great loss can be reduced. Coupling components of a millimeter wave by the board 702 between the millimeter wave signal transmission lines 9_1 and 9_2 can be ignored. In comparison with a board which causes small loss, the isolation upon bidirectional communication between the semiconductor chips 103_1 and 203_1 and between the semiconductor chips 103_2 and 203_2 can be improved significantly.

In short, even if the millimeter wave signal transmission line 9_1 in the region A and the millimeter wave signal transmission line 9_2 in the region B are coupled to each other by the coupling medium 720, the transmission loss of the board 702 is great, and the two systems of the millimeter wave signal transmission line 9_1 and the millimeter wave signal transmission line 9_2 formed in the same board function as transmission wires substantially independent of each other. Consequently, even if millimeter wave signal transmission in the region A and millimeter wave transmission in the region B are carried out simultaneously with the same frequency, mutual interference thereof can be prevented, thereby implementing a mechanism for space division multiplexing.

FIG. 13A shows a mounting example of the structure shown in FIG. 13B. On the same board 702 made of a glass epoxy resin which causes high loss, the two semiconductor chips 103_1 and 203_1 are disposed in the region A and the semiconductor chips 103_2 and 203_2 are disposed in the region B. The space distance L1 between the semiconductor chip 103_1 and the semiconductor chip 203_1 and the space distance L_2 between the semiconductor chip 103_2 and the semiconductor chip 203_2 are different from each other. Further, the arrangement distance Lab_1 between the semiconductor chip 103_1 and the semiconductor chip 103_2 and the arrangement distance Lab_2 between the semiconductor chip 103_2 and the semiconductor chip 203_2 are different from each other. The space distances L_1 and L_2 are several mm to several tens cm. The arrangement distances Lab_1 and Lab_2 are set to approximately three times the space distances L_1 and L_2, respectively. Although the millimeter wave signal transmission lines 9_1 and 9_2 are formed not linearly (but in a somewhat curved state), this does not make an obstacle to advancement of a millimeter wave (an electromagnetic wave).

Also in this instance, the coupling medium 720 can be formed at locations of the arrangement distances Lab_1 and Lab_2. However, if the arrangement distances Lab_1 and Lab_2 are set to approximately three times the space distances L_1 and L_2, respectively, then even if a signal S of a millimeter wave leaks from a location between the semiconductor chips 103_1 and 203_1 to a location between the semiconductor chips 103_2 and 203_2, it can be attenuated midway. Coupling components of a millimeter wave by the coupling medium 720 between the millimeter wave signal transmission lines 9_1 and 9_2 can be ignored.

In this manner, with the millimeter wave in-board transmission system 700 to which the space division millimeter wave transmission structure of the fourth example is applied, the first millimeter wave in-board transmission apparatus 701_1 and the second millimeter wave in-board transmission apparatus 701_2 are formed on the same board 702 made of a glass epoxy resin which causes great loss, and a signal S of a millimeter wave is transmitted from the semiconductor chip 103_1 to the semiconductor chip 203_1 in the region A while another signal S of the millimeter wave is transmitted from the semiconductor chip 103_2 to the semiconductor chip 203_2 in the region B which is at an independent different place on the board 702. At this time, a coupling component of the millimeter wave between the millimeter wave signal transmission lines 9_1 and 9_2 by the board 702 can be ignored. Accordingly, since setting of a carrier frequency from the semiconductor chip 103_1 to the semiconductor chip 203_1 in the region A and setting of the carrier frequency from the semiconductor chip 103_2 to the semiconductor chip 203_2 in the region B can be made same as each other utilizing the loss of the board 702, re-utilization of the carrier frequency is facilitated.

<Space Division Millimeter Wave Transmission Structure: Fifth Example>

Figure 15A:
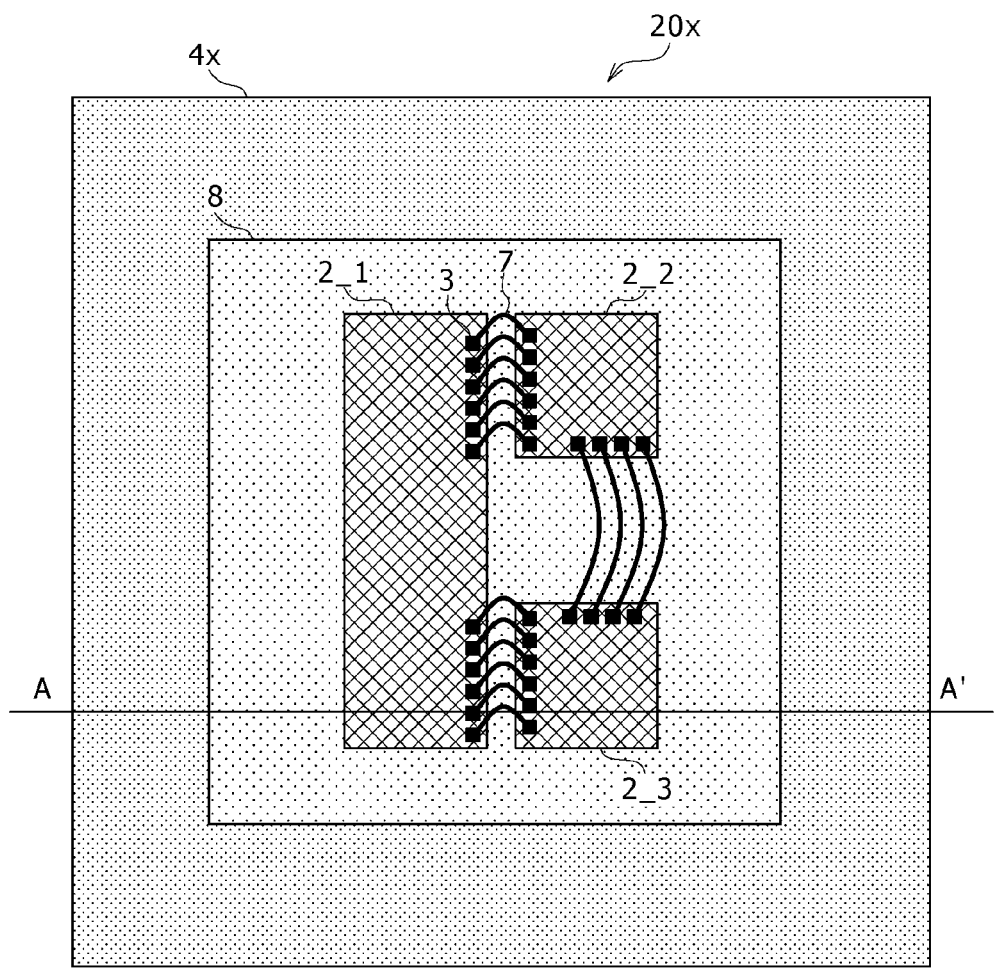
FIGS. 15A and 15B are schematic views showing a comparative example with a fifth example of the space division millimeter wave transmission structure of the signal interface of FIG. 6.
Figure 15B:
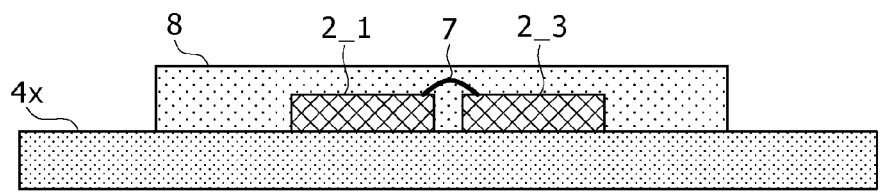
Figure 16A:
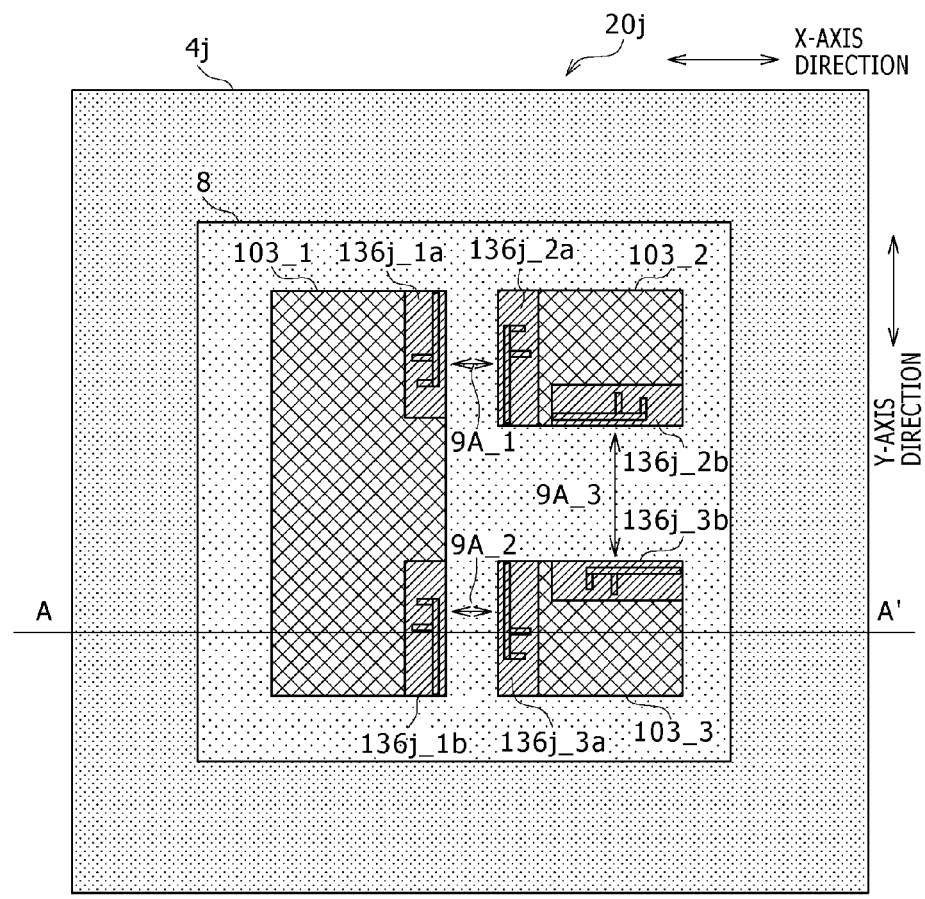
FIGS. 16A and 16B are schematic views illustrating a general configuration of the fifth example of the space division millimeter wave transmission structure of the signal interface of FIG. 6.
Figure 16B:
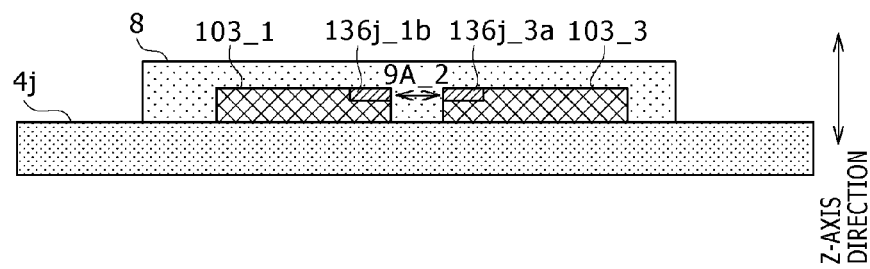

FIGS. 15A to 16B show a fifth example of the space division millimeter wave transmission structure of the present embodiment. In particular, FIGS. 15A and 15B show a comparative example with the fifth example, and FIGS. 16A and 16B show a general configuration of a semiconductor package 20*j* of the fifth example.

In the fifth example, a mechanism of the space division millimeter wave transmission structure of the present embodiment is applied to signal transmission between a plurality of semiconductor chips in one semiconductor package. In particular, a sheath, (for example, of a molded resin) of a semiconductor package is regarded as a housing, and a plurality of systems of millimeter wave signal transmission lines 9 which are independent of each other are constructed between a plurality of semiconductor chips in the same housing. More particularly, the fifth example is characterized in that, in one semiconductor package 20*j*, a plurality of semiconductor chips 103 are disposed on a board and millimeter wave transmission is carried out between the semiconductor chips 103. In particular, millimeter wave transmission is carried out between the semiconductor chips 103 although they are in the same package, and the semiconductor package 20*j* itself configures a millimeter wave in-dielectric transmission apparatus.

In the following, in order to facilitate understandings of the mechanism of the fifth example, a comparative example with the fifth example is described first, and thereafter, the fifth example is described.

Comparative Example

FIGS. 15A and 15B show a semiconductor package 20*x* of a comparative example to which the fifth example is not applied. More particularly, FIG. 15A is a schematic plan view and FIG. 15B is a schematic sectional view. Referring to FIGS. 15A and 15B, the semiconductor package 20*x* is formed as a multi-chip package wherein a plurality of (three in the figure) semiconductor chips 2_1, 2_2 and 2_3 each in the form of a system LSI are arranged in parallel in a single package member. A plurality of pad electrodes 3 are formed on the surface of the semiconductor chips 2_1, 2_2 and 2_3.

Signal transmission is carried out between the semiconductor chips 2_1 and 2_2 and also between the semiconductor chips 2_1 and 2_3, and signal transmission is carried out also between the semiconductor chips 2_2 and 2_3. Bonding wires 7 are used for connection for signal transmission between the semiconductor chips 2_1 and 2_2, between the semiconductor chips 2_1 and 2_3 and between the semiconductor chips 2_2 and 2_3. All of the semiconductor chips 2_1, 2_2 and 2_3 are protected by an LSI package of a resin, (by mold resin 8) and are mounted on an interposer board 4*x* (an LSI package board).

Together with high functionalization of a system LSI chip and increase of the data quantity, the number of bonding wires 7 for connecting different system LSI chips is increasing, and an increase of the chip area by increase of pad electrodes 3 becomes a problem. Further, as the communication speed between different system LSI chips becomes high, wire delay by elongation of the bonding wires 7, reflection by impedance mismatching and so forth become a problem. Since the system LSI chips have to be connected closely by the bonding wires 7, also a drop of the degree of freedom in arrangement of system LSI chips becomes a problem.

[General Configuration of the Fifth Example]

FIGS. 16A and 16B show a general configuration of a fifth example. In particular, FIG. 16A is a schematic plan view, and FIG. 16B is a schematic sectional view.

The semiconductor package 20*j* of the fifth example is a multi-chip package wherein three semiconductor chips 103_1, 103_2 and 103_3 which allow millimeter wave in-dielectric transmission are arranged in parallel within a single package member. Different from the comparative example, the pad electrodes 3 are not formed on the surface of the semiconductor chips 103_1, 103_2 and 103_3.

All of the semiconductor chips 103_1, 103_2 and 103_3 are protected by an LSI package made of a resin (by mold resin 8), and are mounted on an LSI package board 4j (on an interposer board). The mold resin 8 is formed from a dielectric material including a dielectric which can transmit a millimeter wave signal.

Though not shown, terminals of a power supply and so forth which are not a conversion object of a millimeter wave signal are laid from pad electrodes of the semiconductor chips 103_1, 103_2 and 103_3 through bonding wires similarly as in the comparative example.

In each of the semiconductor chips 103_1, 103_2 and 103_3, an LSI function unit 104, a signal production unit 107 and a transmission line coupling section 108 are built. Since the semiconductor chips 103_1, 103_2 and 103_3 are arranged in parallel in one package, as the antennas 136, preferably an antenna having directivity in a planar direction of the board is used although use of an antenna which has a thicknesswise (a normal) direction of the board (for example, a patch antenna) is not excluded.

Further, where application of space division multiplexing is taken into consideration, preferably an antenna is used which has directivity in an X-Y plane (in a two-dimensional plane), not in all directions of the two-dimensional plane but only in one of, for example, the X axis direction and the Y axis direction, or in other words, which has high directivity in the X or Y axis direction but has low directivity in the other or perpendicular direction. For example, if a rod antenna is used, then it has directivity in all directions of a two-dimensional plane. However, if an inverted F-shaped antenna 136j is used, then it is possible for the directivity to be had only in one of the X and Y axis directions depending upon the direction of the arrangement of the inverted F-shaped antenna 136j. This is based on the fact that the inverted F-shaped antenna has directivity not only in the thicknesswise direction of the board (in the normal: Z axis), but also in the planar direction perpendicular to the longitudinal direction of the radiation element without having directivity of the longitudinal direction of the radiation element.

Where an antenna having directivity in the thicknesswise (the normal direction) direction of the board, (for example, a patch antenna) is used, for example, if such a contrivance as to provide a reflecting plate in the mold resin 8 in such a manner as to form the dielectric transmission line 9A is made, then the advancing direction of a millimeter wave can be varied so as to fall between the antenna 136 to raise the transmission efficiency.

According to the fifth example, between a plurality of semiconductor chips 103 in the same package, an electromagnetic wave radiated from the inverted F-shaped antenna 136j propagates in the dielectric transmission line 9A provided by the inside of the mold resin 8 formed from a dielectric material. A signal of a millimeter is transmitted through the dielectric transmission line 9A between two semiconductor chips 103 in which the inverted F-shaped antennas 136j oppose to each other. A communication process can be executed through the dielectric transmission line 9A formed in the mold resin 8 between the semiconductor chips 103.

The millimeter wave signal transmission line along which a millimeter wave is transmitted is not the air (a free space transmission line), but is the dielectric transmission line 9A formed utilizing the mold resin 8 formed from a dielectric material including a dielectric which can transmit a millimeter wave signal. Consequently, while a large number of bonding wires 7 and pad electrodes 3 are required in the semiconductor package 20x of the comparative example, the number of bonding wires 7 and pad electrodes 3 can be reduced significantly. Consequently, the chip area can be reduced and the chip cost can be reduced. Further, since the degree of freedom in chip arrangement enhances, also enhancement in housing design can be anticipated. Further, by replacing signal transmission by electric wires which utilize the bonding wires 7 and the pad electrodes 3 with transmission of a millimeter wave signal, the problems of line delay and impedance mismatching can be eliminated.

Further, by arranging the antenna 136 and the millimeter wave signal transmission lines 9 so as to have directivity in a direction toward a place between antennas which are opposed to each other in a two-dimensional plane, space division multiplexing can be applied. For example, by combining the inverted F-shaped antenna 136j which have directivity in one of perpendicular directions in a plane, space division multiplexing can be applied readily. In particular, communication procedures independent of each other can be carried out at the same time with the same frequency between the inverted F-shaped antenna 136j disposed in an opposing relationship to each other in the mold resin 8 which forms the millimeter wave signal transmission line 9 (dielectric transmission line 9A). Thus, a plurality of systems of dielectric transmission lines 9A independent of each other can be configured between the inverted F-shaped antenna 136j disposed in an opposing relationship to each other.

<Space Division Millimeter Wave Transmission Structure: Sixth Example>

Figure 17A:
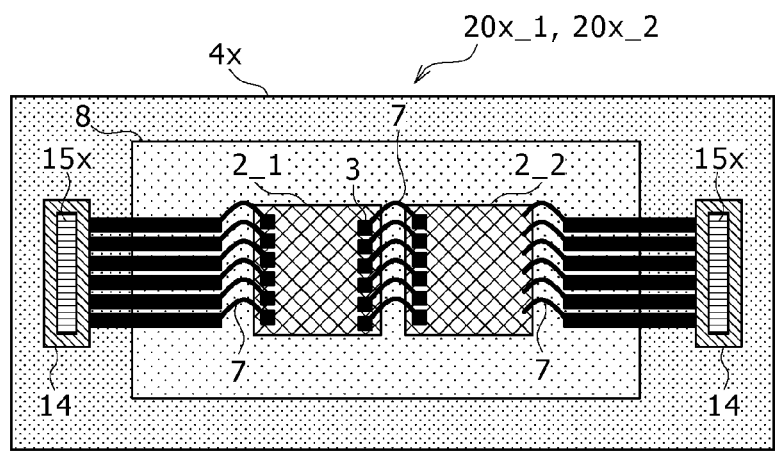
FIGS. 17A and 17B are schematic views showing a comparative example with a sixth example of the space division millimeter wave transmission structure of the signal interface of FIG. 6.
Figure 17B:
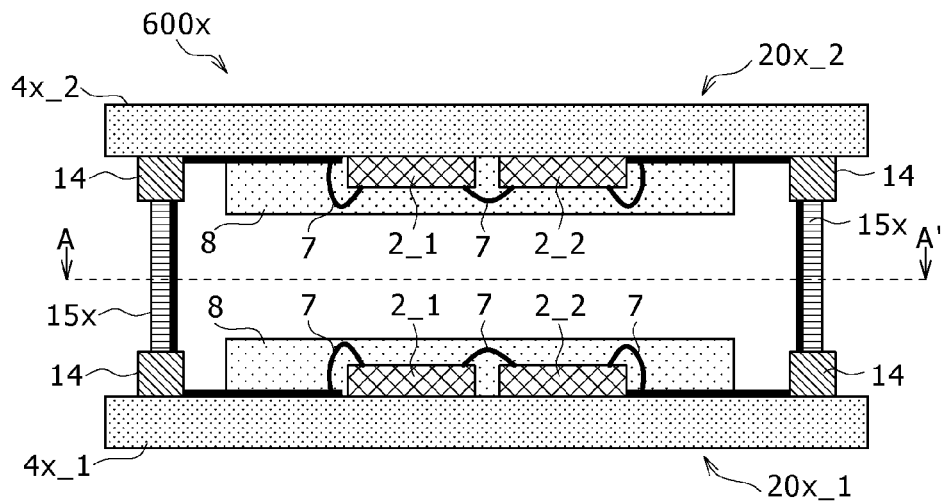
Figure 18A:
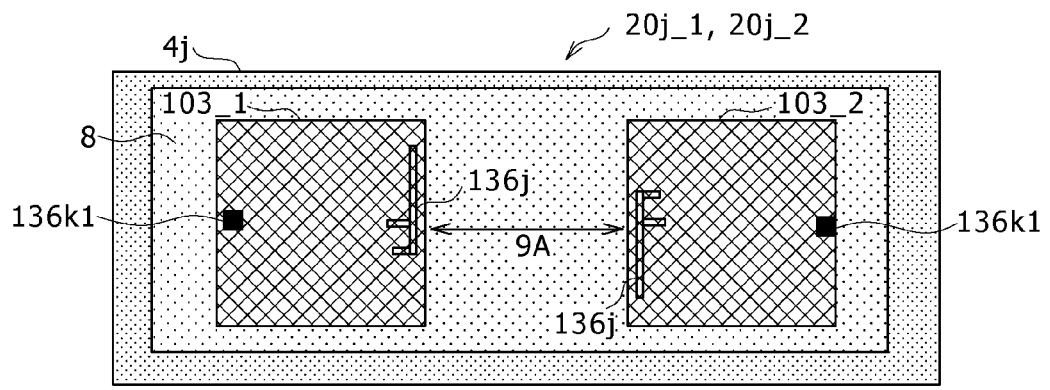
FIGS. 18A to 18C are schematic views illustrating a general configuration of the sixth example of the space division millimeter wave transmission structure of the signal interface of FIG. 6.
Figure 18B:
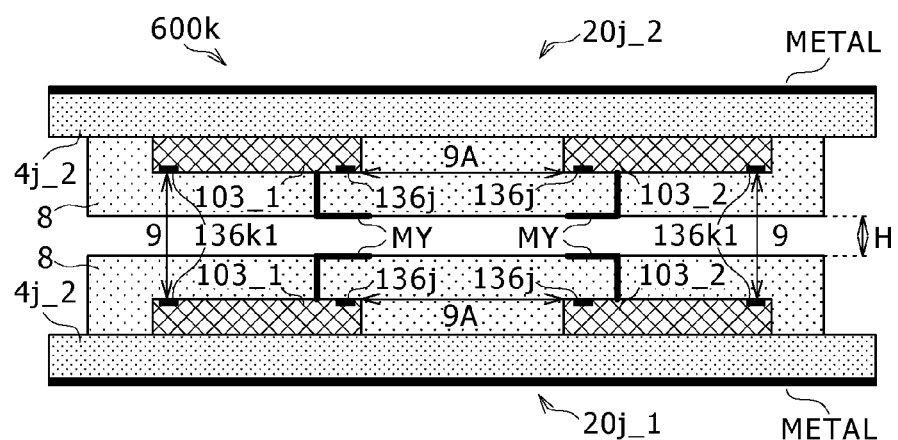
Figure 18C:
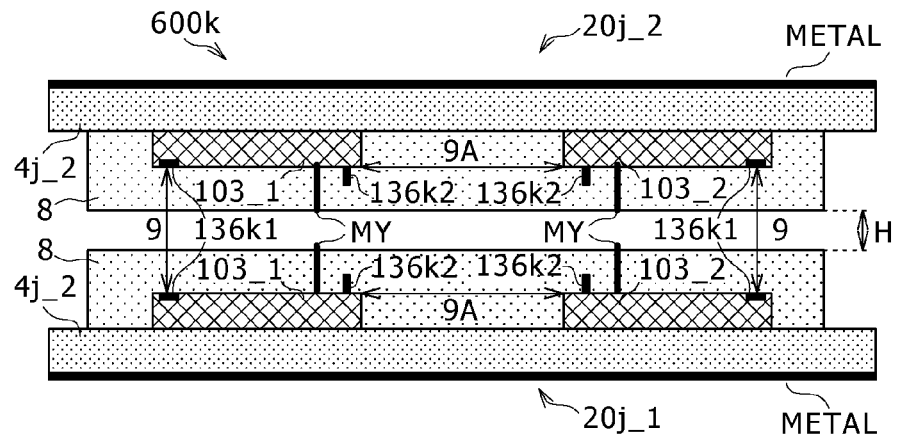

FIGS. 17A to 18C show a sixth example of the space division millimeter wave transmission structure of the present embodiment. In particular, FIGS. 17A and 17B show a comparative example with the sixth example, and FIGS. 18A to 18C show a general configuration of the millimeter wave in-dielectric transmission system 600k of the sixth example.

In the sixth example, the mechanism of space division millimeter wave transmission of the present embodiment is applied to signal transmission between a plurality of semiconductor packages (which may have any number of semiconductor chips in the inside thereof). Each of the semiconductor packages is regarded as an apparatus, and a plurality of systems of millimeter wave signal transmission lines 9 which are independent of each other in the different apparatus (semiconductor packages) are constructed. In particular, the sixth example is characterized in that the two semiconductor packages 20j_1 and 20j_2 of the fifth example in which a plurality of semiconductor chips 103 which can transmit a millimeter wave are disposed in an opposing relationship to each other, and millimeter wave transmission is carried out between the semiconductor packages 20j_1 and 20j_2 (between the semiconductor chips 103 of the semiconductor packages 20j_1 and 20j_2). Millimeter wave transmission is carried out between the semiconductor chips 103 of the different packages, and a millimeter wave signal transmission line 9 is formed between the semiconductor packages 20j_1 and 20j_2 disposed in an opposing relationship to each other.

In the following, in order to facilitate understandings of the mechanism of the sixth example, a comparative example with the sixth example is described first, and then the sixth example is described.

Comparative Example

FIGS. 17A and 17B show an electronic apparatus 600x of the comparative example to which the sixth example is not applied. The electronic apparatus 600x is configured such that semiconductor packages 20x_1 and 20x_2 are placed one on the other. In other words, two multi-chip packages are disposed in an upwardly and downwardly superposed relationship. The electronic apparatus 600x includes a plurality of (two in the figure) the semoconductors 2_1 and 2_2, disposed in each of the semiconductor packages 20x_1 and 20x_2.

Similarly as in FIGS. 15A and 15B, for data transmission in the semiconductor packages 20x_1 and 20x_2, each of the semiconductor chips 2_1 and 2_2 in each of the semiconductor packages 20x_1 and 20x_2 has a plurality of pad electrodes 3 formed on the surface thereof, and bonding wires 7 are used for connection for signal transmission. Meanwhile, for data transmission between the semiconductor packages 20x_1 and 20x_2, a connector 14 is provided on each of the boards 4x_1 and 4x_2, and a data transmission board 15x (which may otherwise be a cable 15) is connected between the connectors 14.

In such a configuration of the comparative example as described above, it is necessary to carry out data transmission between the semiconductor packages 20x through the connectors 14 and the data transmission board 15X. Therefore, the comparative example has problems of complication of laying of high-speed transmission wires, difficulty of a connector in coping with a high speed and dropping of the degree of arrangement.

[General Configuration of the Sixth Example]

FIGS. 18A to 18C show a general configuration of the millimeter wave in-dielectric transmission system 600k (electronic apparatus) according to the sixth example. In particular, FIG. 18A is a schematic plan view, and FIGS. 18B and 18C are schematic sectional views. As can be recognized from comparison with the semiconductor package 20j of the fifth example shown in FIGS. 16A and 16B, the millimeter wave in-dielectric transmission system 600k is configured such that a plurality of semiconductor packages 20j_1 and 20j_2 according to the fifth example are placed one on another in a spaced relationship by a package distance h from each other. In particular, two multi-chip packages to which the fifth example is applied are placed in an upwardly and downwardly overlapping relationship with each other.

A millimeter wave signal transmission line 9 which is a propagation path for a millimeter wave is formed between the semiconductor packages 20j_1 and 20j_2. Although the millimeter wave signal transmission line 9 may be a free space transmission path, preferably it is formed from a waveguide structure having a millimeter wave confining structure such as a waveguide pipe, a transmission line path, a dielectric line or the inside of a dielectric so that it may have a characteristic that an electromagnetic wave in the millimeter waveband is transmitted efficiently. For example, the millimeter wave signal transmission line 9 should be formed as a dielectric transmission line 9A configured from a dielectric material which has a relative dielectric constant within a fixed range and a dielectric loss tangent within a fixed range.

The "fixed range" may be any range within which an effect of the present embodiment can be achieved by the dielectric constant or the dielectric loss tangent of the dielectric material, and a value determined in advance may be applied to the fixed range. In particular, as the dielectric material, a material which can transmit a millimeter wave signal and has a characteristic with which the effect of the present embodiment is achieved may be applied. While the fixed range cannot necessarily be determined definitely, the fixed range is determined in the following manner as an example.

In order to transmit a signal of a millimeter wave at a high speed in the dielectric transmission line 9A, it is desired to set the dielectric constant of the dielectric material to approximately 2 to 10 (preferably 3 to 6), and set the dielectric loss tangent of the dielectric material to approximately 0.00001 to 0.01 (preferably 0.00001 to 0.001). As a dielectric material which satisfies such conditions as just described, for example, a material configured from acrylic resin-based, urethane resin-based, epoxy resin-based, silicone-based, polyimide-based or cyanoacrylate resin-based material can be used. It is to be noted that, as the millimeter wave signal transmission line 9 having a configuration wherein a millimeter wave signal is confined in the millimeter wave transmission line 9, not only the dielectric transmission line but also a hollow waveguide wherein the periphery of the transmission line is surrounded by a shielding material and the inside of the transmission line is hollow may be applied.

The inverted F-shaped antenna 136j in the semiconductor package 20j has directivity not only in a board plane direction (horizontal direction: in the present example, the X-axis direction), but also in a thicknesswise direction of the board (vertical direction: the Z-axis direction). Accordingly, also transmission of a millimeter wave signal between the semiconductor chips 103 mounted on the semiconductor packages 20j_1 and 20j_2 disposed in parallel and in a layered relationship with each other is carried out between the semiconductor packages 20j_1 and 20j_2.

This is convenient where one inverted F-shaped antenna 136j is used to carry out millimeter wave transmission not only between chips juxtaposed in a board plane direction but also between chips disposed in an opposing relationship to each other. In particular, antenna of the same shape can be used to carry out horizontal direction communication and vertical direction communication, and since the common antenna can be used for communication within a package and between packages, there is an advantage that the configuration is simplified. However, this is not preferable where space division multiplexing wherein different communication procedures independent of each other are carried out at the same time with the same frequency is carried out.

As a countermeasure against this, for millimeter wave signal transmission between chips disposed in an opposing relationship to each other, an antenna having high directivity in the direction is used. Here, the patch antenna 136k1 is used as an example.

Where the inverted F-shaped antenna 136j is used for millimeter wave signal transmission between chips juxtaposed in a board plane direction as shown in FIGS. 18A and 18B, a millimeter wave blocking member MY is provided for the other directions than the direction in which the chips are juxtaposed so that millimeter wave signal transmission may not be carried out in any undesired direction.

Or, not the inverted F-shaped antenna 136j but an antenna having directivity in only a board plane direction (horizontal direction), may be used for millimeter wave signal transmission between chips juxtaposed in a board plane direction as shown in FIG. 18C. For example, a linear antenna 136k2 which stands uprightly with respect to the semiconductor chip 103 (for example, a rod antenna) may be used. The linear antenna 136k2 has no (NULL) directivity in the vertical direction and does not carry out millimeter wave communication between chips disposed in an opposing relationship to each other. Further, since the linear antenna 136k2 has directivity perpendicular to that of the patch antenna 136k1 disposed in the same plane, basically it does not carry out millimeter wave communication. It is to be noted that a millimeter wave blocking member MY should be placed between the patch antenna 136k1 and the linear antenna 136k2 on the same chip by way of precaution to prevent millimeter wave communication between them with certainty.

With the millimeter wave in-dielectric transmission system 600k of the sixth example, data transfer between multi-chip packages in each of which a plurality of semiconductor chips 103 (which are system LSIs) are disposed is carried out using a millimeter wave. Besides, space division multiplexing can be applied in a three-dimensional space.

The millimeter wave signal transmission line 9 in which a millimeter wave is transmitted is a free space transmission line, or a dielectric transmission line or a hollow waveguide which have a millimeter wave confining function. While many connectors 14 and many data transmission boards 15x are required in the electronic apparatus 600x of the comparative example for signal transmission between packages, they can be reduced in the electronic apparatus 600x of the sixth example. Consequently, the problems of complication of laying of high-speed transmission wires, difficulty of a connector in coping with a high speed and dropping of the degree of arrangement are solved.

<Space Division Millimeter Wave Transmission Structure: Seventh Example>

Figure 19A:
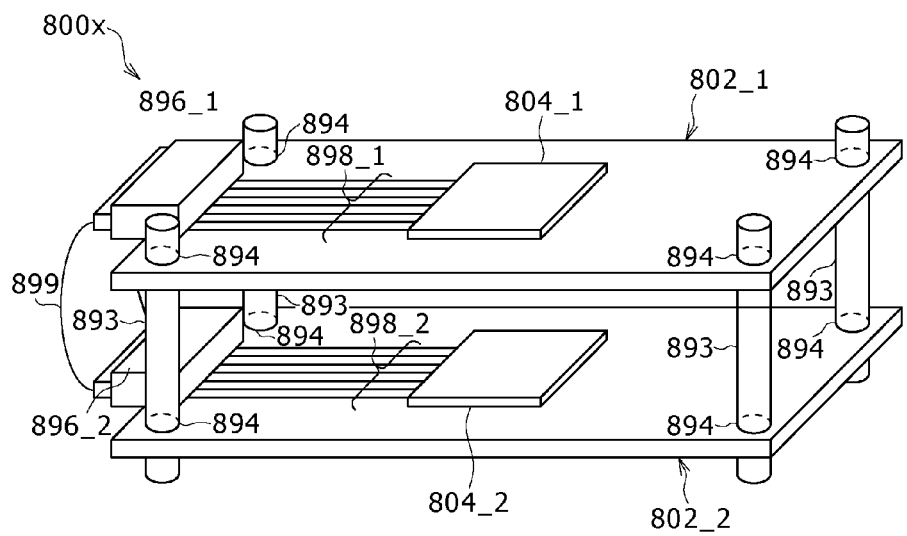
FIGS. 19A and 19B are schematic views showing seventh and eighth examples of the space division millimeter wave transmission structure of the signal interface of FIG. 6.
Figure 19B:
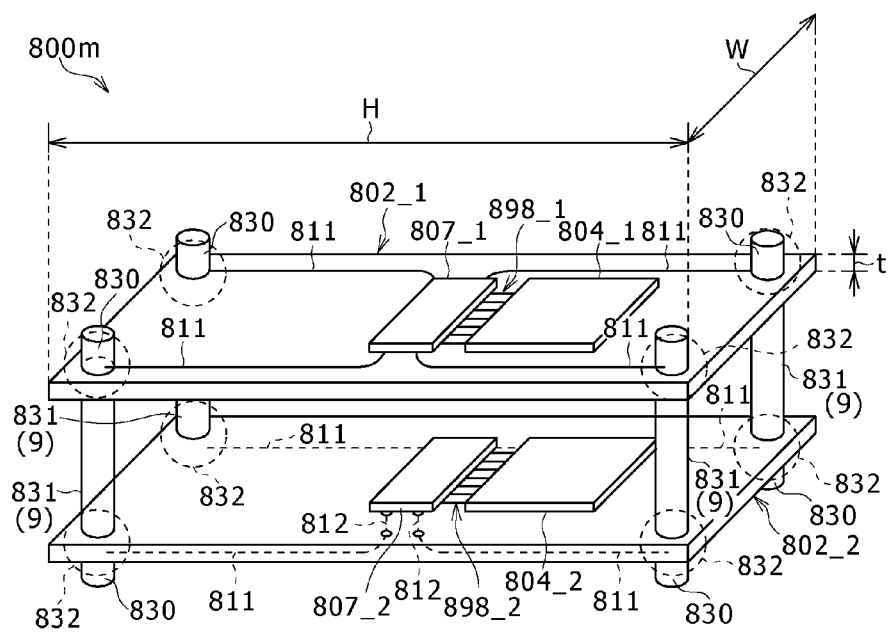

FIGS. 19A and 19B show a seventh example of the space division millimeter wave transmission structure of the present embodiment. In the seventh example, the mechanism of space division millimeter wave transmission of the present embodiment is applied to signal transmission between a plurality of printed boards in a housing of an apparatus. More particularly, the seventh example is configured such that a connection member (support member) provided such that one board substantially supports the other board is utilized as a millimeter wave signal transmission line 9. Particularly where a plurality of connection members exist, they are utilized as the millimeter wave signal transmission line 9 to implement space division multiplexing.

Here, that the "one board substantially supports the other board" is based on the fact that it does not matter in which one of horizontal and vertical directions the boards are disposed. For example, if a connection member is provided between a plurality of boards in a state wherein the boards are disposed in a horizontal direction (transverse arrangement) with respect to the surface of the land, then the lower side board supports the upper side board. In contrast, where a connection member is provided between a plurality of boards in a state wherein the boards are disposed in a vertical direction (longitudinal arrangement) with respect to the surface of the land, although it may not strictly be considered that the right side board supports the left side board (or vice versa), also this is included in the mode of the seventh example.

Comparative Example

FIG. 19A shows, a general configuration (in a perspective view) of an apparatus of a comparative example to which the seventh example is not applied. The data transmission apparatus 800x of the comparative example includes two printed boards 802_1 and 802_2 and four fixing members 893 for ordinary support. The printed boards 802_1 and 802_2 are fixed in parallel to each other by the fixing members 893 at the four corners of the printed boards 802_1 and 802_2. For the fixation, a through-hole 894 of an arbitrary shape is perforated at each of the four corners of the printed boards 802_1 and 802_2, and the fixing members 893 are attached to the through-holes 894 at the four corners in such a manner that they are sandwiched by the printed boards 802_1 and 802_2.

An LSI function section 804_1 and a connector 896_1 are provided on the printed board 802_1 and connected to each other by electric wires 898_1. Another LSI function section 804_1 and another connector 896_2 are provided on the printed board 802_2 and connected to each other by electric wires 898_2. A cable 899 is connected between the connector 896_1 of the printed board 802_1 and the connector 896_2 of the printed board 802_2.

The data transmission apparatus 800x is configured similarly to the electronic apparatus 600x shown in FIGS. 17A and 17B, and data transmission is executed through connectors 896 provided on the printed boards 802_1 and 802_2 and the cable 899. With such a configuration as just described, data transfer between the boards has to be carried out through the connectors 896 and the cable 899. Therefore, the comparative example has problems of complication of laying of high-speed transmission wires and difficulty of a connector and a cable in coping with a high speed.

[General Configuration of the Seventh Example]

FIG. 19B shows, a general configuration (in a perspective view) of a data transmission apparatus 800m of a seventh example. Although the seventh example is similar to the sixth example in that a plurality of boards on which semiconductor chips are mounted are placed one on another, it is different in that a millimeter wave signal transmission line 9 is configured using a fixing member which is an example of a connection member. Here, in order to apply space division multiplexing, a millimeter wave signal transmission line 9 is configured in an arbitrary plural number (which is two in the minimum and is equal to the number of fixing members 831 in the maximum) of several ones from among a plurality of fixing members 831 for connecting the printed boards 802. In the present example, the fixing members 831 disposed at the four corners (a plurality) of the printed boards 802_1 and 802_2 are used as the millimeter wave signal transmission lines 9. The fixing members 831 are independent of each other, and if the fixing members 831 are utilized to form the millimeter wave signal transmission lines 9, then the millimeter wave signal transmission lines 9 become independent of each other and space division multiplexing by which millimeter wave signal transmission can be carried out at the same time with the single frequency is implemented.

In order to implement the millimeter wave signal transmission, a signal production section 807 similar to the signal production unit 107 is provided at the succeeding stage to the LSI function section 804. While, in FIGS. 19A and 19B, the LSI function section 804 and the signal production section 807 are formed as separate blocks, preferably they are integrated into a single chip such that they are not connected to each other by the electric wires 898. The printed boards 802_1 and 802_2 have a size of, for example, a length H, a width W and a thickness t.

A millimeter wave signal produced by the signal production section 807 is coupled to the fixing members 831, in the inside of which the millimeter wave signal transmission line 9 is formed, through transmission lines 811. The transmission lines 811 may be formed as strip lines, microstrip lines, coplanar lines or slot lines on the printed board 802.

In the present example, on the upper side printed board 802_1, the transmission lines 811 are disposed on the surface (the part receiving face), of the printed board 802_1. Meanwhile, on the lower side printed board 802_2, the transmission lines 811 are disposed on the rear face (the no-part receiving face), of the printed board 802_2, and the transmission lines 811 on the rear face and the signal production section 807 on the front face are connected through through-holes 812.

An antenna coupling portion 832 is disposed on the transmission line 811 adjacent the fixing member 831. The antenna coupling portion 832 couples a signal of a millimeter wave transmitted thereto from the signal production section 807 through the transmission line 811 to one end of the fixing member 831. For example, the antenna coupling portion 832 converts a signal of a millimeter wave into an electromagnetic wave and radiates the electromagnetic wave to the fixing member 831 in the inside of which the millimeter wave signal transmission line 9 is formed.

Although each of the fixing members 831 may be formed hollow, preferably it is filled with a dielectric material formed from a resin such as a glass epoxy-based, acrylic-based or polyethylene-based resin in order to form a dielectric transmission line 9A. In this instance, the fixing member 831 is formed using a resin bar member molded, for example, in a cylindrical form. The fixing member 831 may be covered with a millimeter wave blocking member therearound. By forming the dielectric transmission line 9A in which a dielectric material is filled, the diameter thereof can be reduced. It is to be noted that, in order to transmit a millimeter wave efficiently, preferably the dielectric material causes loss as low as possible. Meanwhile, in order to suppress a bad influence of reflection, the dielectric material preferably causes some loss. Where the inside of the fixing member 831 is formed as a cavity, for example, a metal bar member of a cylindrical shape (a metal pipe) may be used.

For example, a case wherein a microstrip line is applied to the transmission lines 811 is described. While the fixing member 831 and the antenna coupling portion 832 are attached in such a manner as to sandwich the printed board 802 therebetween, an opening (in this instance, the opening may be hollow or a dielectric may be filled in the opening) is formed at the fitting portion between them. At attached positions of the printed board 802 and the fixing member 831 and antenna coupling portion 832, an end of the transmission lines 811 (microstrip lines) is provided in the proximity of a central portion of the opening of the fitting portion. The end of the transmission lines 811 is hereinafter referred to as signal conversion portion.

For example, the opening is made a cavity to form a waveguide pipe, and a through-hole is perforated in the printed board 802 around the waveguide pipe. An end portion of the fixing member 831 is fitted in the through-hole. A dielectric transmission line terminating portion 830 (short block) is attached to the cylindrical end portion of the fixing member 831. The dielectric transmission line terminating portion 830 has a lid member (having a shape of a cap or a hat) with a ceiling and is attached (by means of a screw) to an upper end portion of the fixing member 831 such that it reflects an electromagnetic wave radiated from the transmission line 811 to the waveguide pipe. Further, the fixing member 831 is fixed at one end thereof to the printed board 802.

Where the distance between the printed board 802 and the ceiling face when the dielectric transmission line terminating portion 830 is screwed to the fixing member 831 is represented by D2, the distance D2 is set to one fourth the wavelength λ of a signal of a millimeter wave in the air. By adjusting the distance D2 so that the electromagnetic wave may be intensified, a signal of a millimeter wave can be converted into an electromagnetic wave efficiently.

Where the data transmission apparatus 800*m* is configured in such a manner as described above, the antenna coupling portion 813 couples a signal of a millimeter wave transmitted thereto from the signal production section 807 through the transmission line 811 to one end of the fixing member 831. Consequently, an electromagnetic wave based on a signal of a millimeter wave received from one end of the fixing member 831 which forms the millimeter wave signal transmission line 9 can be transmitted to the other end of the fixing member 831. Consequently, signal transmission by a millimeter wave signal between the printed boards 802_1 and 802_2 can be implemented.

<Space Division Millimeter Wave Transmission Structure: Eighth Example>

Figure 20A:
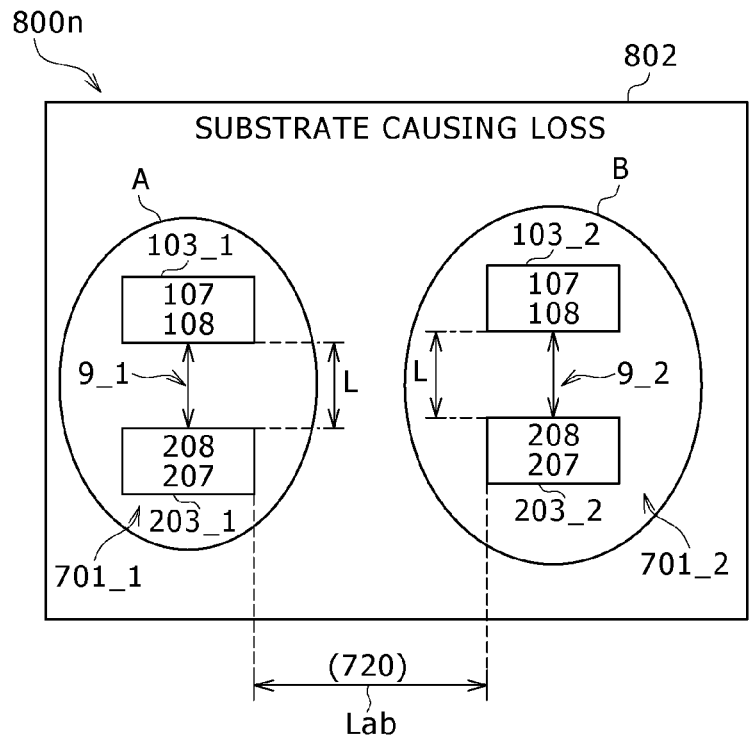
FIGS. 20A and 20B are schematic views showing seventh and eighth examples of the space division millimeter wave transmission structure of the signal interface of FIG. 6.
Figure 20B:
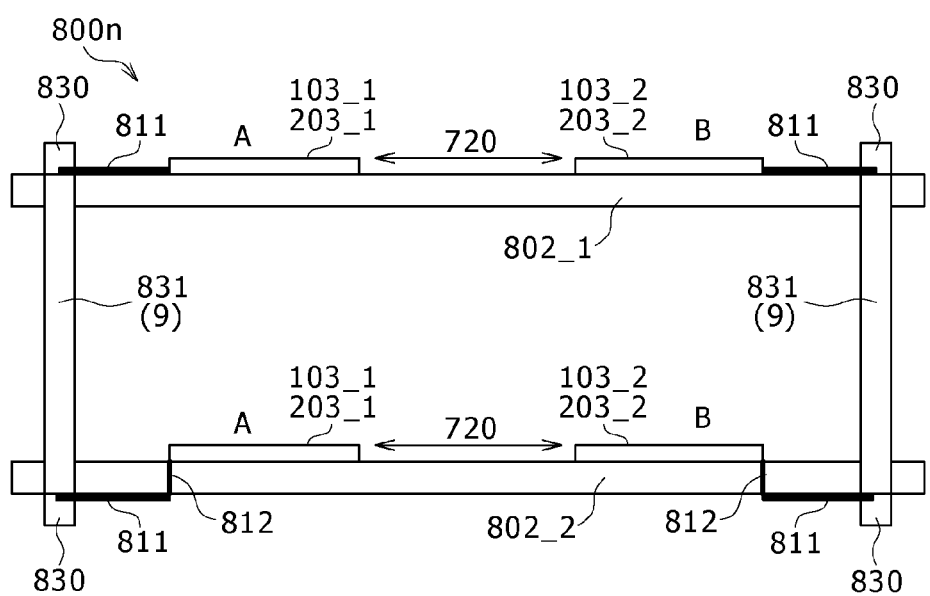

FIGS. 20A and 20B show an eighth example of the space division millimeter wave transmission structure of the present embodiment. In the data transmission apparatus 800*n* of the eighth example, the space division multiplexing in the millimeter wave in-board transmission of the fourth example is applied to signal transmission between chips on each of a plurality of printed boards 802 on the basis of the seventh example.

FIG. 20A illustrates a situation where space division multiplexing is applied by each of the plural printed boards 802. This figure itself is similar to the schematic plan view shown in FIG. 13A. For example, a semiconductor chip 103_1 (103_2) and another semiconductor chip 203_1 (203_2) are disposed in a spaced relationship from each other by a distance L (for example, approximately several mm to several tens cm). The arrangement distance Lab between the semiconductor chip 103_1 (203_1) in the region A and the semiconductor chip 103_2 (203_2) in the region B is set, for example, to approximately three times the distance L, and the semiconductor chip 103_1 (103_2) is disposed in the region A while the semiconductor chip 103_2 (203_2) is disposed sidewardly of the semiconductor chip 103_2 (203_2) in the region B.

While the coupling medium 720 is formed at the location of the arrangement distance Lab, by setting the arrangement distance Lab to approximately three times the distance L, interference of millimeter wave signal transmission between the semiconductor chips 103_1 and 203_1 in the region A and the semiconductor chips 103_2 and 203_2 in the region B can be prevented. Even if millimeter wave transmission in the region A and millimeter wave signal transmission in the region B are carried out at the same time with the same frequency, mutual interference can be prevented, and the mechanism of space division multiplexing is implemented.

FIG. 20B illustrates a situation where the space division multiplexing is applied between a plurality of printed boards 802. This figure itself shows the arrangement of the perspective view of FIG. 19B in a modified form as a side elevational view. Referring to FIG. 20B, for signal transmission between the printed boards 802, an arbitrary plural number (two in the minimum and is equal to the number of fixing members 831 in the maximum) of ones of a plurality of fixing members 831 are utilized to apply the space division multiplexing.

The individual mechanisms are such as described hereinabove in connection with the fourth and seventh examples. Here, the specific points particular to the eighth example are considered. As described hereinabove in connection with the fourth example, in order to effectively implement millimeter wave signal transmission in a board, it is important to form the board from a dielectric material which causes some loss. In particular, although it is impossible to decide with certainty depending upon the transmission distance, it is generally considered that the dielectric material of the printed board 802 preferably causes higher loss than the dielectric material of the dielectric transmission line 9A which utilizes the fixing member 831 to which the seventh example is applied.

While the present invention has been described in connection with the preferred embodiment thereof, the technical scope of the present invention is not limited to the foregoing description of the preferred embodiment thereof. The embodiment described above can be altered or modified without departing from the subject matter of the present invention, and such altered or modified forms shall be included in the technical scope of the present invention.

Further, the embodiment described above does not restrict the invention as defined in the claims, and all of the combinations of the features described in the description of the embodiment may not necessarily be essential to the solving means of the present invention. The embodiment described above includes various stages of the invention, and various inventions can be extracted by suitable combinations of a plurality of features disclosed herein. As far as a similar effect is achieved even if some features are deleted from all features indicated by the embodiment, a configuration which does not include the deleted features may be extracted as an embodiment of the present invention.

As seen from the various examples of the space division millimeter wave transmission structure described above, the mechanism of the space division millimeter wave transmission structure in the present embodiment can be applied in various forms, and the examples are mere particular ones of such forms. However, in such a space wherein the transmission range cannot be limited as in communication in the open air, a plurality of independent transmission wires cannot be constructed. In this regard, the application object of the present invention is wireless communication within a narrower range than the distance between communication apparatus which are used in broadcasting or in general wireless communication.

Therefore, the wireless communication may be carried out within a range within which the range of transmission can be restricted, and a typical example of application of the present invention is an application to wireless transmission (millimeter wave transmission), for example, within a case (housing) of an electronic apparatus. However, the application is not limited to this. For example, it seems possible to construct, for signal transmission between electric equipments in a car, a millimeter wave transmission system in the car and apply the mechanism of space division millimeter wave transmission in the present embodiment. Further, also it is possible to expand the transmission range such that, for signal transmission of an electronic apparatus in a house or some other building, that is, on the inner side of a wall, a millimeter wave transmission system on the inner side of the wall is constructed and the mechanism of space division millimeter wave transmission in the present embodiment is applied.

The present application contains subject matter related to that disclosed in Japanese Priority Patent Application JP 2009-187711 filed in the Japan Patent Office on Aug. 13, 2009, the entire content of which is hereby incorporated by reference.

What is claimed is:

1. A wireless transmission system, comprising:
a plurality of millimeter wave signal transmission lines capable of individually transmitting information in a millimeter waveband independently of each other;
a sending section disposed on one end side of the millimeter wave signal transmission lines, the sending section being adapted to convert a signal of an object of transmission into a millimeter wave signal and supply the millimeter wave signal to one of the millimeter wave signal transmission lines; and
a reception section disposed on the other end side of the millimeter wave signal transmission lines, the reception section being adapted to receive the millimeter wave signal transmitted thereto through the one millimeter wave signal transmission line and convert the received millimeter wave signal into the signal of the object of transmission,
wherein,
the millimeter wave signal transmission lines, the sending section, and the reception section are disposed within same housing, the housing being a housing of an image pickup apparatus that has a shake correction mechanism,
the image pickup apparatus includes a main board and an image pickup board, and
control signals and image signals are respectively communicated between the main board and the image pickup board of the image pickup apparatus as millimeter wave signals over the millimeter wave signal transmission lines.

2. The wireless transmission system according to claim 1, comprising:
a first communication apparatus including N such sending sections individually provided for N (N being a positive integer equal to or greater than two) different signals of a transmission object, and
a second communication apparatus different from the first communication apparatus and including N such reception sections individually provided for the N different signals of the transmission object,
the N signals of the transmission object being transmitted simultaneously between the sending sections of the first communication apparatus and the reception sections of the second communication apparatus, which are individually disposed on opposite ends of different ones of the millimeter wave signal transmission lines, using millimeter wave signals within same frequency range.

3. The wireless transmission system according to claim 2, wherein:
the first communication apparatus is configured such that the second communication apparatus can be mounted thereon, and
the second communication apparatus is configured such that the second communication apparatus is mounted on a mounting structure of the first communication apparatus, in a state that the millimeter wave signal transmission lines are arranged for information transmission in the millimeter waveband between the second communication apparatus and the first communication apparatus.

4. The wireless transmission system according to claim 2, wherein the first communication apparatus includes a first semiconductor chip and the second communication apparatus includes a second semiconductor chip.

5. The wireless transmission system according to claim 1, comprising:
a first communication apparatus including N (N being a positive integer equal to or greater than two) such sending sections individually provided for N different signals of a transmission object and N such reception sections individually provided for the N different signals of the transmission object, and
a second communication apparatus different from the first communication apparatus and including N such sending sections individually provided for the N different signals of the transmission object and N such reception sections individually provided for the N different signals of the transmission object,
the N signals of the transmission object being transmitted by full-duplex bidirectional transmission between the sending sections of the first communication apparatus and the reception sections of the second communication apparatus, which are individually disposed on opposite ends of different ones of the millimeter wave signal transmission lines, and between the reception sections of the first communication apparatus and the sending sections of the second communication apparatus, which are individually disposed on opposite ends of different ones of the millimeter wave signal transmission lines, using millimeter wave signals within same frequency range for both transmission and reception.

6. The wireless transmission system according to claim 5, wherein:
the first communication apparatus is configured such that the second communication apparatus can be mounted thereon, and
the second communication apparatus is configured such that the second communication apparatus is mounted on a mounting structure of the first communication apparatus, in a state that the millimeter wave signal transmission lines are arranged for information transmission in the millimeter waveband between the second communication apparatus and the first communication apparatus.

7. The wireless transmission system according to claim 5, wherein the first communication apparatus and the second communication apparatus are respectively disposed on the main board and the image pickup board.

8. The wireless transmission system according to claim 1, wherein each of the millimeter wave signal transmission lines has a transmission line structure that confines the millimeter wave signal within the transmission line structure for transmission.

9. The wireless transmission system according to claim 1, wherein each of the millimeter wave signal transmission lines is a dielectric transmission line formed from a dielectric material having a characteristic capable of transmitting the millimeter wave signal.

10. The wireless transmission system according to claim 9, wherein a blocking member for suppressing external radiation of the millimeter wave signal is provided on an outer periphery of the dielectric material.

11. The wireless transmission system according to claim 1, wherein each of the millimeter wave signal transmission lines is formed as a hollow waveguide that includes a blocking member that suppresses external radiation of the millimeter wave signal.

12. The wireless transmission system according to claim 1, wherein each of the millimeter wave signal transmission lines is formed by defining a transmission range of the millimeter wave signal in a circuit board made of a dielectric material on which the sending and reception sections are mounted.

13. The wireless transmission system according to claim 1, further comprising a respective antenna connected to each of the sending and reception sections.

14. The wireless transmission system according to claim 1, wherein the sending section and the receiving section are mounted on different circuit boards.

15. The wireless transmission system according to claim 14, wherein the circuit boards include a first circuit board and a second circuit board supported by the first circuit board with a plurality of connection members, the connection members being utilized to form the millimeter wave signal transmission lines.

16. The wireless transmission system according to claim 15, wherein the connection members are each filled with a dielectric material.

17. The wireless transmission system according to claim 1, wherein each of the millimeter wave signal transmission lines is a free space transmission line.

* * * * *